(12) United States Patent
Kato et al.

(10) Patent No.: US 9,449,883 B2
(45) Date of Patent: Sep. 20, 2016

(54) SEMICONDUCTOR DEVICE AND METHOD FOR MANUFACTURING THE SAME

(75) Inventors: Hisayuki Kato, Kawasaki (JP); Yoshihiko Kusakabe, Kawasaki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 161 days.

(21) Appl. No.: 13/376,081

(22) PCT Filed: Jun. 5, 2009

(86) PCT No.: PCT/JP2009/060315
§ 371 (c)(1),
(2), (4) Date: Dec. 2, 2011

(87) PCT Pub. No.: WO2010/140244
PCT Pub. Date: Dec. 9, 2010

(65) Prior Publication Data
US 2012/0080757 A1    Apr. 5, 2012

(51) Int. Cl.
*H01L 27/092*    (2006.01)
*H01L 21/8234*    (2006.01)
(Continued)

(52) U.S. Cl.
CPC ............ *H01L 21/823468* (2013.01); *H01L 21/823418* (2013.01); *H01L 21/823814* (2013.01);
(Continued)

(58) Field of Classification Search
CPC ............ H01L 21/823468; H01L 21/823864; H01L 29/6656; H01L 21/823418; H01L 21/823814
USPC ............... 257/E21.634, E21.633, E21.64, 257/E21.619, 369, E21.438, E21.626, 257/E29.266, E21.409, E27.062, E29.255, 257/E21.632, E21.431, E21.636, 408, 257/E27.06, 368, E21.637, E21.639, 257/E21.642; 438/199, 305, 197, 231, 303, 438/300, 275, 301, 230, 299
See application file for complete search history.

(56) References Cited

U.S. PATENT DOCUMENTS 5,610,088 A * 3/1997 Chang et al. ............... 438/231
5,792,681 A * 8/1998 Chang et al. ............... 438/210
(Continued)

FOREIGN PATENT DOCUMENTS

JP    2000-114522 A    4/2000
JP    2001-110913 A    4/2001
(Continued)

OTHER PUBLICATIONS

Japanese Office Action issued in Application No. 2011-518132 dated May 21, 2013.
(Continued)

*Primary Examiner* — Ermias Woldegeorgis
(74) *Attorney, Agent, or Firm* — McDermott Will & Emery LLP

(57) ABSTRACT

First protective films are formed to cover side surfaces of gate electrode portions. In an nMOS region, an extention implantation region is formed by causing a portion of the first protective film located on the side surface of the gate electrode portion to function as an offset spacer and using the offset spacer as a mask, and then, cleaning is done. Since silicon nitride films are formed on surfaces of the first protective films, the resistance to chemical solutions is improved. Furthermore, second protective films are formed on the first protective films, respectively. In a pMOS region, an extention implantation region is formed by causing a portion of the first protective film and a portion of the second protective film located on the side surface of the gate electrode portion to function as an offset spacer and using the offset spacer as the mask, and then, cleaning is done.

7 Claims, 47 Drawing Sheets

(51) Int. Cl.

| | | |
|---|---|---|
| *H01L 21/8238* | (2006.01) | |
| *H01L 21/66* | (2006.01) | |
| *H01L 29/51* | (2006.01) | |
| *H01L 29/66* | (2006.01) | |

(52) U.S. Cl.
CPC ... *H01L21/823864* (2013.01); *H01L 29/6656* (2013.01); *H01L 29/6659* (2013.01); *H01L 22/26* (2013.01); *H01L 29/517* (2013.01); *H01L 29/665* (2013.01)

(56) References Cited

U.S. PATENT DOCUMENTS

| | | | | |
|---|---|---|---|---|
| 5,795,803 | A * | 8/1998 | Takamura et al. | 438/228 |
| 6,492,218 | B1 | 12/2002 | Mineji | |
| 6,562,676 | B1 * | 5/2003 | Ju | 438/232 |
| 6,696,334 | B1 * | 2/2004 | Hellig et al. | 438/230 |
| 7,935,592 | B2 * | 5/2011 | Watanabe | 438/230 |
| 2002/0001909 | A1 * | 1/2002 | Hasegawa | 438/303 |
| 2003/0107104 | A1 * | 6/2003 | Wu | H01L 21/823814 257/511 |
| 2003/0178688 | A1 * | 9/2003 | Yang et al. | 257/395 |
| 2004/0164320 | A1 * | 8/2004 | Quek et al. | 257/197 |
| 2006/0154411 | A1 * | 7/2006 | Bu et al. | 438/184 |
| 2006/0226558 | A1 * | 10/2006 | Fukai et al. | 257/900 |
| 2007/0096195 | A1 * | 5/2007 | Hoentschel et al. | 257/315 |
| 2007/0187727 | A1 * | 8/2007 | Ting et al. | 257/274 |
| 2009/0227082 | A1 * | 9/2009 | Shin et al. | 438/294 |

FOREIGN PATENT DOCUMENTS

| | | |
|---|---|---|
| JP | 2004-349372 A | 12/2004 |
| JP | 2005-513774 T | 5/2005 |
| JP | 2006-294877 A | 10/2006 |
| JP | 2007-067425 A | 3/2007 |
| JP | 2007-220755 A | 8/2007 |
| JP | 2007-305889 A | 11/2007 |
| JP | 2008-060538 A | 3/2008 |
| JP | 2008-117848 A | 5/2008 |
| JP | 2008-300505 A | 12/2008 |

OTHER PUBLICATIONS

Chinese Office Action issued in Application No. 200980159678.1 dated Sep. 5, 2013.

Office Action issued in corresponding Taiwanese Patent Application No. 099117399, mailed on Aug. 7, 2015; with English translation.

* cited by examiner

SEMICONDUCTOR DEVICE AND METHOD FOR MANUFACTURING THE SAME

RELATED APPLICATIONS

This application is the U.S. National Phase under 35 U.S.C. §371 of International Application No. PCT/JP2009/060315, filed on Jun. 5, 2009, the disclosure of which Application is incorporated by reference herein.

TECHNICAL FIELD

The present invention relates to a semiconductor device and a method for manufacturing the same, and particularly to a semiconductor device including a CMOS transistor, and a method for manufacturing the same.

BACKGROUND ART

As for semiconductor devices, in a semiconductor device including a logic circuit, for example, a CMOS (Complementary Metal Oxide Semiconductor) transistor, that is, an n channel-type MOS (Metal Oxide Semiconductor) transistor and a p channel-type MOS transistor are formed as semiconductor elements. In the n (p) channel-type MOS transistor, an n (p)-type source/drain region is formed to a predetermined depth from a surface of a semiconductor substrate.

In the n (p)-type source/drain region, an extention region having very shallow junction and overlapping with a gate electrode portion is formed. In a minute MOSFET, a halo region for suppressing leak current between a source region and a drain region is also formed.

A method for forming the semiconductor device will now be described briefly. First, a polysilicon film that will form the gate electrode portion of the n (p) channel-type MOS transistor is patterned, and then, an offset spacer having a predetermined film thickness and formed of a silicon oxide film is formed on a side surface of the polysilicon film. Next, a region (pMOS region) where the p channel-type MOS transistor is to be formed is covered with a resist.

Next, in this state, n-type impurity ions are implanted into a region (nMOS region) where the n channel-type MOS transistor is to be formed, using the polysilicon film that will form the gate electrode portion and the offset spacer as a mask, and thereby an n-type extention implantation region is formed. In addition, p-type impurity ions are implanted using an ion oblique implantation method, and thereby a p-type halo implantation region is formed. Thereafter, the resist covering the pMOS region is removed and the semiconductor substrate is cleaned with a predetermined chemical solution (cleaning liquid).

Next, the nMOS region is covered with a resist. In this state, the p-type impurity ions are implanted into the pMOS region using the polysilicon film that will form the gate electrode portion and the offset spacer as the mask, and thereby a p-type extention implantation region is formed. In addition, the n-type impurity ions are implanted using the ion oblique implantation method, and thereby an n-type halo implantation region is formed. Thereafter, the resist covering the nMOS region is removed and the semiconductor substrate is cleaned with the predetermined chemical solution.

Next, a sidewall spacer formed of a silicon oxide film and the like is formed on the side surface of the polysilicon film that will form the gate electrode portion of the n (p) channel-type MOS transistor, with the offset spacer interposed therebetween. Next, the n (p)-type impurity ions are implanted into the nMOS (pMOS) region using the polysilicon film that will form the gate electrode portion, the offset spacer and the sidewall spacer as the mask, and thereby an n (p)-type source/drain implantation region is formed in the nMOS (pMOS) region. Thereafter, predetermined heat treatment is performed to thermally diffuse the impurity ions in the n (p)-type extention implantation region and the source/drain implantation region, and thereby an n (p)-type extention region and a source/drain region are formed, respectively. The main portions of the n (p) channel-type MOS transistor are thus formed.

Increasing the current drive capability has recently been demanded in CMOS transistors in order to address higher performance and lower power consumption of electronic devices. In order to increase the current drive capability, a gate insulating film must be thinned. A silicon oxide film ($SiO_2$) or a silicon oxide nitride film (SiON) is applied as the gate insulating film. When this gate insulating film is thinned, a problem of an increase in gate leak current due to the tunneling phenomenon arises.

In order to solve the aforementioned problem, development is proceeding of a structure in which an insulating film (High-k film) having a dielectric constant higher than that of the $SiO_2$ film or the SiON film is applied as the gate insulating film and a metal film made of a metal material having a predetermined work function is applied as the gate electrode portion. Typically, a hafnium-based oxide film or the like such as an $HfO_2$ film, an HfON film and an HfSiON film is applied as the High-k film, and titanium nitride (TiN) or the like is applied as the metal material.

In a CMOS transistor as well including such a gate electrode portion having the High-k film and the metal film, an offset spacer is formed, and an extention region and a halo region are formed similarly to the above-mentioned CMOS transistor. It is to be noted that a semiconductor device including an extention region and the like is disclosed in Patent Literatures 1 to 6, for example.

CITATION LIST

Patent Literature

PTL 1: Japanese Patent Laying-Open No. 2000-114522
PTL 2: Japanese Patent Laying-Open No. 2008-117848
PTL 3: Japanese Patent Laying-Open No. 2008-60538
PTL 4: Japanese Patent Laying-Open No. 2007-220755
PTL 5: Japanese Patent Laying-Open No. 2007-67425
PTL 6: Japanese Patent Laying-Open No. 2007-305889

SUMMARY OF INVENTION

Technical Problem

However, the CMOS transistor including the gate electrode portion configured by stacking the metal film on the High-k film has had the following problems.

In the CMOS transistor, the offset spacer is first formed on the side surface of the gate electrode portion in the n (p) MOS region. Then, when the extention implantation region and the like of the n channel-type MOS transistor are formed, the pMOS region is covered with the resist, and the n-type impurity ions are injected into the nMOS region using, as the mask, the offset spacer formed on the side surface of the gate electrode portion in the nMOS region. Thereafter, the resist covering the pMOS region is removed by ashing, and the surface of the semiconductor substrate is cleaned with the predetermined chemical solution (cleaning liquid).

On the other hand, when the extention implantation region and the like of the p channel-type MOS transistor are formed, the nMOS region is covered with the resist, and the p-type impurity ions are injected into the pMOS region using, as the mask, the offset spacer formed on the side surface of the gate electrode portion in the pMOS region. Thereafter, the resist covering the nMOS region is removed by ashing, and the surface of the semiconductor substrate is cleaned with the predetermined chemical solution.

Therefore, in cleaning after ion implantation for forming the extention implantation region and the like, the nMOS region and the pMOS region are exposed to the predetermined chemical solution at least twice, with the offset spacer exposed on the side surface of the gate electrode portion. When a plurality of MOS transistors having different threshold voltages are formed, ion implantation is performed a plurality of times for the respective MOS transistors, and thus, the number of exposure to the chemical solution further increases. Meanwhile, the offset spacer formed of the silicon oxide film may be etched by the chemical solution and become thinner in some cases.

As a result, the chemical solution may permeate from the thinned offset spacer and reach the metal film of the gate electrode portion, and the chemical solution may react with a metal in the metal film to lose a part of the metal film in some cases. In addition, since the offset spacer becomes thinner, a profile of the impurity ions (extention implantation region or halo implantation region) implanted using the offset spacer and the like as the mask may change in some cases. Consequently, desired properties of the MOS transistor cannot be obtained.

The present invention has been made to solve the above problems and one object is to provide a method for manufacturing a semiconductor device including a gate electrode portion having excellent resistance to chemical solutions, and another object is to provide such a semiconductor device.

Solution to Problem

A method for manufacturing a semiconductor device according to the present invention includes the following steps. A first gate electrode portion is formed in a first region on a main surface of a semiconductor substrate by stacking a first metal film having a predetermined work function on a first dielectric film having a predetermined dielectric constant. A second gate electrode portion is formed in a second region on the main surface of the semiconductor substrate by stacking a second metal film having a predetermined work function on a second dielectric film having a predetermined dielectric constant. A first protective film including a first silicon nitride film is formed to cover a side surface of the first gate electrode portion and a side surface of the second gate electrode portion. A first extention implantation region is formed in the first region by injecting an impurity of a first conduction type by causing a portion of the first protective film located on the side surface of the first gate electrode portion, of the first protective film to function as a first offset spacer and using the first offset spacer as a mask. The semiconductor substrate is cleaned after forming the first extention implantation region. A second protective film is formed on a surface of the first protective film by stacking a second silicon nitride film on a silicon oxide film. A second extention implantation region is formed in the second region by injecting an impurity of a second conduction type by causing a portion of the first protective film and a portion of the second protective film located on the side surface of the second gate electrode portion, of the first protective film and the second protective film to function as a second offset spacer and using the second offset spacer as the mask. The semiconductor substrate is cleaned after forming the second extention implantation region. A first sidewall spacer is formed on the side surface of the first gate electrode portion with the first protective film and the second protective film interposed therebetween, and a second sidewall spacer is formed on the side surface of the second gate electrode portion with the first protective film and the second protective film interposed therebetween. A first source/drain implantation region is formed in the first region by injecting the impurity of the first conduction type using the first sidewall spacer as the mask. A second source/drain implantation region is formed in the second region by injecting the impurity of the second conduction type using the second sidewall spacer as the mask. A first extention region, a second extention region, a first source/drain region, and a second source/drain region are formed, respectively, by performing predetermined heat treatment to thermally diffuse the impurities in the first extention implantation region, the second extention implantation region, the first source/drain implantation region, and the second source/drain implantation region.

A semiconductor device according to the present invention includes a pair of first source/drain regions of a first conduction type, a pair of first extention regions of the first conduction type, a first gate electrode portion, a pair of second source/drain regions of a second conduction type, a pair of second extention regions of the second conduction type, a second gate electrode portion, a first protective film, a second protective film, a first sidewall spacer, and a second sidewall spacer. The pair of first source/drain regions of the first conduction type are formed with a first spacing in a first region on a main surface of a semiconductor substrate. The pair of first extention regions of the first conduction type are formed with a second spacing narrower than the first spacing in a portion of the first region sandwiched between the pair of first source/drain regions. The first gate electrode portion is formed on the portion of the first region sandwiched between the pair of first extention regions, by stacking a first metal film having a predetermined work function on a first dielectric film having a predetermined dielectric constant. The pair of second source/drain regions of the second conduction type are formed with a third spacing in a second region on the main surface of the semiconductor substrate. The pair of second extention regions of the second conduction type are formed with a fourth spacing narrower than the third spacing in a portion of the second region sandwiched between the pair of second source/drain regions. The second gate electrode portion is formed on the portion of the second region sandwiched between the pair of second extention regions, by stacking a second metal film having a predetermined work function on a second dielectric film having a predetermined dielectric constant. The first protective film is formed to cover each of a side surface of the first gate electrode portion and a side surface of the second gate electrode portion, and includes a first silicon nitride film. The second protective film is formed on a surface of the first protective film by sequentially stacking a silicon oxide film and a second silicon nitride film. The first sidewall spacer is formed on the side surface of the first gate electrode portion with the first protective film and the second protective film interposed therebetween. The second sidewall spacer is formed on the side surface of the second gate electrode portion with the first protective film and the second protective film interposed therebetween. Each of the pair of first extention regions is formed to extend in a direction away from the first gate electrode portion, defining, as a first end, a predetermined position spaced from a position of the semiconductor substrate toward the first gate electrode portion side by a distance based on a thermal diffusion length, the position being located immediately under the surface of the first protective film on the side surface of the first gate electrode portion. Each of the pair of second extention regions is formed to extend in a direction away from the second gate electrode portion, defining, as a second end, a predetermined position spaced from a position of the semiconductor substrate toward the second gate electrode portion side by a distance based on the thermal diffusion length, the position being located immediately under a surface of the second protective film on the side surface of the second gate electrode portion. Each of the pair of first source/drain regions is formed to extend in the direction away from the first gate electrode portion, defining, as a third end, a predetermined position between the first end and a position of the semiconductor substrate spaced from the position toward the first gate electrode portion side by a distance based on the thermal diffusion length, the position being located immediately under a surface of the first sidewall spacer on the side surface of the first gate electrode portion. Each of the pair of second source/drain regions is formed to extend in the direction away from the second gate electrode portion, defining, as a fourth end, a predetermined position between the second end and a position of the semiconductor substrate spaced from the position toward the second gate electrode portion side by a distance based on the thermal diffusion length, the position being located immediately under a surface of the second sidewall spacer on the side surface of the second gate electrode portion.

Advantageous Effects of Invention

According to the method for manufacturing a semiconductor device in accordance with the present invention, in cleaning after forming the first extention implantation region in the first region, the first gate electrode portion and the second gate electrode portion are protected by the first protective film including the first silicon nitride film, and in cleaning after forming the second extention implantation region in the second region, the first gate electrode portion and the second gate electrode portion are protected by the second protective film configured by stacking the second silicon nitride film on the silicon oxide film.

According to the semiconductor device in accordance with the present invention, the first gate electrode portion and the second gate electrode portion are protected by the first protective film including the first silicon nitride film, by the second protective film configured by stacking the second silicon nitride film on the silicon oxide film, and by a stacked film configured by stacking the first silicon nitride film, the silicon oxide film and the second silicon nitride film.

DESCRIPTION OF EMBODIMENTS

A semiconductor device of the present invention has a feature in terms of a structure of a protective film formed on a side surface of a gate electrode portion of an MOS transistor, and the protective film has a function as an offset spacer. Thus, a description will be given first to a difference between the offset spacer and a sidewall spacer generally formed on the side surface of the gate electrode portion.

Figure 1:
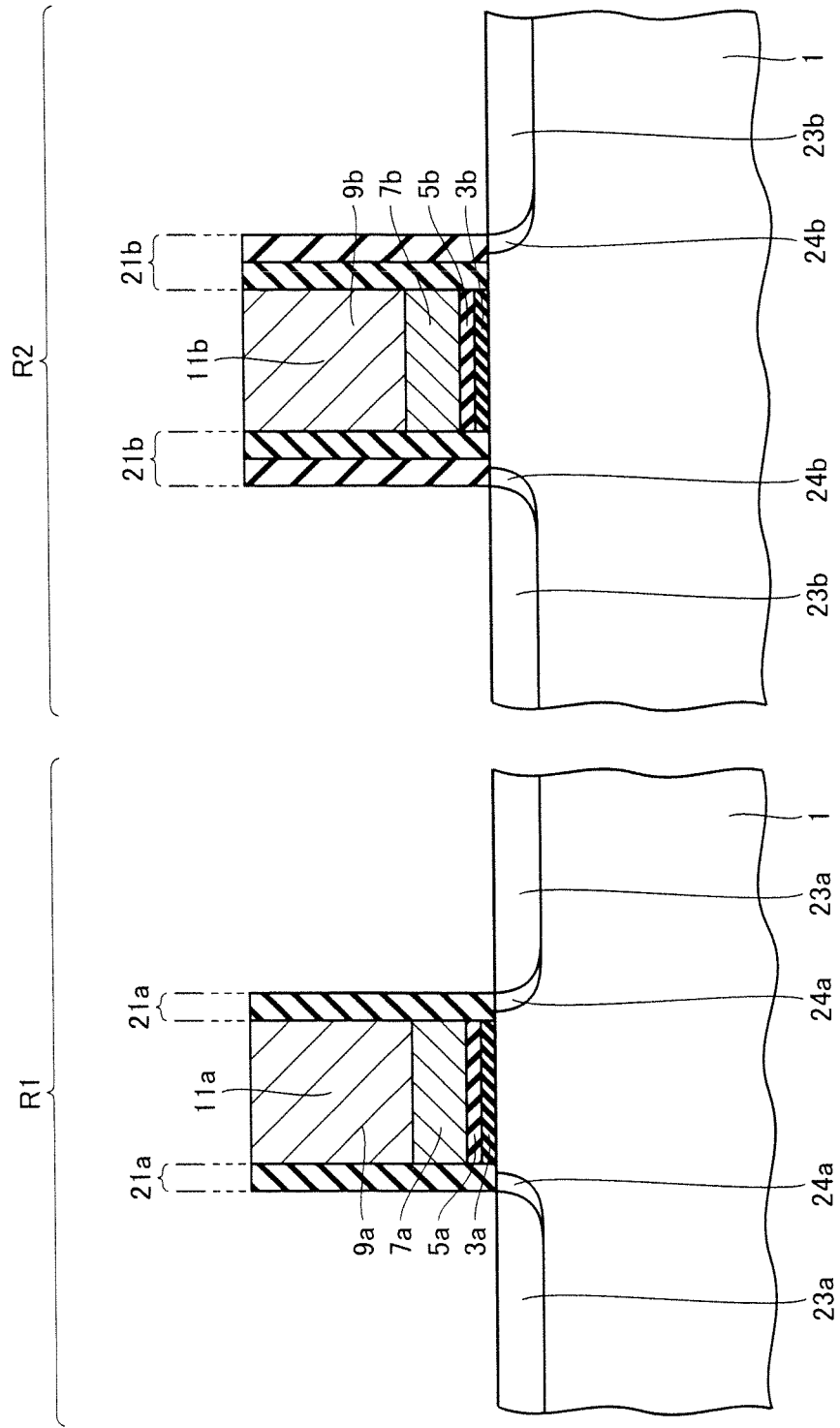
FIG. 1 is a cross-sectional view showing extention implantation for describing a difference between an offset spacer and a sidewall spacer according to each embodiment of the present invention.

First, as shown in FIG. 1, the offset spacer serves as an implantation mask in forming an extention implantation region, together with the gate electrode portion. In an nMOS region R1 on a main surface of a semiconductor substrate 1 where an n channel-type MOS transistor is to be formed, an offset spacer 21a formed of a silicon nitride film is first formed on a side surface of a gate electrode portion 11a. Next, in this state, using offset spacer 21a and gate electrode portion 11a as the mask, n-type impurity ions are implanted, and thereby an extention implantation region 23a is formed. In addition, p-type impurity ions are implanted obliquely, and thereby a halo implantation region 24a is formed.

On the other hand, in a pMOS region R2 on the main surface of semiconductor substrate 1 where a p channel-type MOS transistor is to be formed, an offset spacer 21b formed of a stacked film including the silicon nitride film is formed on a side surface of a gate electrode portion 11b. Next, in this state, using offset spacer 21b and gate electrode portion 11b as the mask, the p-type impurity ions are implanted, and thereby an extention implantation region 23b is formed. In addition, the n-type impurity ions are implanted obliquely, and thereby a halo implantation region 24b is formed.

Figure 2:
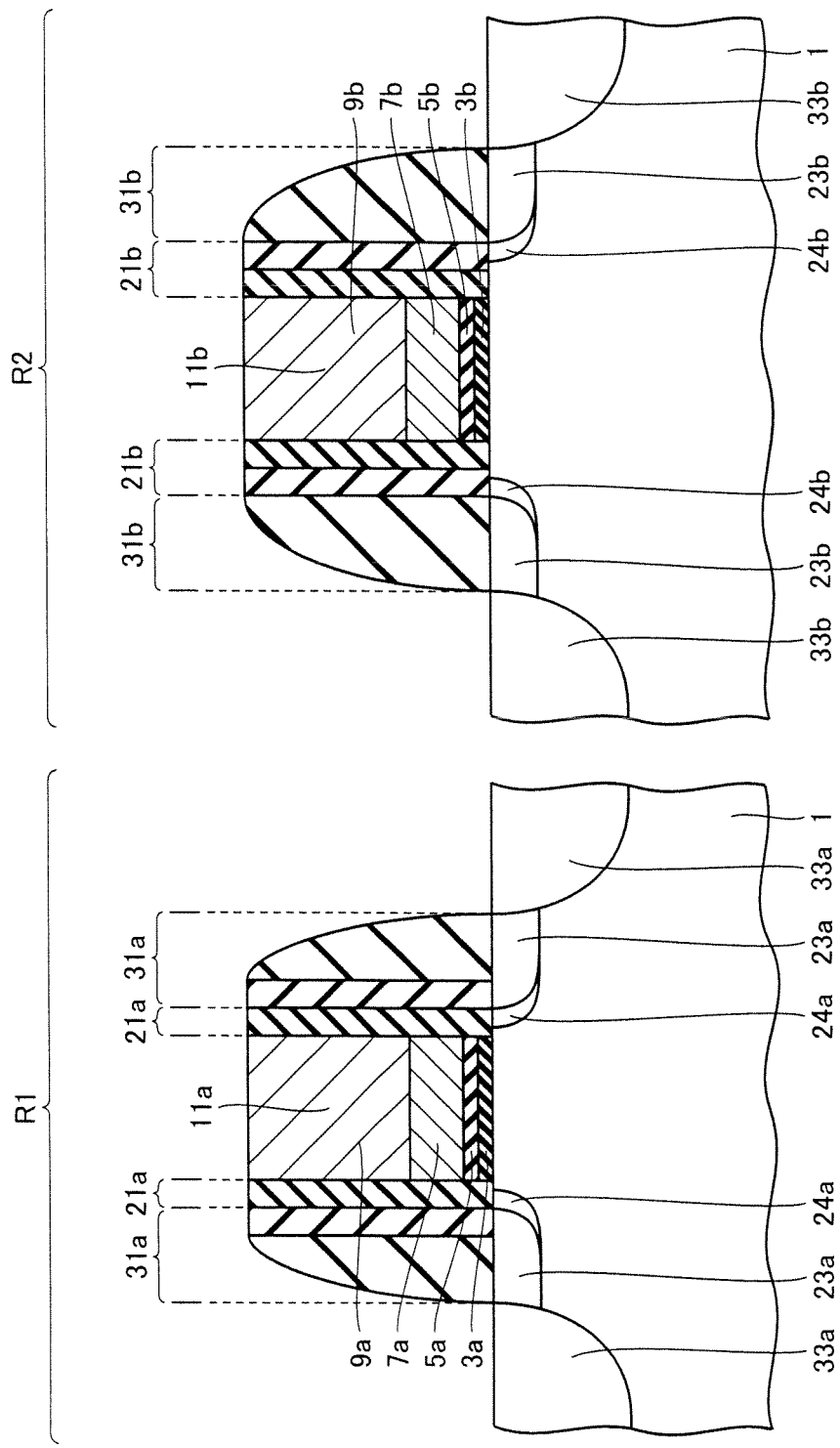
FIG. 2 is a cross-sectional view showing source/drain implantation for describing the difference between the offset spacer and the sidewall spacer according to each embodiment of the present invention.

Next, as shown in FIG. 2, the sidewall spacer serves as an implantation mask in forming a source/drain implantation region, together with the gate electrode portion and the offset spacer. In nMOS region R1, a sidewall spacer 31a is formed on the side surface of gate electrode portion 11a with offset spacer 21a interposed therebetween. Next, in this state, the n-type impurity ions are implanted using sidewall spacer 31a, offset spacer 21a and gate electrode portion 11a as the mask, and thereby a source/drain implantation region 33a is formed.

On the other hand, in pMOS region R2, a sidewall spacer 31b is formed on the side surface of gate electrode portion 11b with offset spacer 21b interposed therebetween. Next, in this state, the p-type impurity ions are implanted using sidewall spacer 31b, offset spacer 21b and gate electrode portion 11b as the mask, and thereby a source/drain implantation region 33b is formed.

Figure 3:
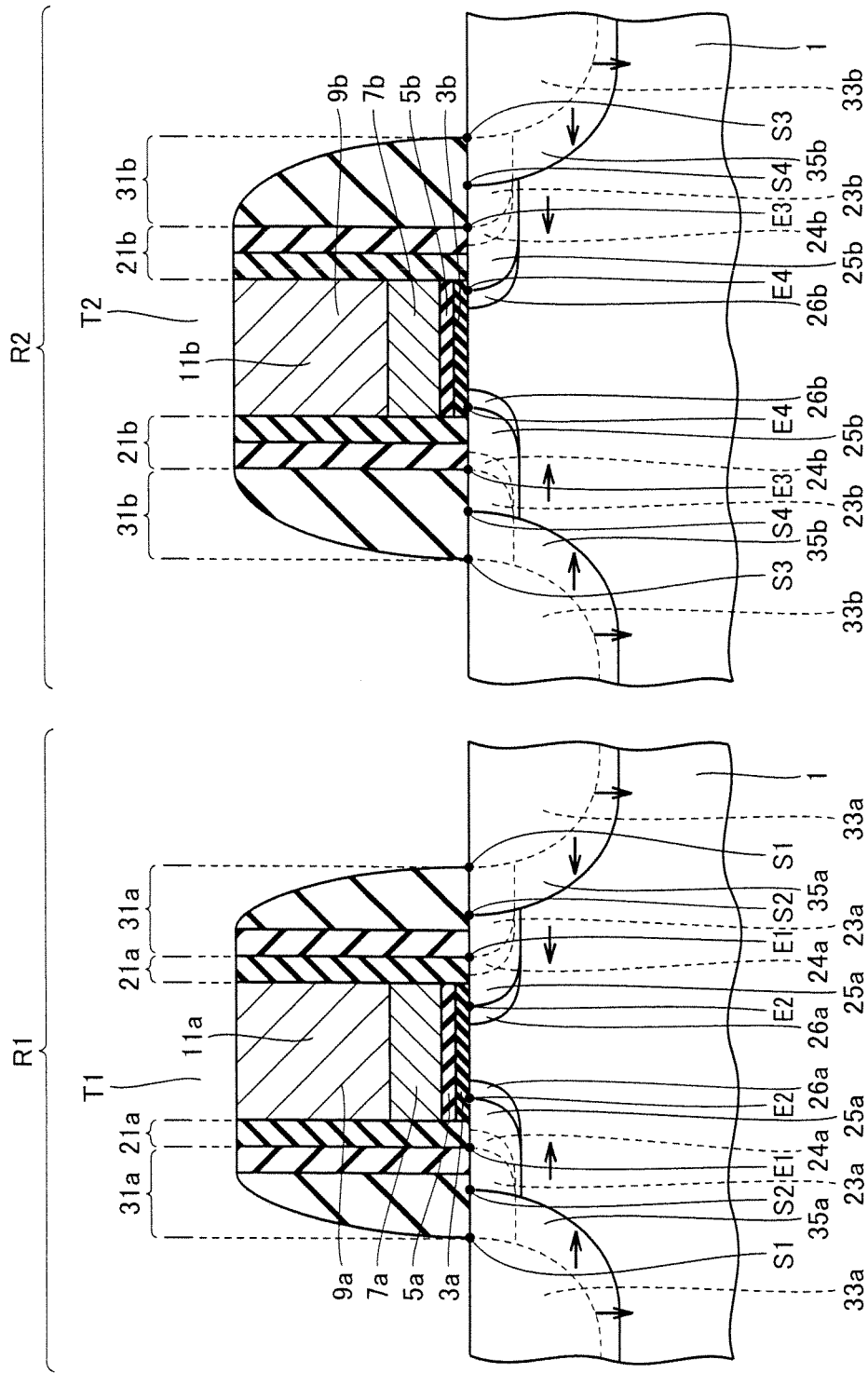
FIG. 3 is a cross-sectional view showing thermal diffusion of an impurity in an extention implantation region and an impurity in a source/drain implantation region caused by heat treatment for describing the difference between the offset spacer and the sidewall spacer according to each embodiment of the present invention.

Next, as shown in FIG. 3, predetermined heat treatment is performed to diffuse the impurity ions in extention implantation regions 23a and 23b, halo implantation regions 24a and 24b, and source/drain implantation regions 33a and 33b through semiconductor substrate 1 (see arrows). As a result, an extention region 25a, a halo region 26a and a source/drain region 35a are formed in nMOS region R1, and an extention region 25b, a halo region 26b and a source/drain region 35b are formed in pMOS region R2. Thus, an n channel-type MOS transistor T1 is formed in nMOS region R1, and a p channel-type MOS transistor T2 is formed in pMOS region R2.

As a result of thermal diffusion of the impurity ions, each of a pair of first extention regions 25a is formed to extend in a direction away from gate electrode portion 11a, defining, as a first end E2, a position spaced from a position E1 of semiconductor substrate 1 toward the gate electrode portion 11a side by a distance based on a thermal diffusion length, position E1 being located immediately under a surface of offset spacer 21a (a first protective film 16a described below) on the side surface of gate electrode portion 11a.

In addition, each of a pair of second extention regions 25b is formed to extend in a direction away from gate electrode portion 11b, defining, as a second end E4, a position spaced from a position E3 of semiconductor substrate 1 toward the gate electrode portion 11b side by a distance based on the thermal diffusion length, position E3 being located immediately under a surface of offset spacer 21b (a second protective film 20b described below) on the side surface of gate electrode portion 11b.

Furthermore, each of a pair of first source/drain regions 35a is formed to extend in the direction away from gate electrode portion 11a, defining, as a third end S2, a predetermined position between first end E2 and a position S1 of semiconductor substrate 1 spaced from position S1 toward the gate electrode portion 11a side by a distance based on the thermal diffusion length, position S1 being located immediately under a surface of first sidewall spacer 31a on the side surface of gate electrode portion 11a.

Each of a pair of second source/drain regions 35b is formed to extend in the direction away from gate electrode portion 11b, defining, as a fourth end S4, a predetermined position between second end E4 and a position S3 of semiconductor substrate 1 spaced from position S3 toward the gate electrode portion 11b side by a distance based on the thermal diffusion length, position S3 being located immediately under the surface of second sidewall spacer 31b on the side surface of gate electrode portion 11b.

As described above, offset spacers 21a and 21b function as the implantation masks in forming extention implantation regions 23a and 23b or the like, and sidewall spacers 31a and 31b function as the implantation masks in forming source/drain implantation regions 33a and 33b. Structurally, offset spacers 21a and 21b are located between sidewall spacers 31a, 31b and gate electrode portions 11a, 11b, respectively. In addition, offset spacers 21a and 21b each has a thickness of several nanometers (approximately 2 to 6 nm), and sidewall spacers 31a and 31b each has a thickness of several tens of nanometers (approximately 20 to 25 nm).

As described below, by forming the protective film including the silicon nitride film as the protective film functioning as the offset spacer, the resistance to a chemical solution can be improved, and thus, etching of the protective film by the chemical solution can be suppressed and arrival of the chemical solution at a metal film of the gate electrode portion can be inhibited. In addition, by making the thickness of the offset spacer (the number of stacked layers) of the n channel-type MOS transistor different from that of the p channel-type MOS transistor, the extention region and the like corresponding to the properties of each of the n channel-type MOS transistor and the p channel-type MOS transistor can be formed.

A specific description will be given hereinafter to a semiconductor device (CMOS transistor) including such a protective film functioning as the offset spacer. It is to be noted that the halo region is not shown in the drawings as described below for the sake of simplicity.

(First Embodiment)

A description will now be given to a semiconductor device including an MOS transistor in which a surface of a gate electrode portion is oxidized and a protective film including a silicon nitride film is formed on a side surface of the oxidized gate electrode portion as a protective film serving as an offset spacer.

Figure 4:
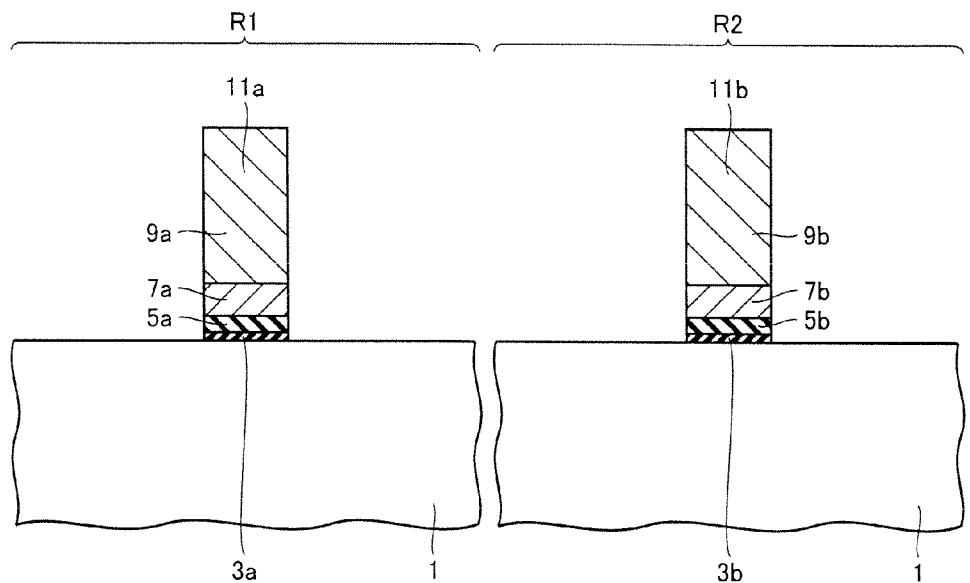
FIG. 4 is a cross-sectional view showing one step of a method for manufacturing a semiconductor device according to a first embodiment of the present invention.

As shown in FIG. 4, in nMOS region R1 of semiconductor substrate 1, gate electrode portion 11a of the n channel-type MOS transistor is formed by stacking a High-k film 5a having a predetermined dielectric constant as well as a metal film 7a and a polysilicon film 9a having predetermined work functions on an inter layer 3a. On the other hand, in pMOS region R2 of semiconductor substrate 1, gate electrode portion 11b of the p channel-type MOS transistor is formed by stacking a High-k film 5b having a predetermined dielectric constant as well as a metal film 7b and a polysilicon film 9b having predetermined work functions on an inter layer 3b.

A film of SiO, SiON or the like is, for example, used as inter layers 3a and 3b, and a hafnium-based High-k film of HfSiON, HfON, $HfO_2$ or the like is, for example, applied as High-k films 5a and 5b. A cap film (not shown) of LaO, La or the like is also formed on High-k film 5a in nMOS region R1 in order to adjust a threshold voltage of the n channel-type MOS transistor. A cap film (not shown) of AlO, Al or the like is formed on High-k film 5b in pMOS region R2 in order to adjust a threshold voltage of the p channel-type MOS transistor.

In addition, a transition metal such as titanium (Ti), tantalum (Ta), nickel (Ni), zirconium (Zr), ruthenium (Ru), cobalt (Co), and tungsten (W), or a nitride metal such as titanium nitride (TiN) is applied as the material of the metal film. Different materials are applied in metal film 7a and metal film 7b in order to adjust the threshold voltage of the n channel-type MOS transistor and the threshold voltage of the p channel-type MOS transistor.

Figure 5:
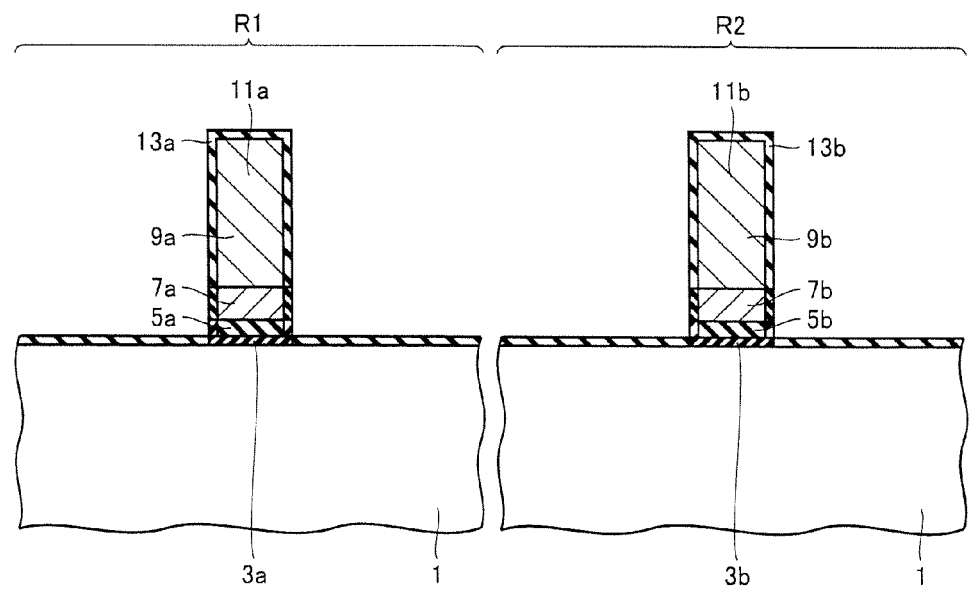
FIG. 5 is a cross-sectional view showing a step performed after the step shown in FIG. 4 in the first embodiment.
Figure 6:
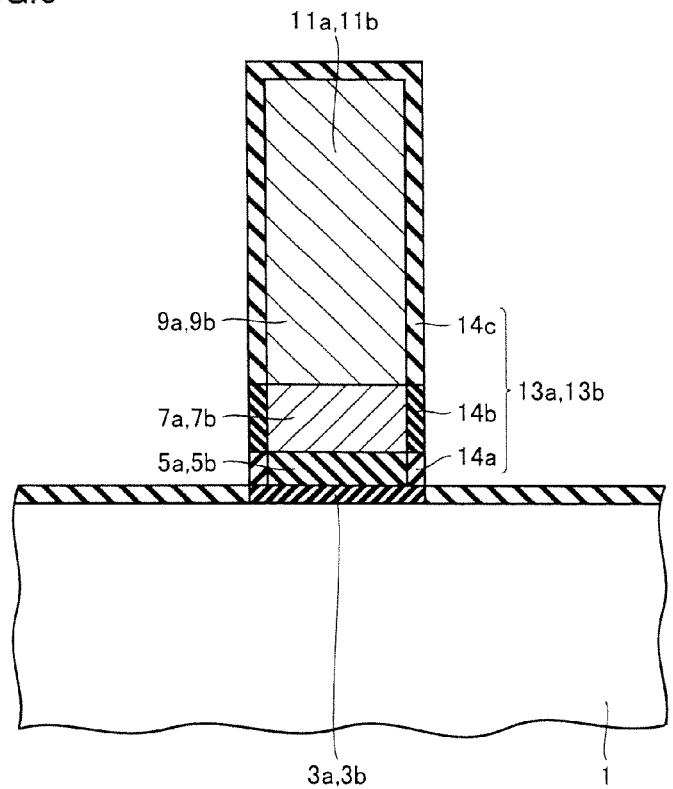
FIG. 6 is an enlarged cross-sectional view showing a manner of oxidation of a gate electrode portion in the step shown in FIG. 5 in the first embodiment.

Thus, gate electrode portions 11a and 11b are patterned, and then, a resist (not shown) used as the mask for the patterning is removed. At this time, as shown in FIG. 5, the resist is removed in the atmosphere of oxygen plasma, and thereby oxide layers 13a and 13b are formed on surfaces of gate electrode portions 11a and 11b. As shown in FIG. 6, this oxide layer 13a, 13b includes a hafnium-based oxide layer 14a formed by oxidizing High-k film 5a, 5b, a metal oxide layer 14b (e.g., a titanium-based oxide layer) formed by oxidizing metal film 7a, 7b, and a silicon-based oxide layer 14c formed by oxidizing polysilicon film 9a, 9b. It is to be noted that these hafnium-based oxide layer 14a, metal oxide layer 14b and silicon-based oxide layer 14c may be formed in some cases by exposing High-k film 5a, 5b, metal films 7a and 7b and polysilicon film 9a, 9b to oxygen in the air.

Figure 7:
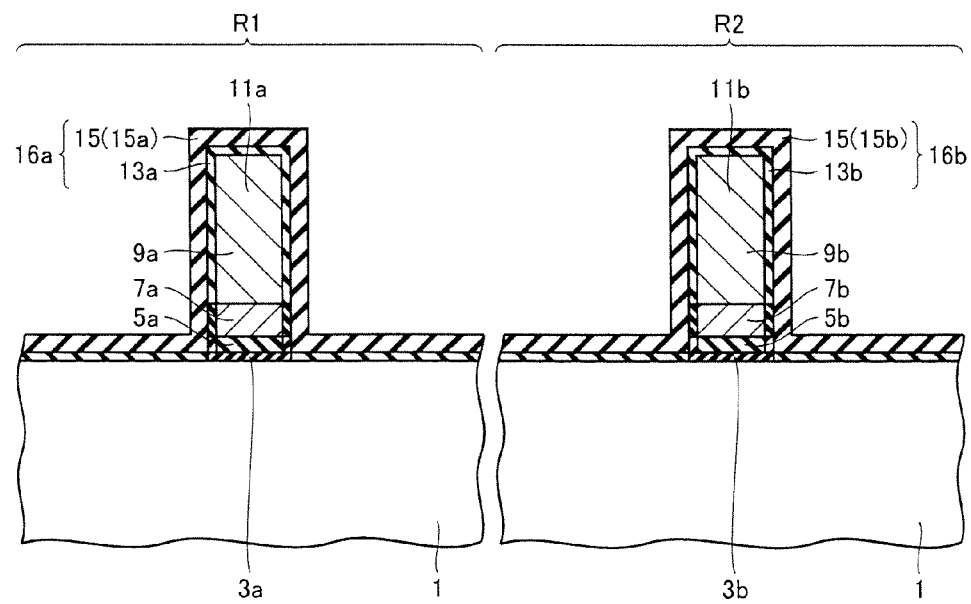
FIG. 7 is a cross-sectional view showing a step performed after the step shown in FIG. 5 in the first embodiment.

Next, as shown in FIG. 7, a silicon nitride film 15 having a film thickness of approximately several nanometers is formed on semiconductor substrate 1 to cover oxide layers 13a and 13b. Thus, oxide layer 13a and silicon nitride film 15 (15a) form first protective film 16a protecting gate electrode portion 11a in nMOS region R1, and oxide layer 13b and silicon nitride film 15 (15b) form a first protective film 16b protecting gate electrode portion 11b in pMOS region R2.

Figure 8:
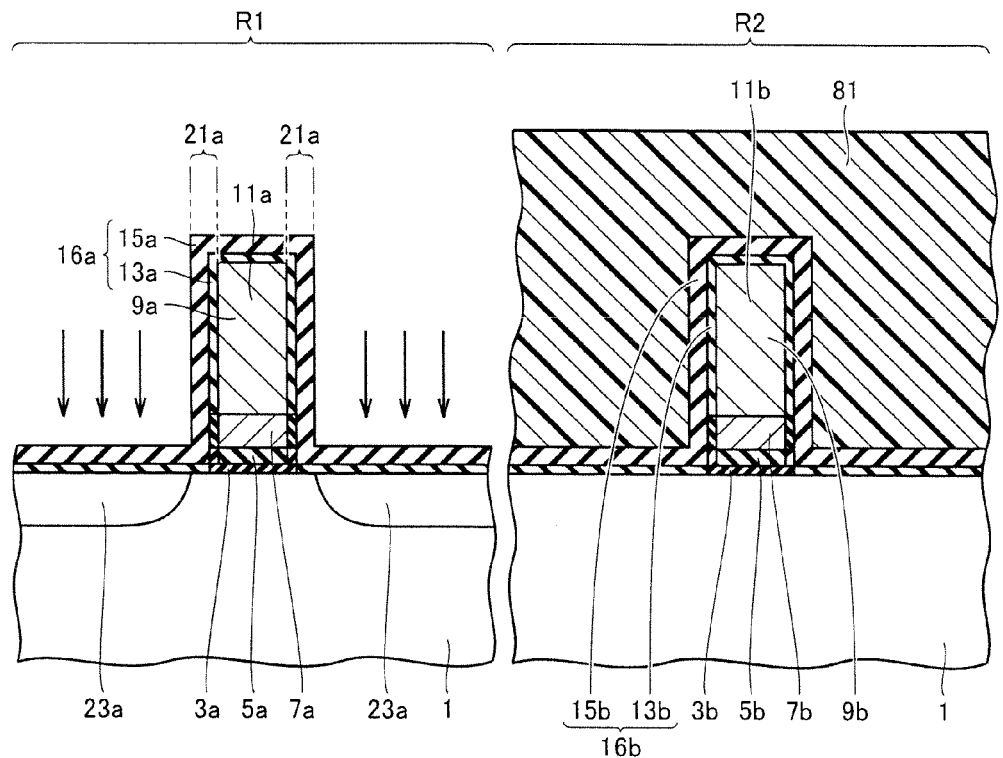
FIG. 8 is a cross-sectional view showing a step performed after the step shown in FIG. 7 in the first embodiment.

Next, as shown in FIG. 8, a resist pattern 81 is formed to expose nMOS region R1 and cover pMOS region R2. In nMOS region R1, a portion of first protective film 16a located on the side surface of gate electrode portion 11a, of first protective film 16a, that is, a portion of oxide layer 13a and a portion of silicon nitride film 15a serve as offset spacer 21a.

Next, using offset spacer 21a and gate electrode portion 11a as the mask, the n-type impurity ions such as, for example, arsenic (As) or phosphorus (P) are implanted (arrows), and thereby n-type extention implantation region 23a is formed to a predetermined depth from the surface of semiconductor substrate 1. In addition, the p-type impurity ions such as indium (In), boron fluoride ($BF_2$) or boron (B) are implanted obliquely, and thereby a p-type halo implantation region (not shown) is formed.

Figure 9:
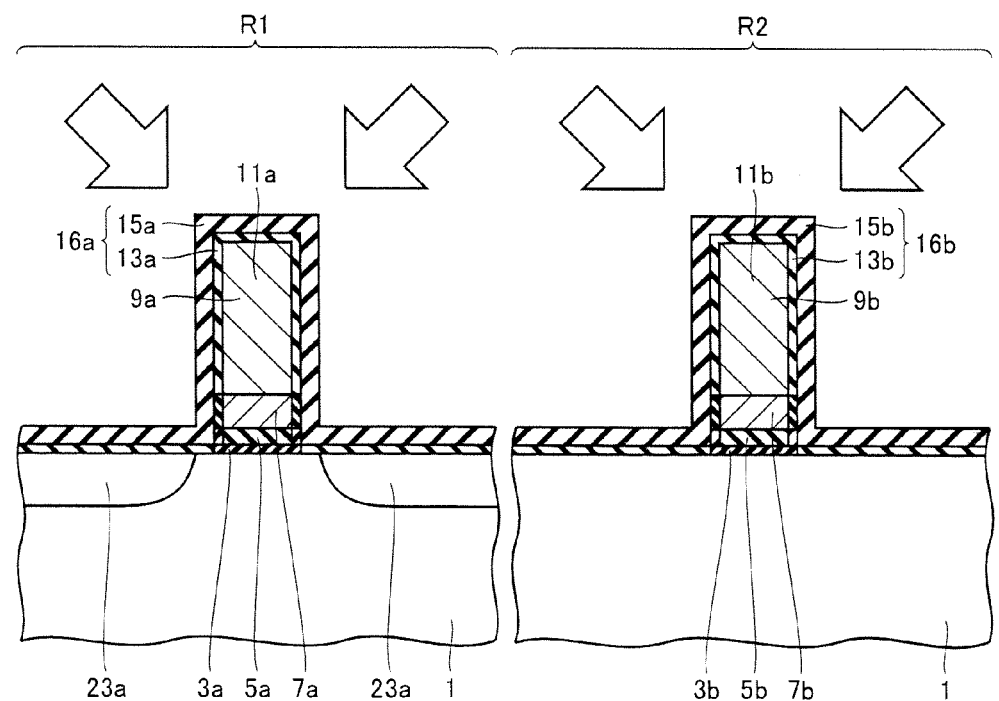
FIG. 9 is a cross-sectional view showing a step performed after the step shown in FIG. 8 in the first embodiment.

Next, ashing treatment is performed in the atmosphere of oxygen plasma to remove resist pattern 81. Next, as shown in FIG. 9, semiconductor substrate 1 after removal of resist pattern 81 is cleaned with an ammonia-based chemical solution and the like. At this time, first protective film 16a is exposed to the chemical solution in nMOS region R1, and first protective film 16b is exposed to the chemical solution in pMOS region R2 (see arrows).

Figure 10:
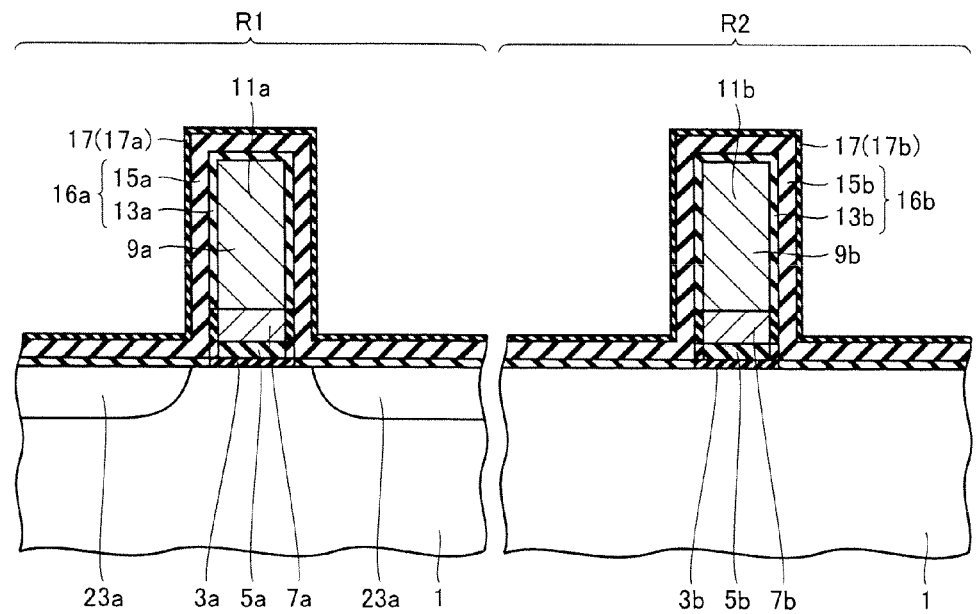
FIG. 10 is a cross-sectional view showing a step performed after the step shown in FIG. 9 in the first embodiment.
Figure 11:
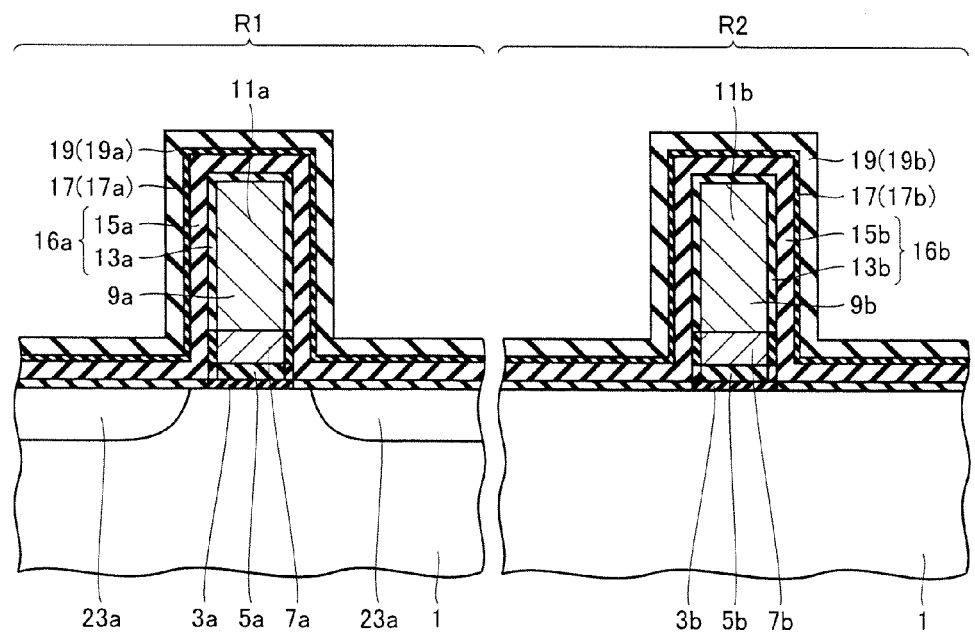
FIG. 11 is a cross-sectional view showing a step performed after the step shown in FIG. 10 in the first embodiment.
Figure 12:
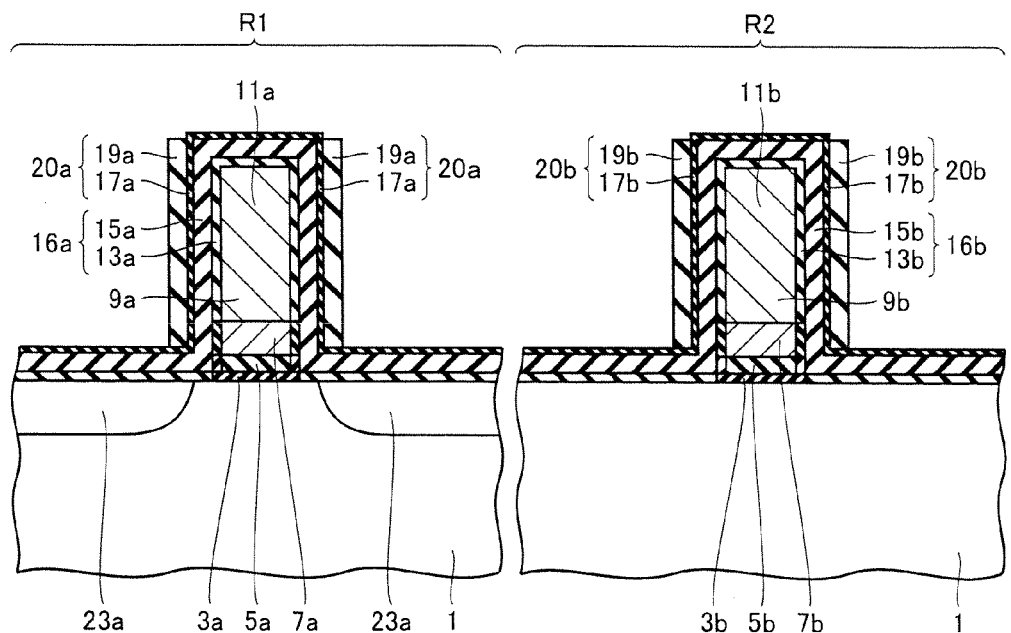
FIG. 12 is a cross-sectional view showing a step performed after the step shown in FIG. 11 in the first embodiment.

Next, as shown in FIG. 10, the surfaces of silicon nitride films 15a and 15b are oxidized in the atmosphere of oxygen plasma, and thereby a silicon oxide film 17 having a film thickness of approximately 1 to 2 nm is formed. Next, as shown in FIG. 11, a silicon nitride film 19 is formed on semiconductor substrate 1 to cover silicon oxide film 17. Next, as shown in FIG. 12, by anisotropically etching silicon nitride film 19 using silicon oxide film 17 as an etching stopper film, silicon nitride film 19 located on the side surfaces of gate electrode portions 11a and 11b is left and silicon nitride film 19 located on the other portions is removed.

Thus, silicon oxide film 17a and silicon nitride film 19a form a second protective film 20a further covering first protective film 16a in nMOS region R1, and silicon oxide film 17b and silicon nitride film 19b form second protective film 20b further covering first protective film 16b in pMOS region R2.

Figure 13:
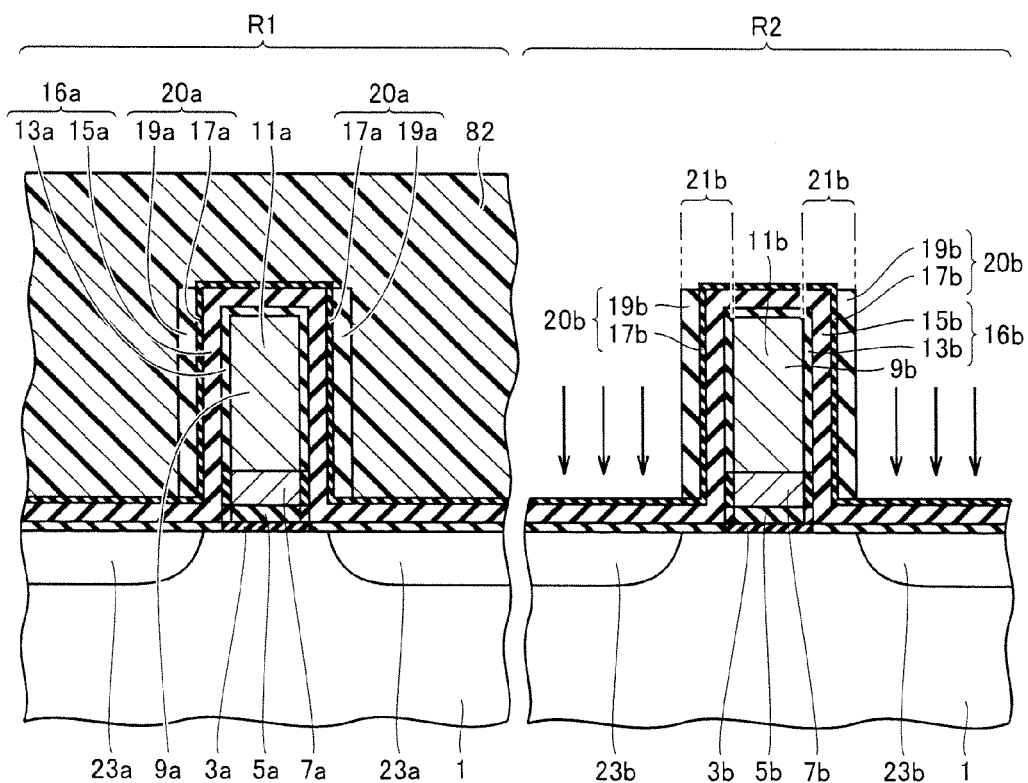
FIG. 13 is a cross-sectional view showing a step performed after the step shown in FIG. 12 in the first embodiment.

Next, as shown in FIG. 13, a resist pattern 82 is formed to cover nMOS region R1 and expose pMOS region R2. In pMOS region R2, a portion of first protective film 16b and a portion of second protective film 20b located on the side surface of gate electrode portion 11b, of first protective film 16b and second protective film 20b, that is, respective portions of oxide layer 13b, silicon nitride film 15b, silicon oxide film 17b, and silicon nitride film 19b serve as offset spacer 21b.

Next, using offset spacer 21b and gate electrode portion 11b as the mask, the p-type impurity ions such as, for example, boron fluoride ($BF_2$), boron (B) or indium (In) are implanted (arrows), and thereby p-type extention implantation region 23b is formed to a predetermined depth from the surface of semiconductor substrate 1. In addition, the n-type impurity ions such as arsenic (As) or phosphorus (P) are implanted, and thereby a n-type halo implantation region (not shown) is formed.

Figure 14:
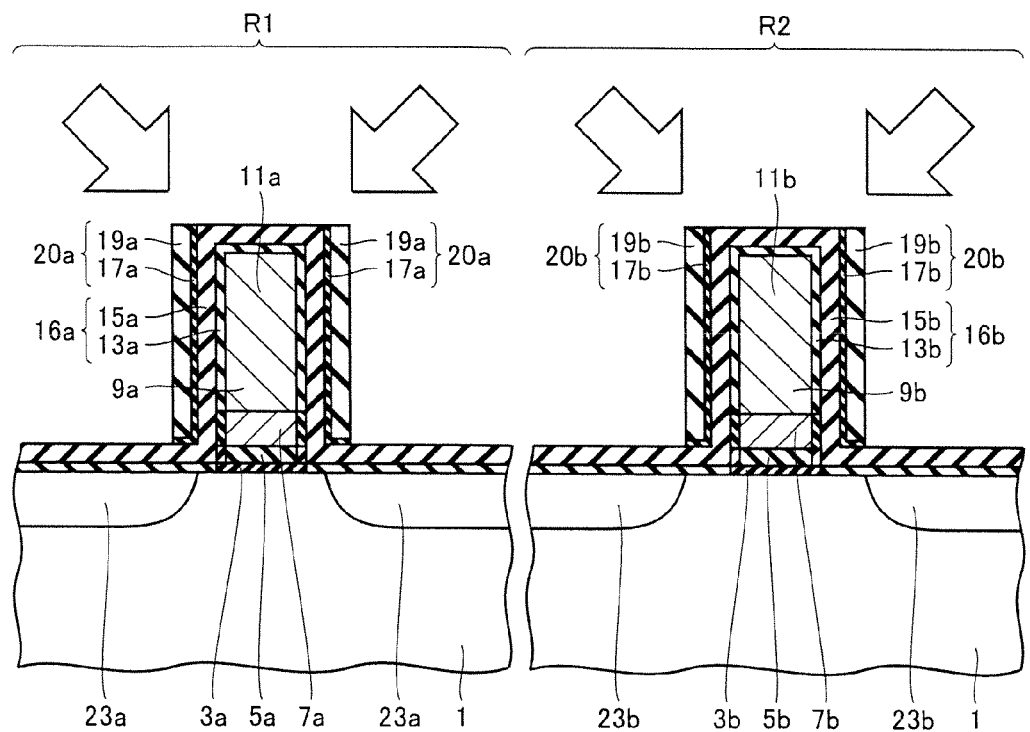
FIG. 14 is a cross-sectional view showing a step performed after the step shown in FIG. 13 in the first embodiment.

Next, ashing treatment is performed in the atmosphere of oxygen plasma to remove resist pattern 82. Next, as shown in FIG. 14, semiconductor substrate 1 after removal of resist pattern 82 is cleaned with the ammonia-based chemical solution and the like. At this time, second protective film 20a is exposed to the chemical solution in nMOS region R1, and second protective film 20b is exposed to the chemical solution in pMOS region R2 (see arrows). At this time, by the ammonia-based chemical solution and the like, silicon oxide films 17a and 17b that are not covered with silicon nitride films 19a and 19b are completely removed or become thinner than a portion covered with silicon nitride films 19a and 19b. It is to be noted that FIG. 14 shows the case where silicon oxide films 17a and 17b that are not covered with silicon nitride films 19a and 19b are completely removed.

Figure 15:
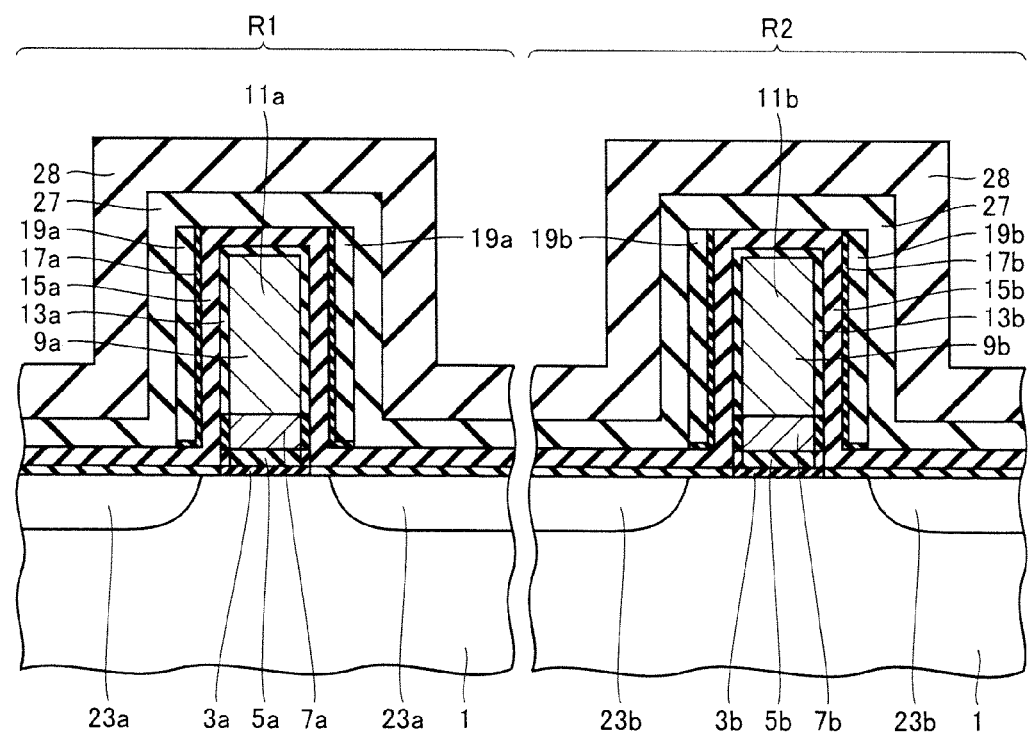
FIG. 15 is a cross-sectional view showing a step performed after the step shown in FIG. 14 in the first embodiment.
Figure 16:
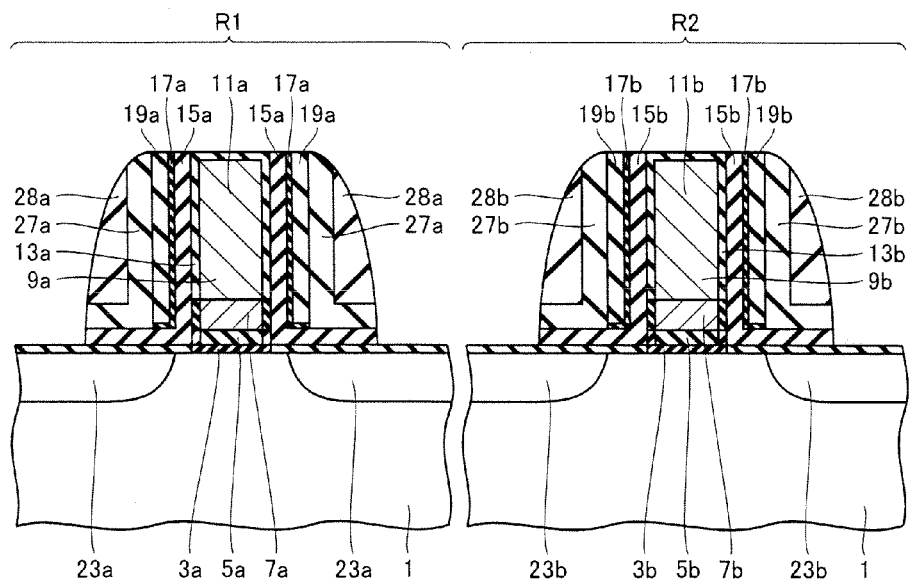
FIG. 16 is a cross-sectional view showing a step performed after the step shown in FIG. 15 in the first embodiment.

Next, as shown in FIG. 15, a silicon oxide film 27 is formed on semiconductor substrate 1 to cover gate electrode portions 11a and 11b. Next, a silicon nitride film 28 is formed on semiconductor substrate 1 to cover silicon oxide film 27. Next, as shown in FIG. 16, by anisotropically etching silicon nitride film 28 and silicon oxide film 27 to leave silicon nitride film 28a and silicon oxide film 27a on the side surface of gate electrode portion 11a and to leave silicon nitride film 28b and silicon oxide film 27b on the side surface of gate electrode portion 11b, silicon nitride film 28 and silicon oxide film 27 located on the surface of semiconductor substrate 1 are removed. At this time, by anisotropically etching silicon nitride films 15a and 15b as well to remove a part thereof, silicon oxide layers 13a and 13b may be left as a stopper for etching, and by removing a part of silicon oxide layers 13a and 13b, gate electrode portions 11a and 11b as well as extention implantation regions 23a and 23b may be exposed. FIG. 16 shows the state in which silicon oxide layers 13a and 13b are left.

Thus, sidewall spacer 31a (see FIG. 17) formed of silicon nitride film 28a and silicon oxide film 27a is formed on the side surface of gate electrode portion 11a in nMOS region R1, and sidewall spacer 31b (see FIG. 18) formed of silicon nitride film 28b and silicon oxide film 27b is formed on the side surface of gate electrode portion 11b in pMOS region R2.

Figure 17:
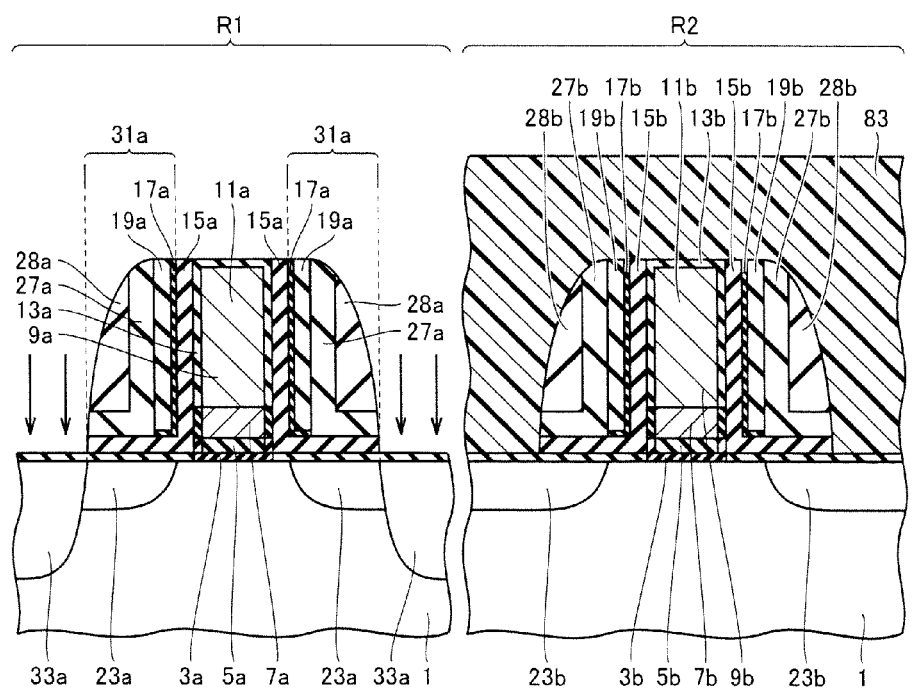
FIG. 17 is a cross-sectional view showing a step performed after the step shown in FIG. 16 in the first embodiment.

Next, as shown in FIG. 17, a resist pattern 83 is formed to expose nMOS region R1 and cover pMOS region R2. Next, the n-type impurity ions such as, for example, arsenic (As) or phosphorus (P) are implanted (arrows) using sidewall spacer 31a and the like as the mask, and thereby n-type source/drain implantation region 33a is formed to a predetermined depth from the surface of semiconductor substrate 1 in nMOS region R1.

Next, ashing treatment is performed in the atmosphere of oxygen plasma to remove resist pattern 83. Next, semiconductor substrate 1 after removal of resist pattern 83 is cleaned with the ammonia-based chemical solution and the like. At this time, silicon oxide layers 13a and 13b that are not covered with silicon nitride films 15a and 15b and the like are completely removed or become thinner than a portion covered with the silicon nitride film. However, subsequent contact with oxygen in the air causes an oxide film to be formed again at the portion where the silicon oxide film has been completely removed. It is to be noted that FIG. 18, which is the next step, shows the silicon oxide film formed again.

Figure 18:
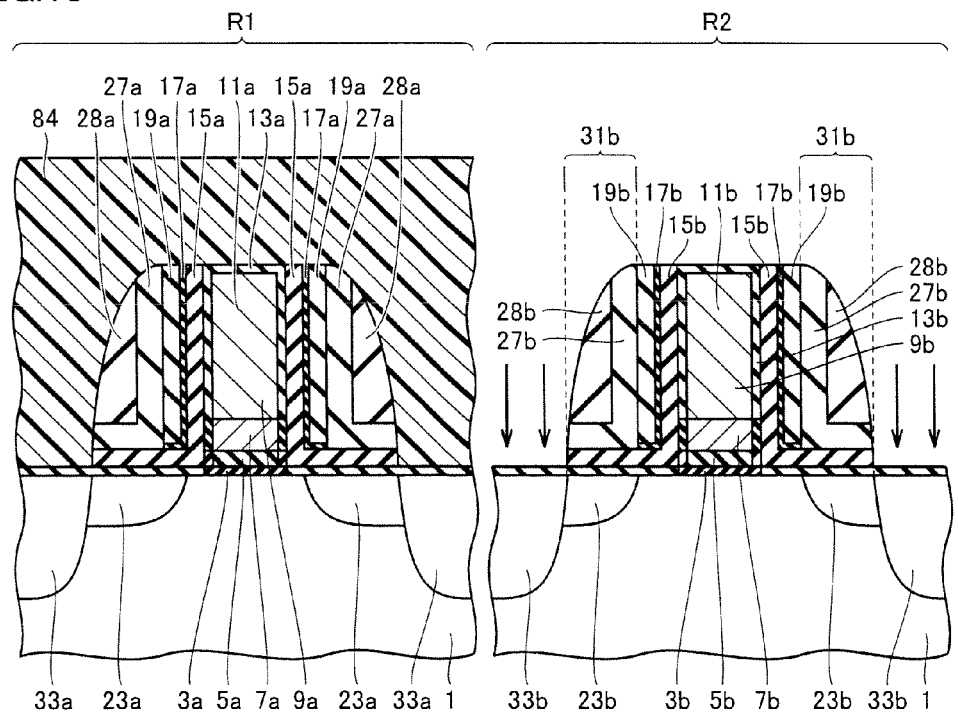
FIG. 18 is a cross-sectional view showing a step performed after the step shown in FIG. 17 in the first embodiment.

Next, as shown in FIG. 18, a resist pattern 84 is formed to cover nMOS region R1 and expose pMOS region R2. Next, the p-type impurity ions such as, for example, boron fluoride (BF$_2$), boron (B) or indium (In) are implanted (arrows) using sidewall spacer 31b and the like as the mask, and thereby p-type source/drain implantation region 33b is formed to a predetermined depth from the surface of semiconductor substrate 1 in pMOS region R2.

Next, ashing treatment is performed in the atmosphere of oxygen plasma to remove resist pattern 84. Next, semiconductor substrate 1 after removal of resist pattern 84 is cleaned with the ammonia-based chemical solution and the like. In this case as well, silicon oxide films 13a and 13b that are not covered with silicon nitride films 15a and 15b and the like are completely removed or become thinner than the portion covered with the silicon nitride film. However, subsequent contact with oxygen in the air causes an oxide film to be formed again at the portion where the silicon oxide film has been completely removed. It is to be noted that FIG. 19, which is the next step, shows the silicon oxide film formed again.

Figure 19:
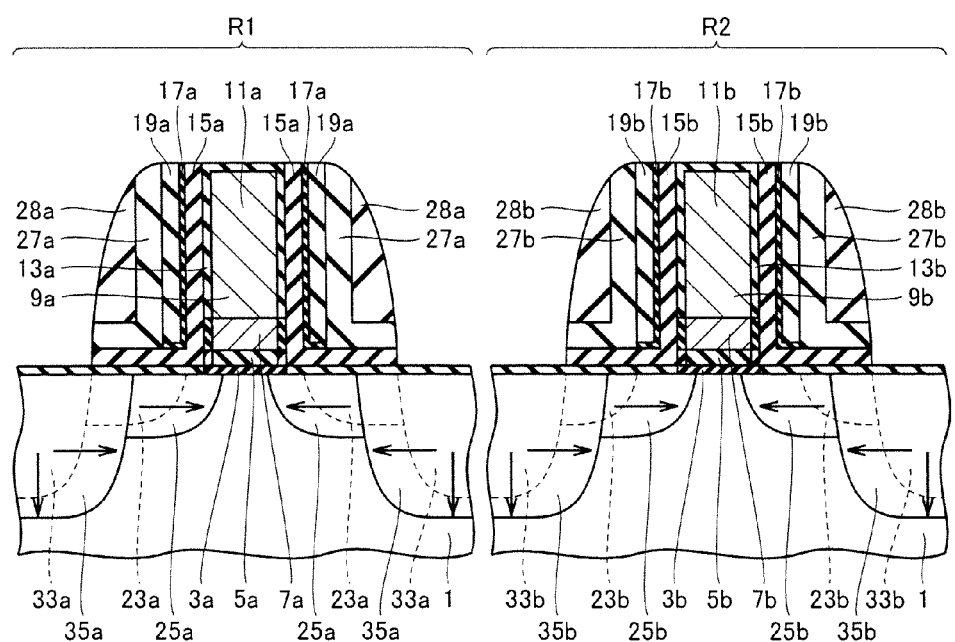
FIG. 19 is a cross-sectional view showing a step performed after the step shown in FIG. 18 in the first embodiment.

Next, as shown in FIG. 19, predetermined heat treatment is performed to thermally diffuse the impurity ions implanted into extention implantation regions 23a and 23b as well as source/drain implantation regions 33a and 33b, and thereby a halo region (not shown), extention region 25a and source/drain region 35a are formed in nMOS region R1. On the other hand, a halo region (not shown), extention region 25b and source/drain region 35b are formed in pMOS region R2.

Thereafter, through a self-aligned silicide process, metal silicide layers 37a and 37b are formed on the surfaces of polysilicon films 9a and 9b and regions therearound in gate electrode portions 11a and 11b, and metal silicide layers 38a and 38b are formed in the surfaces of source/drain regions 35a and 35b and regions therearound. At this time, NiSi or NiPtSi is, for example, used as a material of metal silicide layers 37a, 37b and 38a, 38b. The main portions of n channel-type MOS transistor T1 and p channel-type MOS transistor T2 are thus formed as the CMOS transistor.

Figure 21:
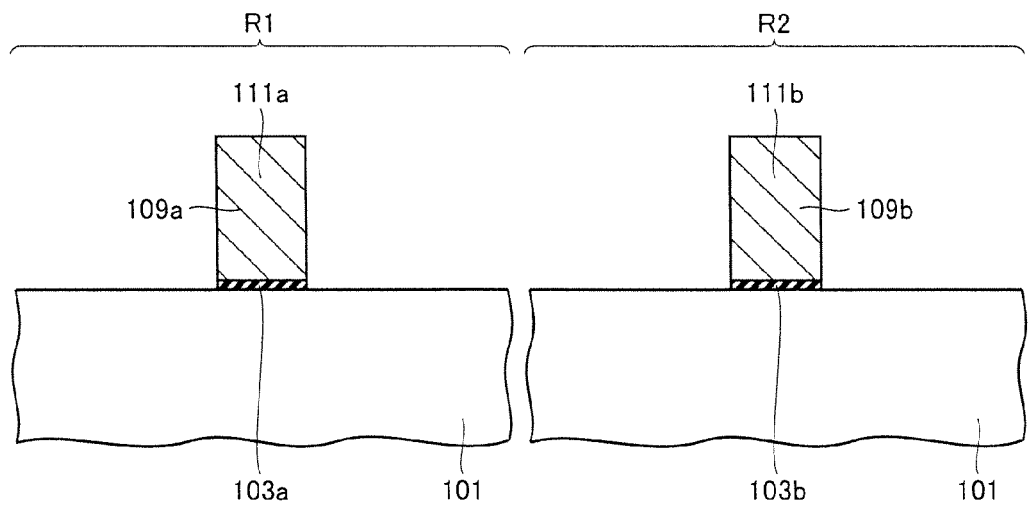
FIG. 21 is a cross-sectional view showing one step of a method for manufacturing a semiconductor device according to a comparative example.

Functions and effects produced by the above-mentioned semiconductor device (manufacturing method) will be described next in connection with a comparative example. A description will be given first to a method for manufacturing a semiconductor device according to the comparative example. As shown in FIG. 21, in nMOS region R1 of a semiconductor substrate 101, a gate electrode portion 111a of the n channel-type MOS transistor formed of a polysilicon film 109a is formed on a gate insulating film 103a. On the other hand, in pMOS region R2 of semiconductor substrate 101, a gate electrode portion 111b of the p channel-type MOS transistor formed of a polysilicon film 109b is formed on a gate insulating film 103b.

Figure 22:
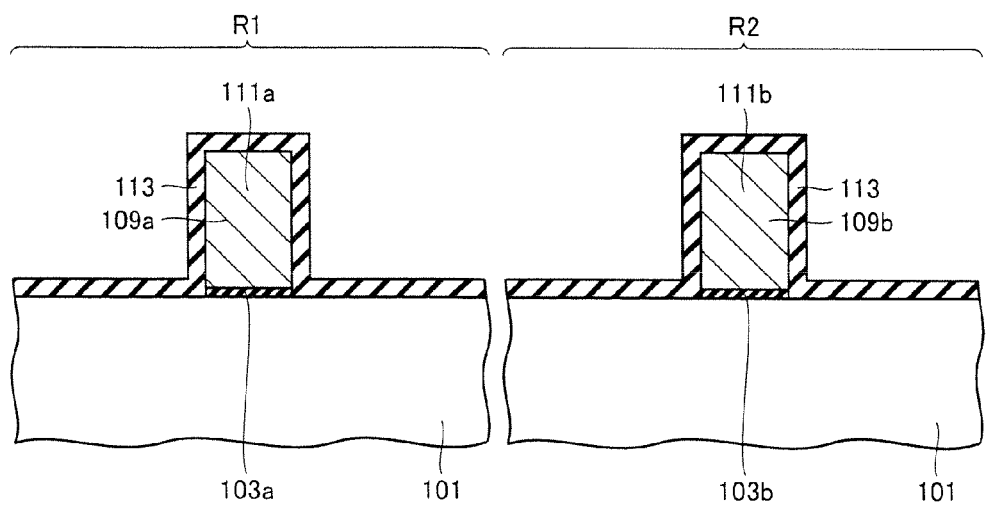
FIG. 22 is a cross-sectional view showing a step performed after the step shown in FIG. 21.
Figure 23:
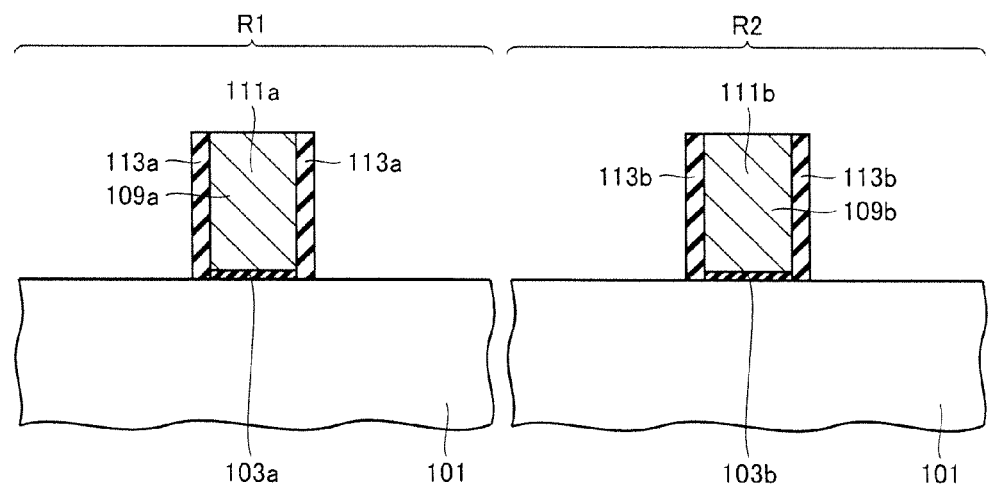
FIG. 23 is a cross-sectional view showing a step performed after the step shown in FIG. 22.

Next, as shown in FIG. 22, a silicon oxide film 113 is formed on semiconductor substrate 101 to cover gate electrode portions 111a and 111b. Next, as shown in FIG. 23, by anisotropically etching silicon oxide film 113 to leave silicon oxide film 113a on a side surface of gate electrode portion 111a and to leave silicon oxide film 113b on a side surface of gate electrode portion 111b, silicon oxide film 113 located on a surface of semiconductor substrate 101 is removed.

Figure 24:
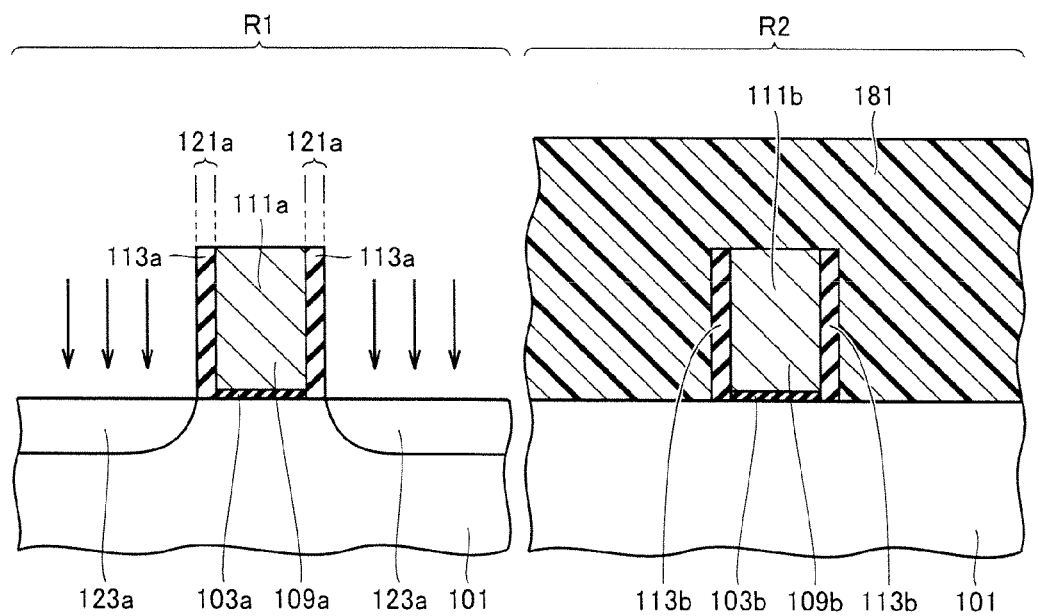
FIG. 24 is a cross-sectional view showing a step performed after the step shown in FIG. 23.

Next, as shown in FIG. 24, a resist pattern 181 is formed to expose nMOS region R1 and cover pMOS region R2. In nMOS region R1, silicon oxide film 113a located on the side surface of gate electrode portion 111a serves as an offset spacer 121a. Next, the n-type impurity ions are implanted (arrows) using offset spacer 121a and gate electrode portion 111a as the mask, and thereby an n-type extention implantation region 123a is formed to a predetermined depth from the surface of semiconductor substrate 101.

Next, ashing treatment is performed in the atmosphere of oxygen plasma to remove resist pattern 181. Next, semiconductor substrate 101 after removal of resist pattern 181 is cleaned with the ammonia-based chemical solution and the like.

Figure 25:
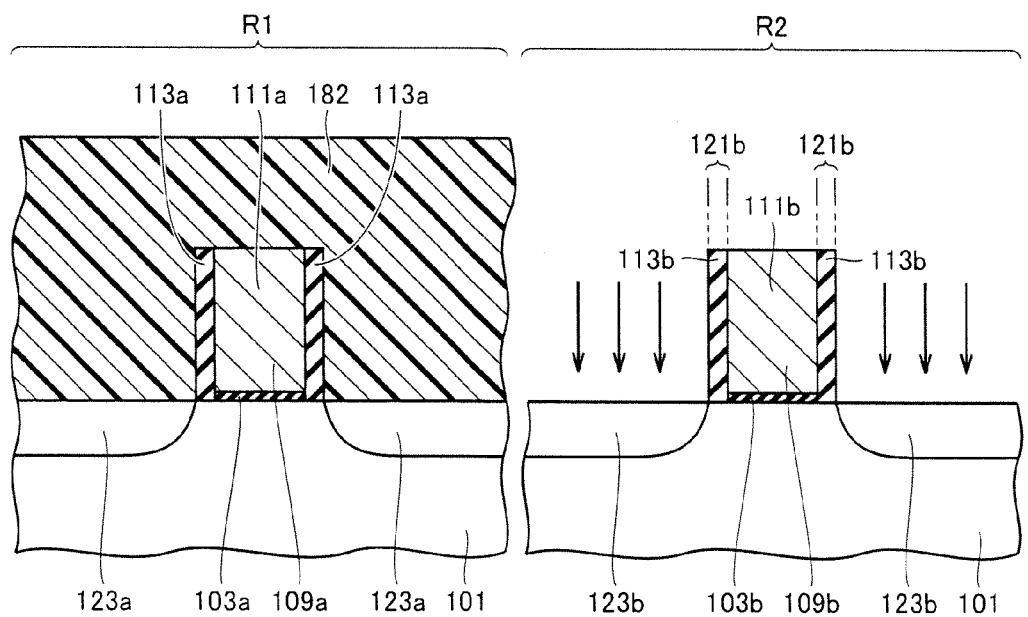
FIG. 25 is a cross-sectional view showing a step performed after the step shown in FIG. 24.

Next, as shown in FIG. 25, a resist pattern 182 is formed to cover nMOS region R1 and expose pMOS region R2. In pMOS region R2, silicon oxide film 113b located on the side surface of gate electrode portion 111b serves as an offset spacer 121b. Next, the p-type impurity ions are implanted (arrows) using offset spacer 121b and gate electrode portion 111b as the mask, and thereby a p-type extention implantation region 123b is formed to a predetermined depth from the surface of semiconductor substrate 101.

Next, ashing treatment is performed in the atmosphere of oxygen plasma to remove resist pattern 182. Next, semiconductor substrate 101 after removal of resist pattern 182 is cleaned with the ammonia-based chemical solution and the like.

Next, a silicon oxide film and a silicon nitride film (not shown) are sequentially formed on semiconductor substrate 101 to cover gate electrode portions 111a and 111b. Next, by anisotropically etching the silicon nitride film and the silicon oxide film to leave the silicon nitride film and the silicon oxide film on the side surface of each of gate electrode portion 111a and gate electrode portion 111b, the silicon nitride film and the silicon oxide film located on the surface of semiconductor substrate 101 are removed.

Figure 26:
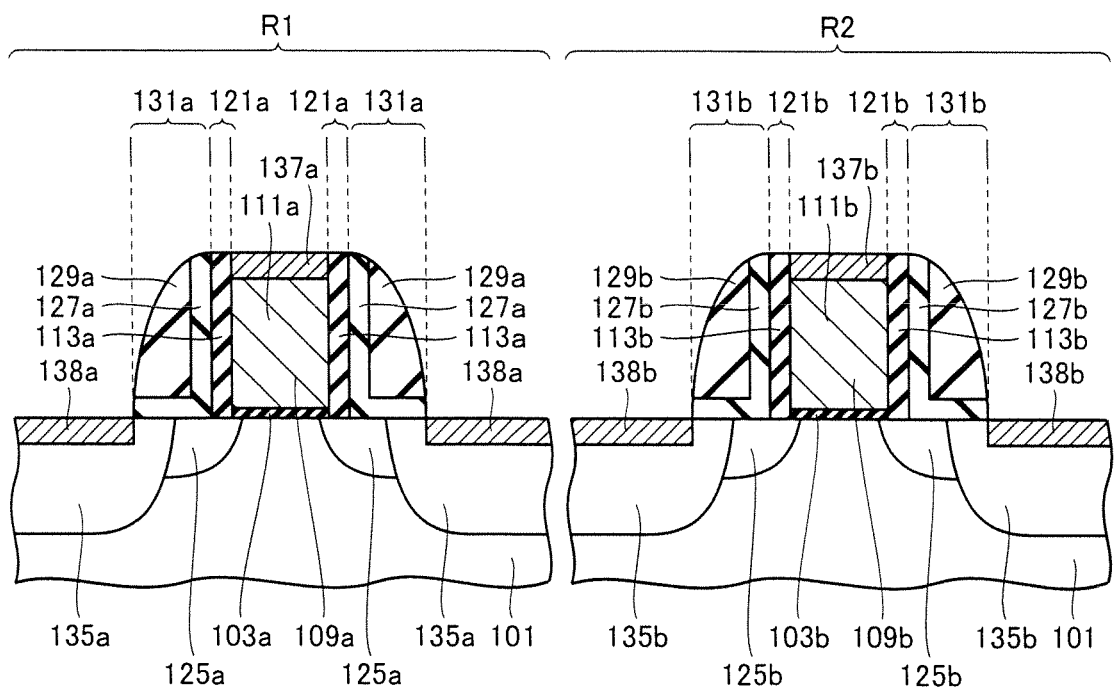
FIG. 26 is a cross-sectional view showing a step performed after the step shown in FIG. 25.

Thus, a sidewall spacer 131a formed of silicon nitride film 128a and silicon oxide film 127a is formed on the side surface of gate electrode portion 111a in nMOS region R1, and a sidewall spacer 131b formed of silicon nitride film 128b and silicon oxide film 127b is formed on the side surface of gate electrode portion 111b in pMOS region R2 (see FIG. 26).

Next, the n-type impurity ions are implanted into nMOS region R1 using sidewall spacer 131a and the like as the mask, and thereby the n-type source/drain implantation region is formed to a predetermined depth from the surface of semiconductor substrate 101. On the other hand, the p-type impurity ions are implanted into pMOS region R2 using sidewall spacer 131b and the like as the mask, and thereby the p-type source/drain implantation region is formed to a predetermined depth from the surface of semiconductor substrate 101.

Thereafter, as shown in FIG. 26, predetermined heat treatment is performed to thermally diffuse the impurity ions implanted into the extention implantation region and the source/drain implantation region, and thereby an extention region 125a and a source/drain region 135a are formed in nMOS region R1, and an extention region 125b and a source/drain region 135b are formed in pMOS region R2.

Thereafter, metal silicide layers 137a and 137b are formed on gate electrode portions 111a and 111b, and metal silicide layers 138a and 138b are formed in source/drain regions 135a and 135b. The main portions of the n channel-type MOS transistor and the p channel-type MOS transistor are thus formed.

In the semiconductor device according to the comparative example, as the offset spacer serving as the implantation mask in forming the extention implantation region and the like, silicon oxide film 113a located on the side surface of gate electrode portion 111a serves as offset spacer 121a in nMOS region R1 (see FIG. 24). On the other hand, silicon oxide film 113b located on the side surface of gate electrode portion 111b serves as offset spacer 121b in pMOS region R2 (see FIG. 25).

In cleaning, with the chemical solution, of the semiconductor substrate after removal of resist pattern 181 and after removal of resist pattern 182, these offset spacers 121a and 121b are exposed to the chemical solution. Since offset spacers 121a and 121b are formed of silicon oxide films 113a and 113b, offset spacers 121a and 121b may be etched by the chemical solution and become thinner in some cases.

Therefore, in the case of the gate electrode portion configured by stacking the metal film and the polysilicon film having predetermined work functions on the High-k film, the chemical solution may react with a metal in the metal film to lose a part of the metal film in some cases.

In addition, since offset spacers 121a and 121b become thinner, a profile of the impurity ions implanted using offset spacers 121a and 121b and the like as the mask (such as extention implantation) may change in some cases. As a result of the above, in the semiconductor device according to the comparative example, desired properties of the MOS transistor cannot be obtained.

In contrast, according to the above-mentioned semiconductor device, in cleaning after forming extention implantation region 23a in nMOS region R1, first protective films 16a and 16b protect gate electrode portions 11a and 11b, and in cleaning after forming extention implantation region 23b in pMOS region R2, second protective films 20a and 20b protect gate electrode portions 11a and 11b.

This will be described. First, first protective films 16a and 16b are formed to cover the side surfaces of gate electrode portions 11a and 11b, respectively (see FIG. 7). Then, in nMOS region R1, extention implantation region 23a is formed by causing the portion of first protective film 16a located on the side surface of gate electrode portion 11a to function as offset spacer 21a and using this offset spacer 21a as the mask. Thereafter, cleaning (cleaning A) of semiconductor substrate 1 is done with the ammonia-based chemical solution and the like (see FIG. 9).

Furthermore, second protective films 20a and 20b are formed on first protective films 16a and 16b, respectively (see FIG. 12). Then, in pMOS region R2, extention implantation region 23b is formed by causing the portion of first protective film 16b and the portion of second protective film 20b located on the side surface of gate electrode portion 11b to function as offset spacer 21b and using this offset spacer 21b as the mask. Thereafter, cleaning (cleaning B) of semiconductor substrate 1 is done with the ammonia-based chemical solution and the like (see FIG. 14).

The chemical solution used to clean the semiconductor substrate has a function of removing (etching) the oxide film. In the above-mentioned semiconductor device, silicon nitride films 15a and 15b are formed on the surfaces of first protective films 16a and 16b directly exposed to the chemical solution in cleaning A. Therefore, the resistance to the chemical solution is improved, and thus, first protective films 16a and 16b (silicon nitride films 15a and 15b) are not etched and thinning of first protective films 16a and 16b can be inhibited. In addition, loss of metal films 7a and 7b of gate electrode portions 11a and 11b due to permeation of the chemical solution can be prevented.

Furthermore, since thinning of first protective films 16a and 16b is inhibited, a desired thickness of offset spacer 21b formed of first protective film 16b and second protective film 20b can be ensured and extention implantation region 23b having a desired impurity profile can be formed using offset spacer 21b as the mask in pMOS region R2.

In addition, silicon nitride films 19a and 19b are formed on the surfaces of second protective films 20a and 20b directly exposed to the chemical solution in cleaning B. Therefore, the resistance to the chemical solution is improved, and thus, second protective films 20a and 20b (silicon nitride films 19a and 19b) are not etched and thinning of second protective films 20a and 20b can be inhibited. In addition, together with first protective films 16a and 16b, permeation of the chemical solution toward gate electrode portions 11a and 11b can be inhibited.

By applying silicon nitride films 15a and 15b and silicon oxide films 17a and 17b as first protective films 16a and 16b and second protective films 20a and 20b formed on the side surfaces of gate electrode portions 11a and 11b and functioning as offset spacers 21a and 21b, gate leak can be reduced as compared with offset spacers 121a and 121b formed of the silicon oxide film in the semiconductor device according to the comparative example.

Figure 27:
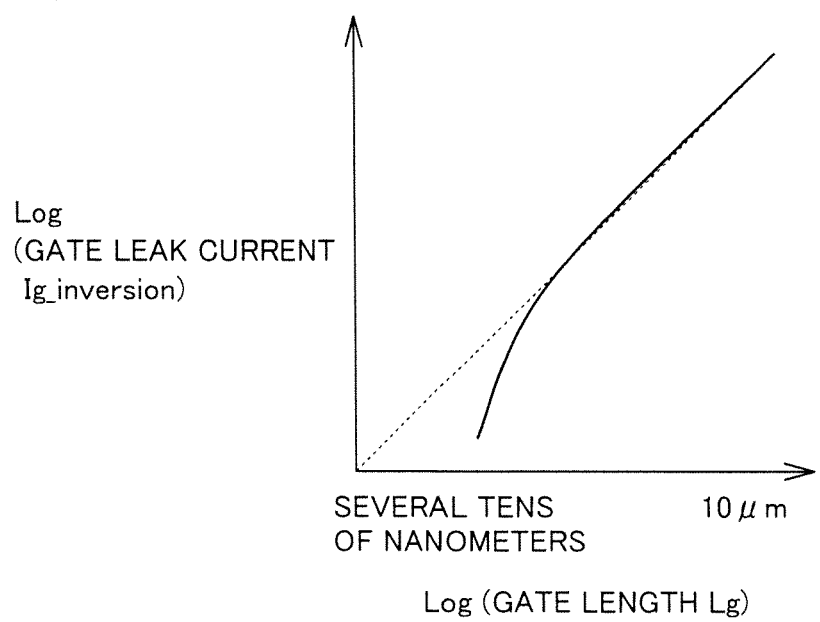
FIG. 27 is a graph showing a relationship between gate leak current and gate length in the first embodiment.

FIG. 27 shows a graph showing linearity of a gate leak current. This graph shows a relationship between gate leak current and gate length, and when the linearity is ensured, the graph (solid line) follows a dotted line (straight line). In the case where the silicon oxide film is formed on the gate electrode portion formed of the High-k film and the metal film with vapor phase growth at a relatively high temperature, there is a tendency that the gate leak current decreases as the gate length shortens as shown in the graph, and the linearity cannot be maintained. This decrease in the gate leak current is considered to be due to an increase in the film thickness of the gate insulating film when the silicon oxide film is formed with vapor phase growth at a high temperature.

The inventors have confirmed that the gate leak current can be reduced in the semiconductor device of the present invention by forming first protective films 16a and 16b including silicon nitride films 15a and 15b to cover gate electrode portions 11a and 11b. One possible reason for this is that the silicon nitride film has an effect of canceling out fixed charge in the gate insulating film (the inter layer, the High-k film). In addition, another possible reason is that formation of the silicon nitride film leads to suppression of the increase in the film thickness of the gate insulating film.

Furthermore, in the above-mentioned semiconductor device, gate electrode portions 11a and 11b are formed in n(p)MOS region R1, R2, and then, exposure to the atmosphere of oxygen plasma is performed when the resist pattern used for patterning of gate electrode portions 11a and 11b is removed, and thereby oxide layers 13a and 13b are formed on the surfaces of gate electrode portions 11a and 11b. As a result, direct exposure of polysilicon films 9a and 9b, metal films 7a and 7b and the like of gate electrode portions 11a and 11b to the chemical solution, permeation of the chemical solution through polysilicon films 9a and 9b, metal films 7a and 7b and the like, and in particular, elution of metal films 7a and 7b by cleaning of the semiconductor substrate after removal of the resist pattern with the chemical solution can be inhibited.

In addition, in the above-mentioned semiconductor device, the portion of first protective film 16a located on the side surface of gate electrode portion 11a serves as offset spacer 21a in nMOS region R1, and the portions of first protective film 16b and second protective film 20b located on the side surface of gate electrode portion 11b serve as offset spacer 21b in pMOS region R2.

As a result, the thickness of offset spacer 21a (the number of stacked layers) in nMOS region R1 can be made different from that of offset spacer 21b in pMOS region R2, and thus, the extention implantation region and the like having a desired impurity profile corresponding to the properties of each of the n channel type MOS transistor and the p channel type MOS transistor can be accurately formed.

In addition, when silicon oxide film 17 and silicon nitride film 19 are stacked on first protective films 16a and 16b, and second protective films 20a and 20b are formed by etching silicon nitride film 19, a signal of silicon oxide film 17 can be detected at the time of exposure of silicon oxide film 17. As a result, overetching can be suppressed.

Since overetching of the silicon nitride film is suppressed, silicon nitride films 15a and 15b of first protective films 16a and 16b can be left on the surface of semiconductor substrate 1. As a result, damage to the surface of semiconductor substrate 1 caused by ion implantation when extention implantation region 23b is formed in pMOS region R2 can be suppressed.

Similarly, damage to the surface of semiconductor substrate 1 caused by ion implantation when extention implantation region 23a is formed in nMOS region R1 can also be suppressed because first protective film 16a is formed on the surface of semiconductor substrate 1.

As described above, since first protective films 16a and 16b are left on the surface of semiconductor substrate 1, first protective films 16a and 16b each includes a portion (portion A) formed along the side surface of each of gate electrode portions 11a and 11b, and a portion (portion B) extending from a lower end thereof along the surface of the semiconductor substrate in the direction away from each of gate electrode portions 11a and 11b. In addition, second protective films 20a and 20b are each formed on portion A of each of first protective films 16a and 16b to have a predetermined film thickness.

In addition, in nMOS region R1, the impurity ions in a pair of extention implantation regions 23a implanted using first protective film 16a as offset spacer 21a diffuse thermally by heat treatment. As a result, in the finished semiconductor device, each of the pair of extention regions 25a is formed to extend in the direction away from gate electrode portion 11a, defining, as the end (first end), the position spaced from the position of semiconductor substrate 1 toward the gate electrode portion 11a side by the predetermined distance based on the thermal diffusion length, the position of semiconductor substrate 1 being located immediately under the surface of first protective film 16a on the side surface of gate electrode portion 11a.

On the other hand, in pMOS region R2, the impurity ions in a pair of extention implantation regions 23b implanted using first protective film 16b and second protective film 20b as offset spacer 21b diffuse thermally by heat treatment. As a result, in the finished semiconductor device, each of the pair of extention regions 25b is formed to extend in the direction away from gate electrode portion 11b, defining, as the end (second end), the position spaced from the position of semiconductor substrate 1 toward the gate electrode portion 11b side by the predetermined distance based on the thermal diffusion length, the position of semiconductor substrate 1 being located immediately under the surface of second protective film 20b on the side surface of gate electrode portion 11b.

Furthermore, in nMOS region R1, the impurity ions in a pair of source/drain implantation regions 33a implanted using sidewall spacer 31a as the mask diffuse thermally by heat treatment. As a result, in the finished semiconductor device, each of the pair of source/drain regions 35a is formed to extend in the direction away from gate electrode portion 11a, defining, as the end (third end), the position spaced from the position (position A) of semiconductor substrate 1 toward the gate electrode portion 11a side by the predetermined distance based on the thermal diffusion length, the position (position A) being located immediately under the surface of sidewall spacer 31a on the side surface of gate electrode portion 11a. This third end is located between position A and the first end.

On the other hand, in pMOS region R2, the impurity ions in a pair of source/drain implantation regions 33b implanted using sidewall spacer 31b as the mask diffuse thermally by heat treatment. As a result, in the finished semiconductor device, each of the pair of source/drain regions 35b is formed to extend in the direction away from gate electrode portion 11b, defining, as the end (fourth end), the position spaced from the position (position B) of semiconductor substrate 1 toward the gate electrode portion 11b side by the predetermined distance based on the thermal diffusion length, the position (position B) being located immediately under the surface of sidewall spacer 31b on the side surface of gate electrode portion 11b. This fourth end is located between position B and the second end.

In addition, in the finished semiconductor device, first protective films 16a and 16b having silicon nitride films 15a and 15b formed on the surfaces thereof as well as second protective films 20a and 20b configured by stacking silicon oxide films 17a and 17b and silicon nitride films 19a and 19b are formed on the side surfaces of gate electrode portions 11a and 11b. Therefore, the side surfaces of gate electrode portions 11a and 11b are protected by stacked films configured by stacking silicon nitride films 15a and 15b, silicon oxide films 17a and 17b, and silicon nitride films 19a and 19b.

(Second Embodiment)

A description will now be given to a semiconductor device including an MOS transistor in which a protective film including a silicon nitride film is formed on a side surface of a gate electrode portion as a protective film serving as an offset spacer.

Figure 28:
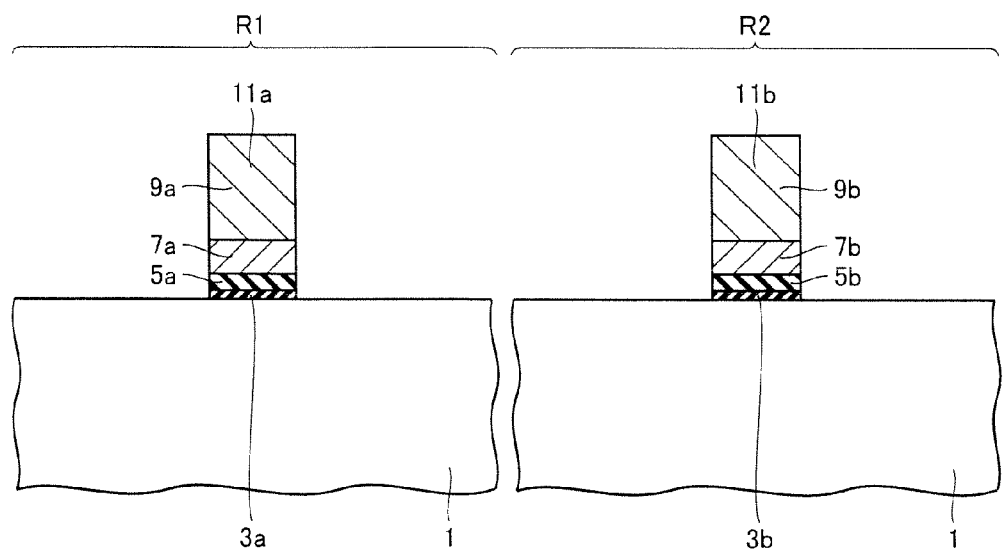
FIG. 28 is a cross-sectional view showing one step of a method for manufacturing a semiconductor device according to a second embodiment of the present invention.

As shown in FIG. 28, in nMOS region R1 of semiconductor substrate 1, gate electrode portion 11a of the n channel-type MOS transistor is formed by stacking High-k film 5a having a predetermined dielectric constant as well as metal film 7a and polysilicon film 9a having predetermined work functions on inter layer 3a. On the other hand, in pMOS region R2 of semiconductor substrate 1, gate electrode portion 11b of the p channel-type MOS transistor is formed by stacking High-k film 5b having a predetermined dielectric constant as well as metal film 7b and polysilicon film 9b having predetermined work functions on inter layer 3b.

Figure 29:
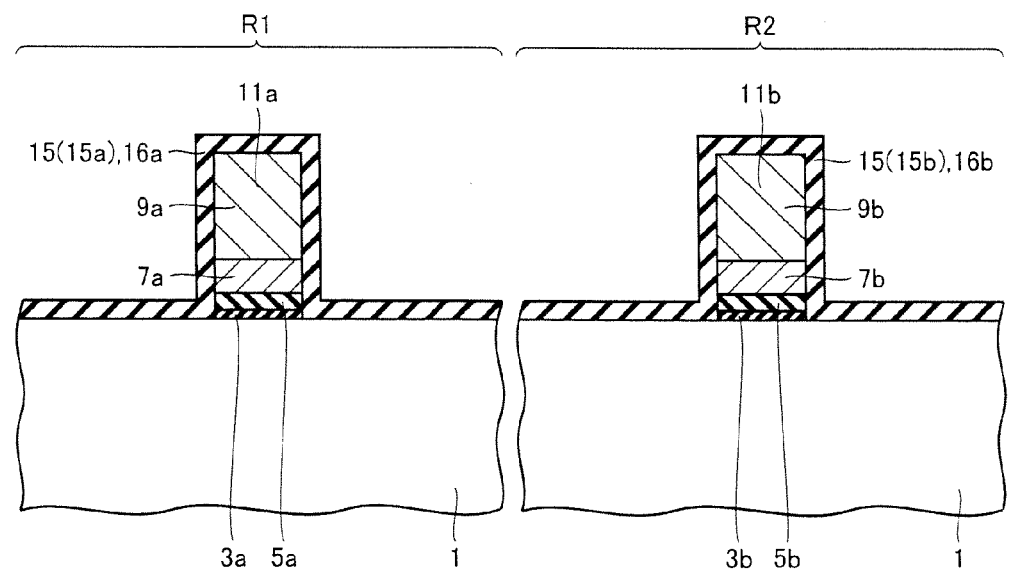
FIG. 29 is a cross-sectional view showing a step performed after the step shown in FIG. 28 in the second embodiment.

Next, as shown in FIG. 29, silicon nitride film 15 having a film thickness of approximately several nanometers is formed on semiconductor substrate 1 to cover the side surfaces of gate electrode portions 11a and 11b. Thus, silicon nitride film 15 (15a) forms first protective film 16a protecting gate electrode portion 11a in nMOS region R1, and silicon nitride film 15 (15b) forms first protective film 16b protecting gate electrode portion 11b in pMOS region R2.

Figure 30:
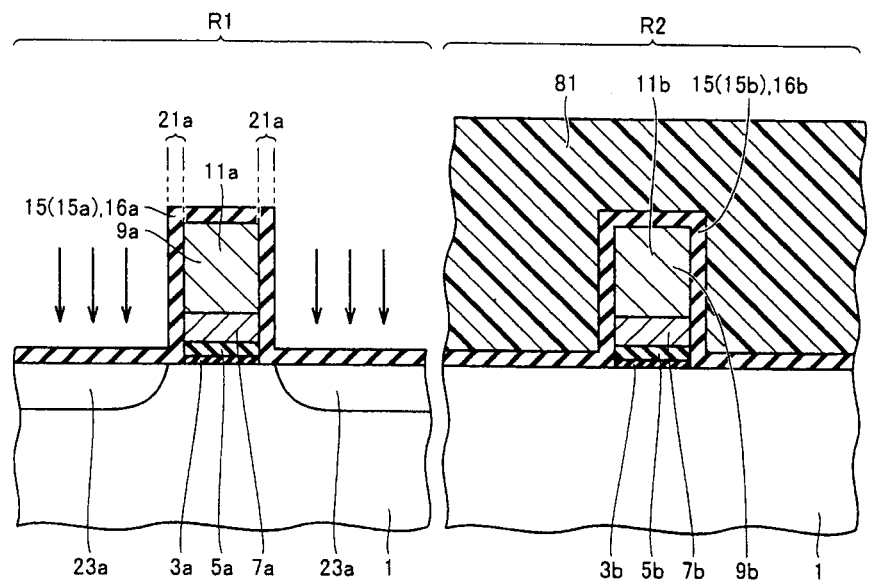
FIG. 30 is a cross-sectional view showing a step performed after the step shown in FIG. 29 in the second embodiment.

Next, as shown in FIG. 30, resist pattern 81 is formed to expose nMOS region R1 and cover pMOS region R2. In nMOS region R1, a portion of first protective film 16a located on the side surface of gate electrode portion 11a, of first protective film 16a, that is, a portion of silicon nitride film 15a serves as offset spacer 21a.

Next, using offset spacer 21a and gate electrode portion 11a as the mask, the n-type impurity ions such as, for example, arsenic (As) or phosphorus (P) are implanted (arrows), and thereby n-type extention implantation region 23a is formed to a predetermined depth from the surface of semiconductor substrate 1. In addition, the p-type impurity ions such as indium (In), boron fluoride (BF$_2$) or boron (B) are implanted obliquely, and thereby the p-type halo implantation region (not shown) is formed.

Figure 31:
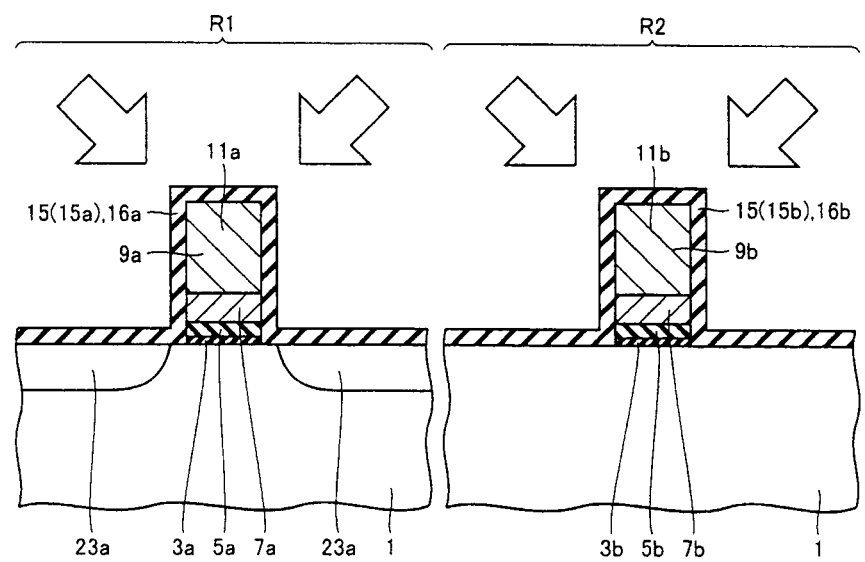
FIG. 31 is a cross-sectional view showing a step performed after the step shown in FIG. 30 in the second embodiment.

Next, ashing treatment is performed in the atmosphere of oxygen plasma to remove resist pattern 81. Next, as shown in FIG. 31, semiconductor substrate 1 after removal of resist pattern 81 is cleaned with the ammonia-based chemical solution and the like. At this time, first protective film 16a is exposed to the chemical solution in nMOS region R1, and first protective film 16b is exposed to the chemical solution in pMOS region R2 (see arrows).

Figure 32:
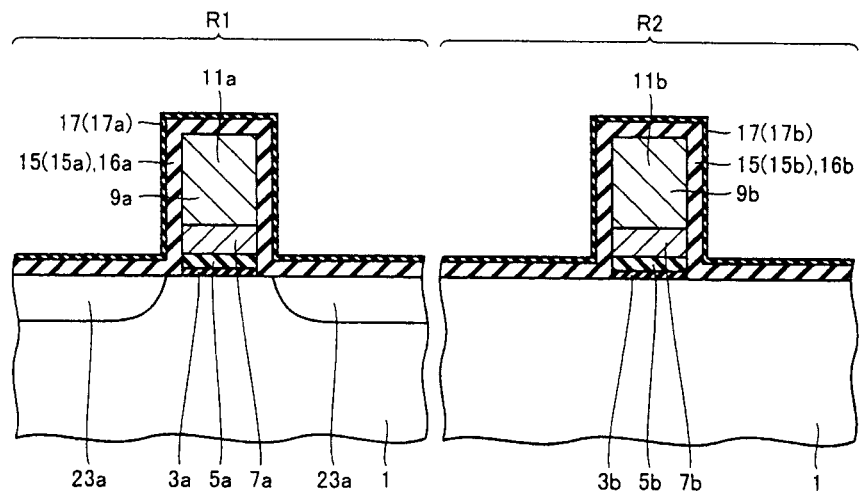
FIG. 32 is a cross-sectional view showing a step performed after the step shown in FIG. 31 in the second embodiment.
Figure 33:
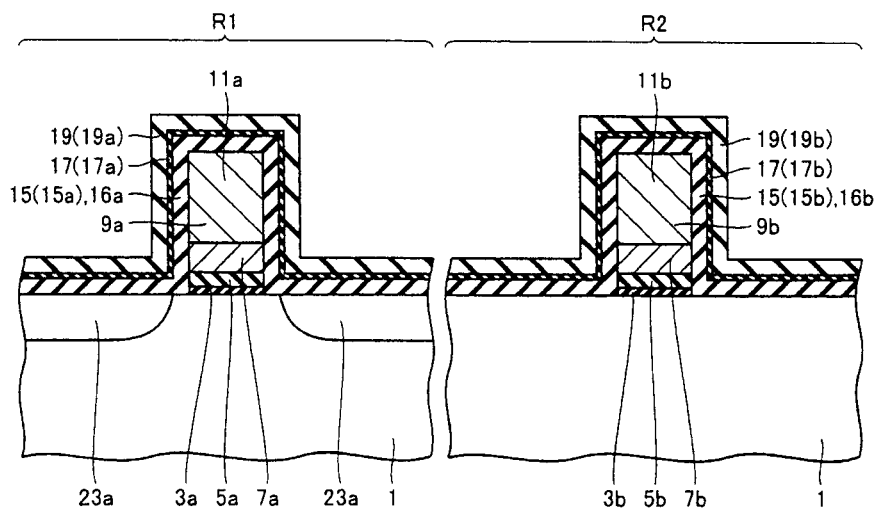
FIG. 33 is a cross-sectional view showing a step performed after the step shown in FIG. 32 in the second embodiment.
Figure 34:
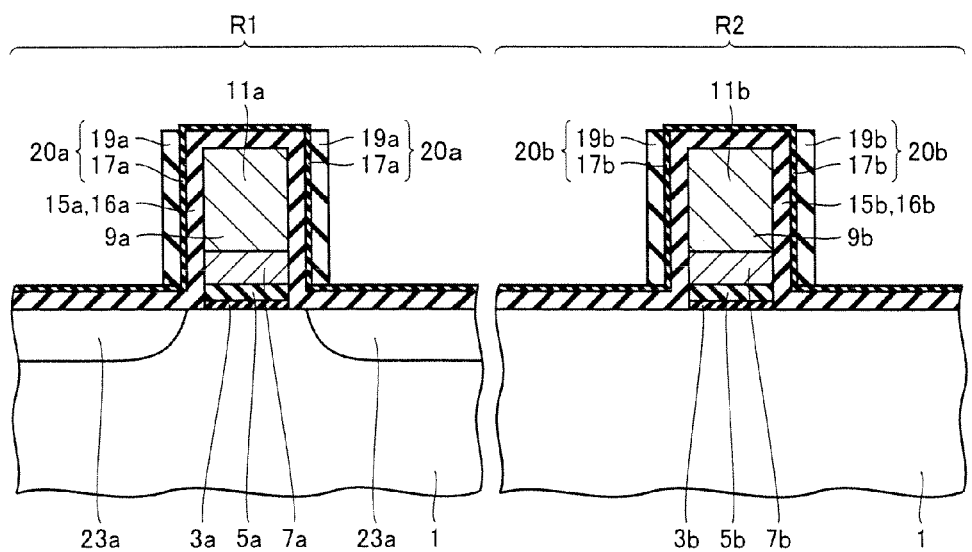
FIG. 34 is a cross-sectional view showing a step performed after the step shown in FIG. 33 in the second embodiment.

Next, as shown in FIG. 32, the surfaces of silicon nitride films 15a and 15b are oxidized in the atmosphere of oxygen plasma, and thereby silicon oxide film 17 having a film thickness of approximately 1 to 2 nm is formed. Next, as shown in FIG. 33, silicon nitride film 19 is formed on semiconductor substrate 1 to cover silicon oxide film 17. Next, as shown in FIG. 34, by anisotropically etching silicon nitride film 19 using silicon oxide film 17 as an etching stopper film, silicon nitride film 19 located on the side surfaces of gate electrode portions 11a and 11b is left and silicon nitride film 19 located on the other portions is removed.

Thus, silicon oxide film 17a and silicon nitride film 19a form second protective film 20a further covering first protective film 16a in nMOS region R1, and silicon oxide film 17b and silicon nitride film 19b form second protective film 20b further covering first protective film 16b in pMOS region R2.

Figure 35:
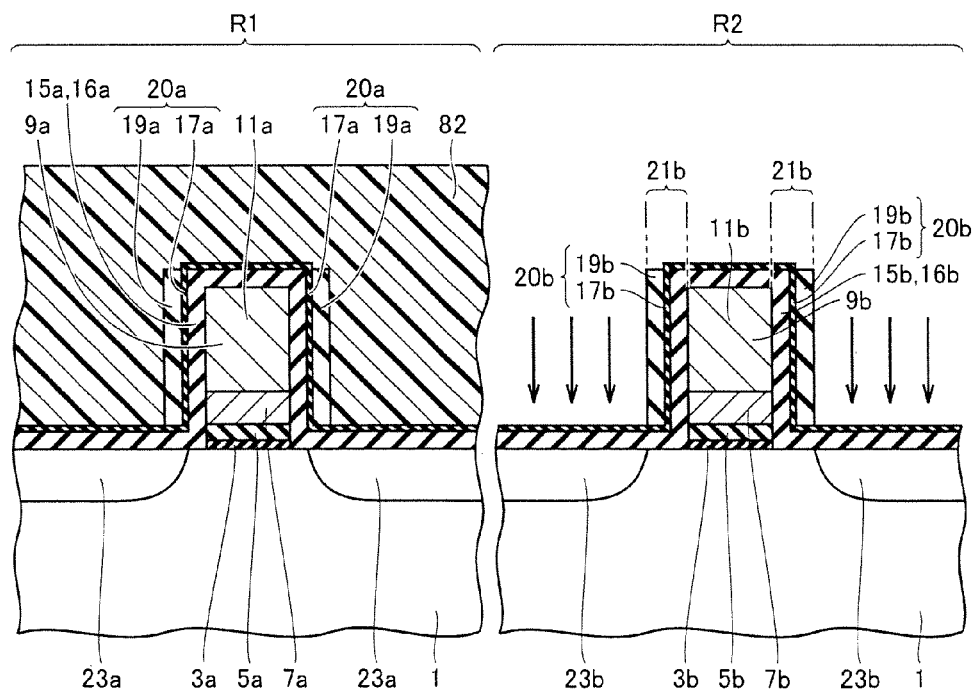
FIG. 35 is a cross-sectional view showing a step performed after the step shown in FIG. 34 in the second embodiment.

Next, as shown in FIG. 35, resist pattern 82 is formed to cover nMOS region R1 and expose pMOS region R2. In pMOS region R2, a portion of first protective film 16b and a portion of second protective film 20b located on the side surface of gate electrode portion 11b, of first protective film 16b and second protective film 20b, that is, portions of silicon nitride film 15b, silicon oxide film 17b and silicon nitride film 19b serve as offset spacer 21b.

Next, using offset spacer 21b and gate electrode portion 11b as the mask, the p-type impurity ions such as, for example, boron fluoride (BF$_2$), boron (B) or indium (In) are implanted (arrows), and thereby p-type extention implantation region 23b is formed to a predetermined depth from the surface of semiconductor substrate 1. In addition, the n-type impurity ions such as arsenic (As) or phosphorus (P) are implanted, and thereby the n-type halo implantation region (not shown) is formed.

Figure 36:
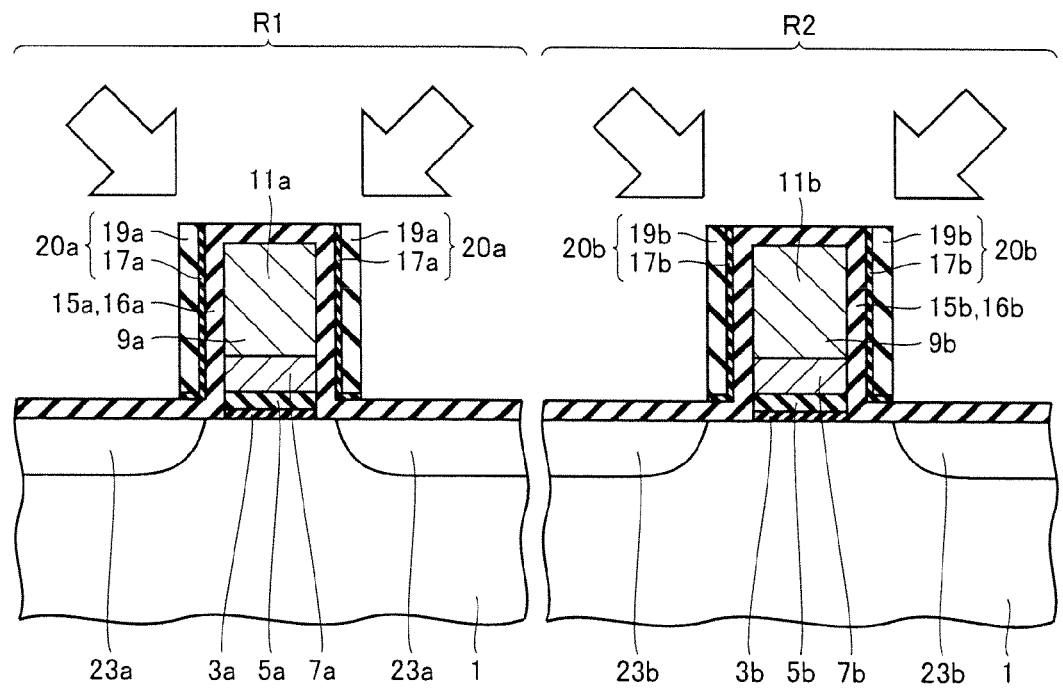
FIG. 36 is a cross-sectional view showing a step performed after the step shown in FIG. 35 in the second embodiment.

Next, ashing treatment is performed in the atmosphere of oxygen plasma to remove resist pattern 82. Next, as shown in FIG. 36, semiconductor substrate 1 after removal of resist pattern 82 is cleaned with the ammonia-based chemical solution and the like. At this time, first protective film 16a and second protective film 20a are exposed to the chemical solution in nMOS region R1, and first protective film 16b and second protective film 20b are exposed to the chemical solution in pMOS region R2 (see arrows).

Figure 37:
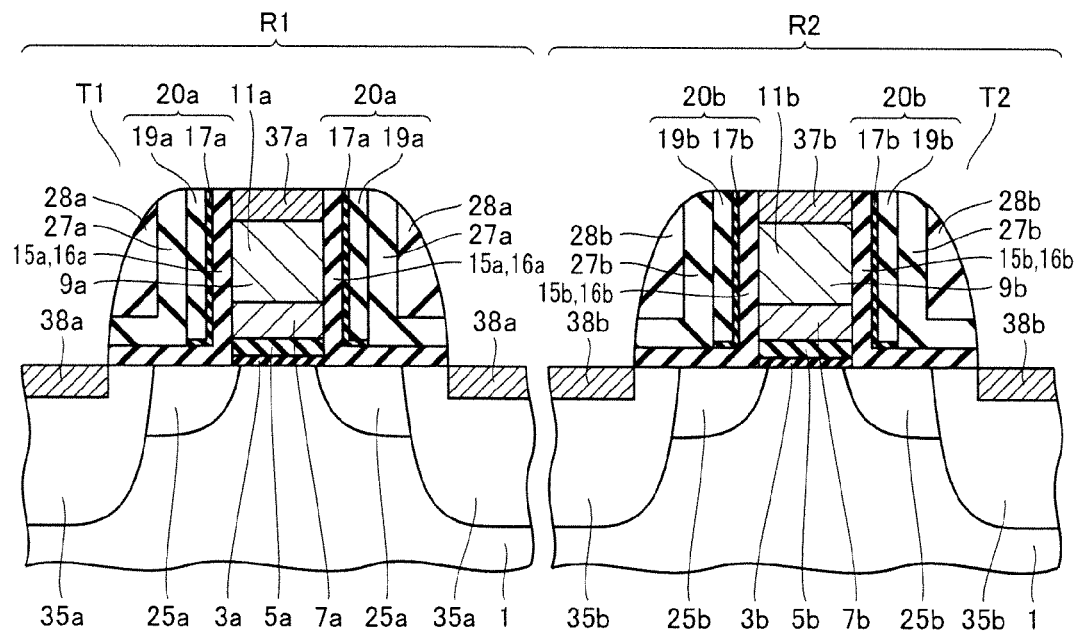
FIG. 37 is a cross-sectional view showing a step performed after the step shown in FIG. 36 in the second embodiment.

Thereafter, through the steps similar to those shown in FIGS. 15 to 19 as described above, the halo region (not shown), extention region 25a, source/drain region 35a and the like are formed and the main portions of n channel-type MOS transistor T1 are formed in nMOS region R1 as shown in FIG. 37. On the other hand, the halo region (not shown), extention region 25b, source/drain region 35b and the like are formed and the main portions of p channel-type MOS transistor T2 are formed in pMOS region R2.

In the above-mentioned semiconductor device, in nMOS region R1, extention implantation region 23a is first formed by causing the portion of first protective film 16a located on the side surface of gate electrode portion 11a to function as offset spacer 21a. Thereafter, cleaning (cleaning A) of semiconductor substrate 1 is done with the ammonia-based chemical solution and the like. Furthermore, in pMOS region R2, extention implantation region 23b is formed by causing the portion of first protective film 16b and the portion of second protective film 20b located on the side surface of gate electrode portion 11b to function as offset spacer 21b. Thereafter, cleaning (cleaning B) of semiconductor substrate 1 is done with the ammonia-based chemical solution and the like.

In the above-mentioned semiconductor device, silicon nitride films 15a and 15b having high resistance to the chemical solution are formed as first protective films 16a and 16b directly exposed to the chemical solution in cleaning A. Therefore, thinning of first protective films 16a and 16b can be inhibited. In addition, loss of metal films 7a and 7b of gate electrode portions 11a and 11b due to permeation of the chemical solution can be prevented.

In addition, silicon nitride films 19a and 19b having high resistance to the chemical solution are also formed on the surfaces of second protective films 20a and 20b directly exposed to the chemical solution in cleaning B. Therefore, thinning of second protective films 20a and 20b can be inhibited. In addition, together with first protective films 16a and 16b, permeation of the chemical solution toward gate electrode portions 11a and 11b can be inhibited.

Furthermore, since thinning of first protective films 16a and 16b is inhibited, a desired thickness of offset spacer 21b formed of first protective film 16b and second protective film 20b can be ensured and extention implantation region 23b having a desired impurity profile can be formed using offset spacer 21b as the mask in pMOS region R2.

In addition, as described above, by applying silicon nitride films 15a and 15b and silicon oxide films 17a and 17b as first protective films 16a and 16b and second protective films 20a and 20b functioning as offset spacers 21a and 21b, gate leak can be reduced.

In addition, damage to the surface of semiconductor substrate 1 caused by ion implantation when extention implantation region 23a is formed in nMOS region R1 can be suppressed because first protective film 16a is formed on the surface of semiconductor substrate 1.

Furthermore, since overetching of the silicon nitride film is suppressed when second protective films 20a and 20b are formed, silicon nitride films 15a and 15b of first protective films 16a and 16b are left on the surface of semiconductor substrate 1. As a result, damage to the surface of semiconductor substrate 1 caused by ion implantation when extention implantation region 23b is formed in pMOS region R2 can also be suppressed.

As described above, since first protective films 16a and 16b are left on the surface of semiconductor substrate 1, first protective films 16a and 16b each includes a portion (portion A) formed along the side surface of each of gate electrode portions 11a and 11b, and a portion (portion B) extending from a lower end thereof along the surface of the semiconductor substrate in the direction away from each of gate electrode portions 11a and 11b, similarly to the above-mentioned semiconductor device. In addition, second protective films 20a and 20b are each formed on portion A of each of first protective films 16a and 16b to have a predetermined film thickness.

As a result of thermal diffusion of the impurity by heat treatment, in nMOS region R1, each of the pair of extention regions 25a is formed to extend in the direction away from gate electrode portion 11a, defining, as the end (first end), the position spaced from the position of semiconductor substrate 1 toward the gate electrode portion 11a side by the predetermined distance based on the thermal diffusion length, the position of semiconductor substrate 1 being located immediately under the surface of first protective film 16a on the side surface of gate electrode portion 11a.

On the other hand, in pMOS region R2, each of the pair of extention regions 25b is formed to extend in the direction away from gate electrode portion 11b, defining, as the end (second end), the position spaced from the position of semiconductor substrate 1 toward the gate electrode portion 11b side by the predetermined distance based on the thermal diffusion length, the position of semiconductor substrate 1 being located immediately under the surface of second protective film 20b on the side surface of gate electrode portion 11b.

Furthermore, in nMOS region R1, each of the pair of source/drain regions 35a is formed to extend in the direction away from gate electrode portion 11a, defining, as the end (third end), the position spaced from the position (position A) of semiconductor substrate 1 toward the gate electrode portion 11a side by the predetermined distance based on the thermal diffusion length, the position (position A) being located immediately under the surface of sidewall spacer 31a on the side surface of gate electrode portion 11a. This third end is located between position A and the first end.

On the other hand, in pMOS region R2, each of the pair of source/drain regions 35b is formed to extend in the direction away from gate electrode portion 11b, defining, as the end (fourth end), the position spaced from the position (position B) of semiconductor substrate 1 toward the gate electrode portion 11b side by the predetermined distance based on the thermal diffusion length, the position (position B) being located immediately under the surface of sidewall spacer 31b on the side surface of gate electrode portion 11b. This fourth end is located between position B and the second end.

(Third Embodiment)

A description will now be given to a semiconductor device including another MOS transistor in which a protective film including a silicon nitride film is formed on a side surface of a gate electrode portion as a protective film serving as an offset spacer.

Figure 38:
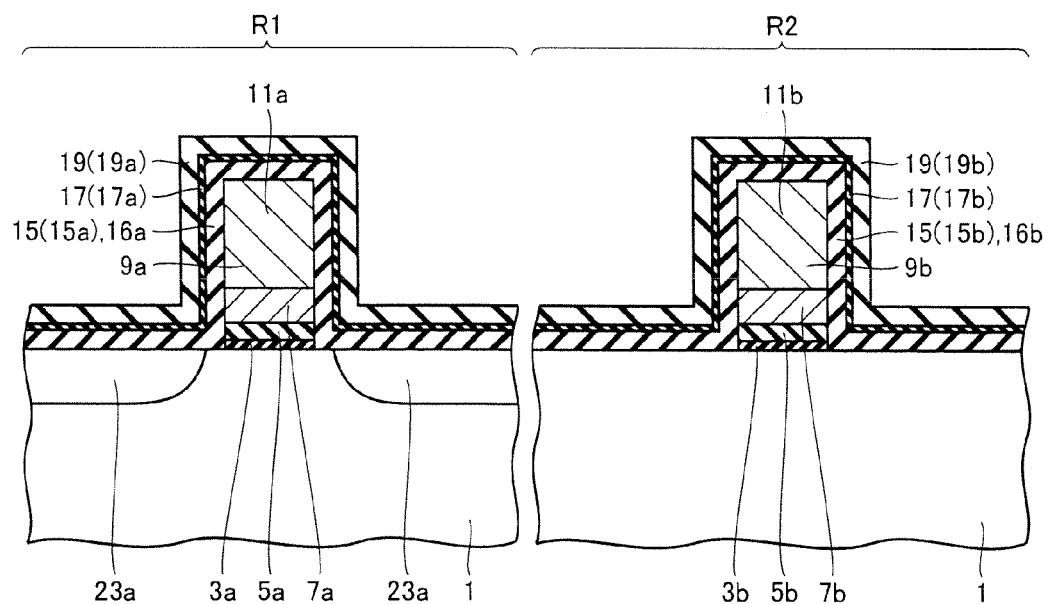
FIG. 38 is a cross-sectional view showing one step of a method for manufacturing a semiconductor device according to a third embodiment of the present invention.

First, through the steps similar to those shown in FIGS. 28 to 33, first protective films 16a and 16b formed of silicon nitride films 15a and 15b are formed to cover the side surfaces of gate electrode portions 11a and 11b, and then, extention implantation region 23a is formed as shown in FIG. 38. Furthermore, silicon oxide films 17a and 17b and silicon nitride films 19a and 19b are formed on first protective films 16a and 16b.

Figure 39:
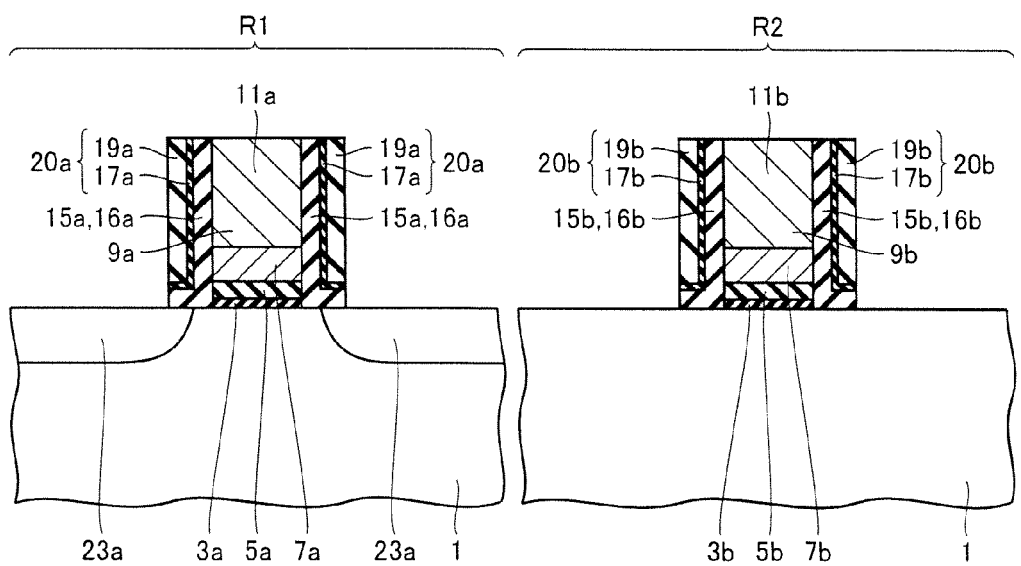
FIG. 39 is a cross-sectional view showing a step performed after the step shown in FIG. 38 in the third embodiment.

Next, as shown in FIG. 39, by anisotropically etching silicon nitride film 19, silicon oxide film 17 and silicon nitride film 15, portions of silicon nitride film 19 and the like located on the side surfaces of gate electrode portions 11a and 11b are left, and portions of silicon nitride film 19, silicon oxide film 17 and silicon nitride film 15 located on the surface of semiconductor substrate 1 are removed. As a result, the surface of semiconductor substrate 1 is exposed.

Thus, silicon oxide film 17 (17a) and silicon nitride film 19a form second protective film 20a further covering first protective film 16a in nMOS region R1, and silicon oxide film 17 (17b) and silicon nitride film 19b form second protective film 20b further covering first protective film 16b in pMOS region R2.

Figure 40:
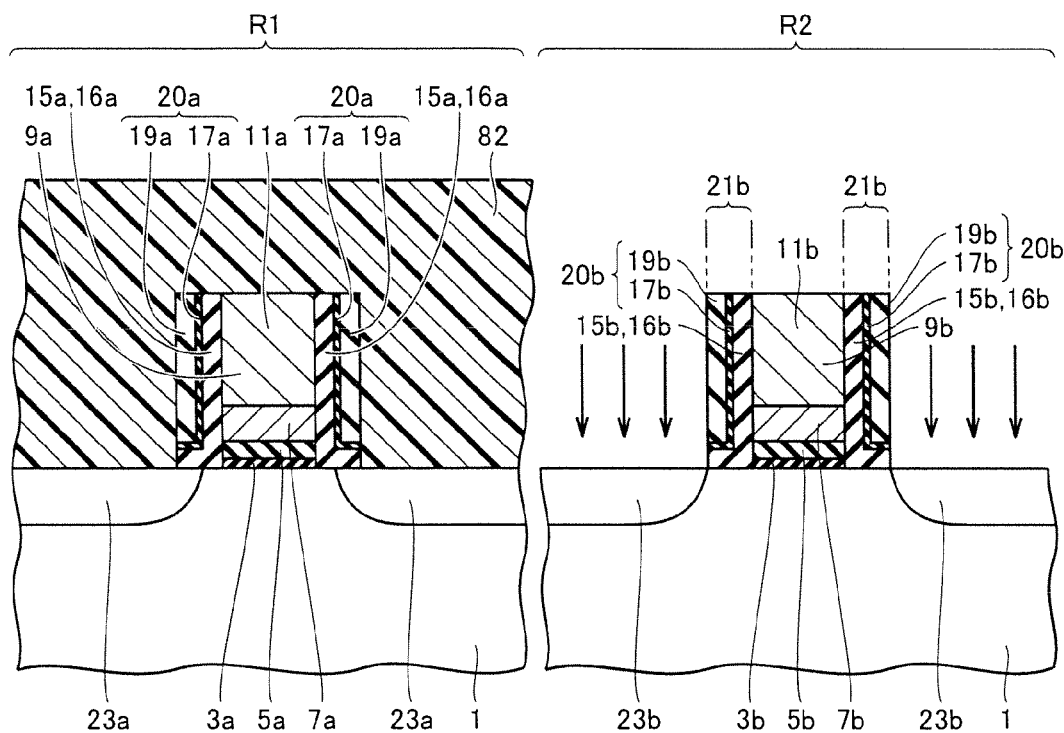
FIG. 40 is a cross-sectional view showing a step performed after the step shown in FIG. 39 in the third embodiment.

Next, as shown in FIG. 40, resist pattern 82 is formed to cover nMOS region R1 and expose pMOS region R2. In pMOS region R2, first protective film 16b and second protective film 20b located on the side surface of gate electrode portion 11b, that is, silicon nitride film 15b, silicon oxide film 17b and silicon nitride film 19b serve as offset spacer 21b.

Next, using offset spacer 21b and gate electrode portion 11b as the mask, the p-type impurity ions such as, for example, boron fluoride ($BF_2$), boron (B) or indium (In) are implanted (arrows), and thereby p-type extention implantation region 23b is formed to a predetermined depth from the surface of semiconductor substrate 1. In addition, the n-type impurity ions such as arsenic (As) or phosphorus (P) are implanted, and thereby the n-type halo implantation region (not shown) is formed.

Figure 41:
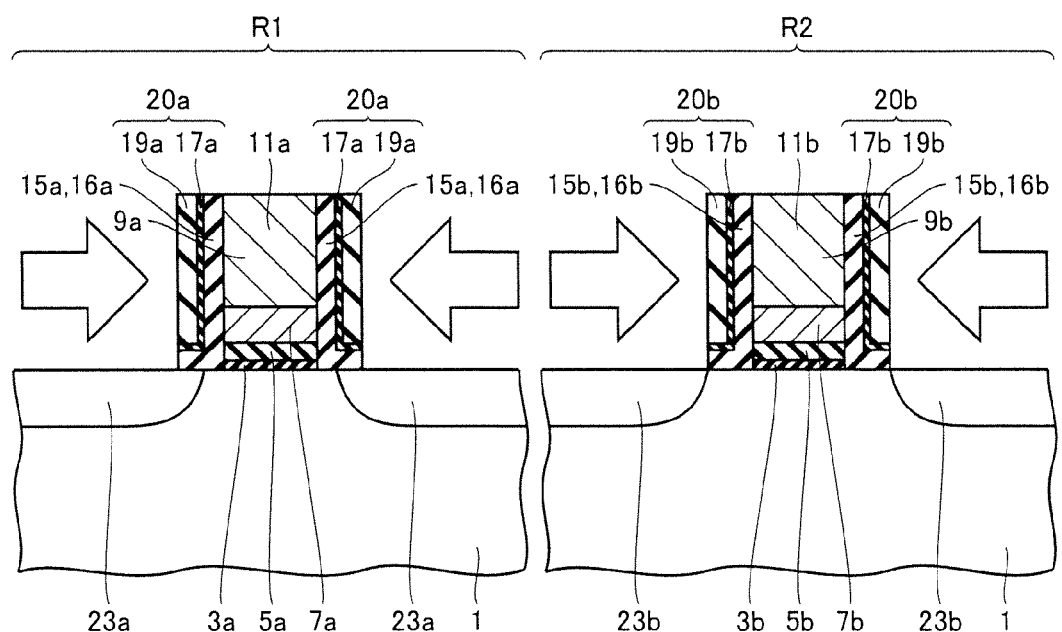
FIG. 41 is a cross-sectional view showing a step performed after the step shown in FIG. 40 in the third embodiment.

Next, ashing treatment is performed in the atmosphere of oxygen plasma to remove resist pattern 82. Next, as shown in FIG. 41, semiconductor substrate 1 after removal of resist pattern 82 is cleaned with the ammonia-based chemical solution and the like. At this time, first protective film 16a and second protective film 20a are exposed to the chemical solution in nMOS region R1, and first protective film 16b and second protective film 20b are exposed to the chemical solution in pMOS region R2 (see arrows).

Figure 42:
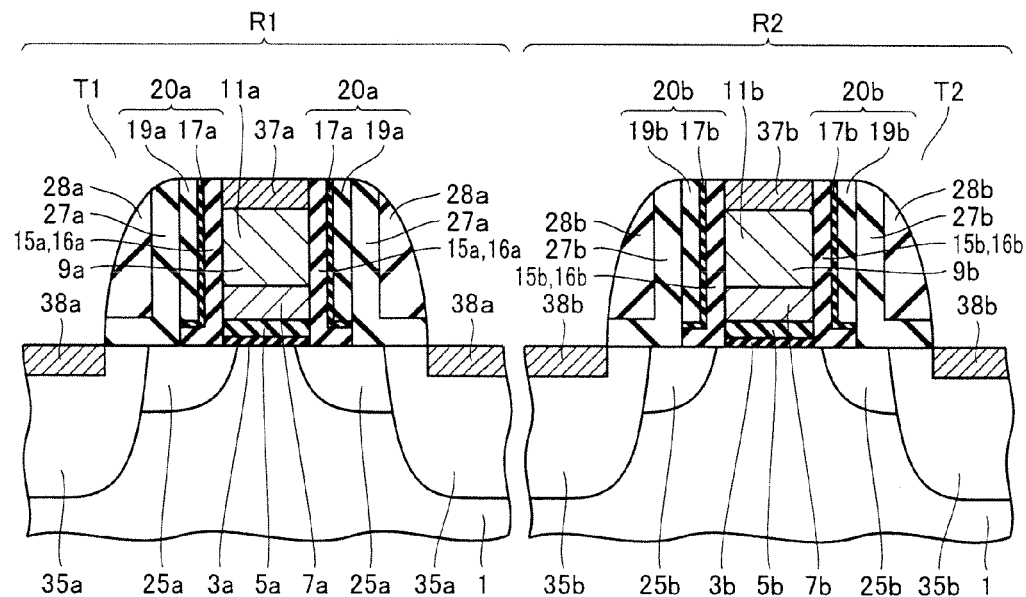
FIG. 42 is a cross-sectional view showing a step performed after the step shown in FIG. 41 in the third embodiment.

Thereafter, through the steps similar to those shown in FIGS. 15 to 19 as described above, the halo region (not shown), extention region 25a, source/drain region 35a and the like are formed and the main portions of n channel-type MOS transistor T1 are formed in nMOS region R1 as shown in FIG. 42. On the other hand, the halo region (not shown), extention region 25b, source/drain region 35b and the like are formed and the main portions of p channel-type MOS transistor T2 are formed in pMOS region R2.

In the above-mentioned semiconductor device, when extention implantation region 23b is formed in pMOS region R2, the surface of semiconductor substrate 1 is exposed. Therefore, a region having a higher impurity concentration can be formed in a portion near the surface of semiconductor substrate 1 as extention implantation region 23b.

As described above, since first protective films 16a and 16b are not substantially left on the surface of semiconductor substrate 1, the portion (portion B) of each of first protective films 16a and 16b extending in the direction away from each of gate electrode portions 11a and 11b along the surface of the semiconductor substrate from the lower end of the portion (portion A) formed along the side surface of each of gate electrode portions 11a and 11b extends by only an amount corresponding to the thickness of each of second protective films 20a and 20b.

In addition, in the above-mentioned semiconductor device, the portion of first protective film 16a located on the side surface of gate electrode portion 11a serves as offset spacer 21a in nMOS region R1, and first protective film 16b and second protective film 20b located on the side surface of gate electrode portion 11b serve as offset spacer 21b in pMOS region R2.

As a result, the thickness of offset spacer 21a (the number of stacked layers) in nMOS region R1 can be made different from that of offset spacer 21b in pMOS region R2, and thus, the extention region and the like having a desired impurity profile corresponding to the properties of each of the n channel type MOS transistor and the p channel type MOS transistor can be accurately formed.

In addition, in nMOS region R1, extention implantation region 23a is formed by causing the portion of first protective film 16a located on the side surface of gate electrode portion 11a to function as offset spacer 21a. Thereafter, cleaning (cleaning A) of semiconductor substrate 1 is done with the ammonia-based chemical solution and the like. Furthermore, in pMOS region R2, extention implantation region 23b is formed by causing first protective film 16b and second protective film 20b located on the side surface of gate electrode portion 11b to function as offset spacer 21b. Thereafter, cleaning (cleaning B) of semiconductor substrate 1 is done with the ammonia-based chemical solution and the like.

In the above-mentioned semiconductor device, silicon nitride films 15a and 15b having high resistance to the chemical solution are formed as first protective films 16a and 16b directly exposed to the chemical solution in cleaning A. Therefore, thinning of first protective films 16a and 16b can be inhibited. In addition, loss of metal films 7a and 7b of gate electrode portions 11a and 11b due to permeation of the chemical solution can be prevented.

In addition, in cleaning B, permeation of the chemical solution from the side through gate electrode portions 11a and 11b can at least be inhibited because second protective films 20a and 20b including silicon nitride films 19a and 19b having high resistance to the chemical solution on the surfaces thereof are formed to cover the side surfaces of gate electrode portions 11a and 11b.

Furthermore, since thinning of first protective films 16a and 16b is inhibited, a desired thickness of offset spacer 21b formed of first protective film 16b and second protective film 20b can be ensured and extention implantation region 23b having a desired impurity profile can be formed using offset spacer 21b as the mask in pMOS region R2.

In addition, as described above, by applying silicon nitride films 15a and 15b and silicon oxide films 17a and 17b as first protective films 16a and 16b and second protective films 20a and 20b functioning as offset spacers 21a and 21b, gate leak can be reduced.

As a result of thermal diffusion of the impurity by heat treatment, in nMOS region R1, each of the pair of extention regions 25a is formed to extend in the direction away from gate electrode portion 11a, defining, as the end (first end), the position spaced from the position of semiconductor substrate 1 toward the gate electrode portion 11a side by the predetermined distance based on the thermal diffusion length, the position of semiconductor substrate 1 being located immediately under the surface of first protective film 16a on the side surface of gate electrode portion 11a.

On the other hand, in pMOS region R2, each of the pair of extention regions 25b is formed to extend in the direction away from gate electrode portion 11b, defining, as the end (second end), the position spaced from the position of semiconductor substrate 1 toward the gate electrode portion 11b side by the predetermined distance based on the thermal diffusion length, the position of semiconductor substrate 1 being located immediately under the surface of second protective film 20b on the side surface of gate electrode portion 11b.

Furthermore, in nMOS region R1, each of the pair of source/drain regions 35a is formed to extend in the direction away from gate electrode portion 11a, defining, as the end (third end), the position spaced from the position (position A) of semiconductor substrate 1 toward the gate electrode portion 11a side by the predetermined distance based on the thermal diffusion length, the position (position A) being located immediately under the surface of sidewall spacer 31a on the side surface of gate electrode portion 11a. This third end is located between position A and the first end.

On the other hand, in pMOS region R2, each of the pair of source/drain regions 35b is formed to extend in the direction away from gate electrode portion 11b, defining, as the end (fourth end), the position spaced from the position (position B) of semiconductor substrate 1 toward the gate electrode portion 11b side by the predetermined distance based on the thermal diffusion length, the position (position B) being located immediately under the surface of sidewall spacer 31b on the side surface of gate electrode portion 11b. This fourth end is located between position B and the second end.

(Fourth Embodiment)

A description will now be given to a semiconductor device including still another MOS transistor in which a protective film including a silicon nitride film is formed on a side surface of a gate electrode portion as a protective film serving as an offset spacer.

Figure 43:
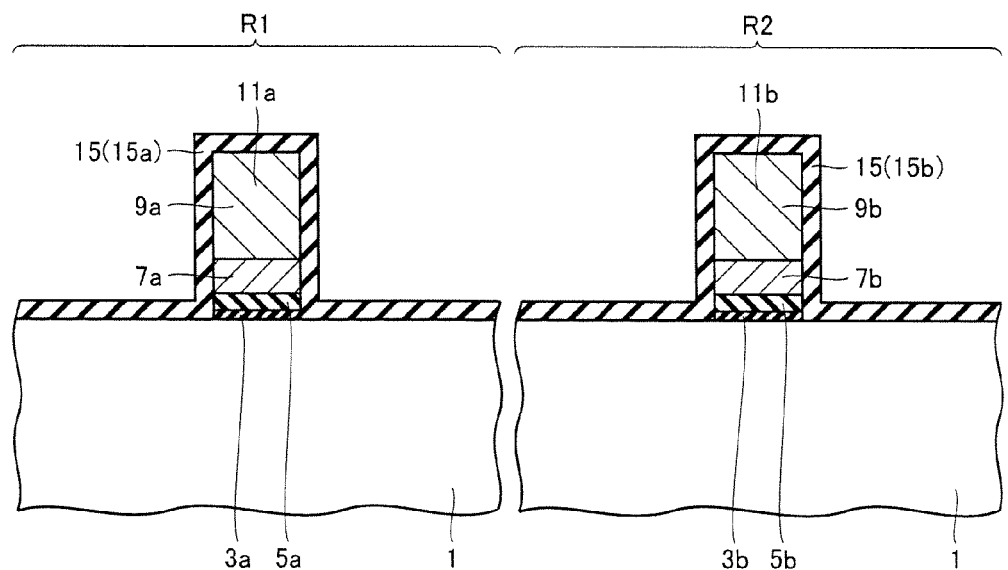
FIG. 43 is a cross-sectional view showing one step of a method for manufacturing a semiconductor device according to a fourth embodiment of the present invention.

First, as shown in FIG. 43, in nMOS region R1 of semiconductor substrate 1, gate electrode portion 11*a* of the n channel-type MOS transistor is formed by stacking High-k film 5*a* having a predetermined dielectric constant as well as metal film 7*a* and polysilicon film 9*a* having predetermined work functions on inter layer 3*a*. On the other hand, in pMOS region R2 of semiconductor substrate 1, gate electrode portion 11*b* of the p channel-type MOS transistor is formed by stacking High-k film 5*b* having a predetermined dielectric constant as well as metal film 7*b* and polysilicon film 9*b* having predetermined work functions on inter layer 3*b*. Next, silicon nitride film 15 having a film thickness of approximately several nanometers is formed on semiconductor substrate 1 to cover the side surfaces of gate electrode portions 11*a* and 11*b*.

Figure 44:
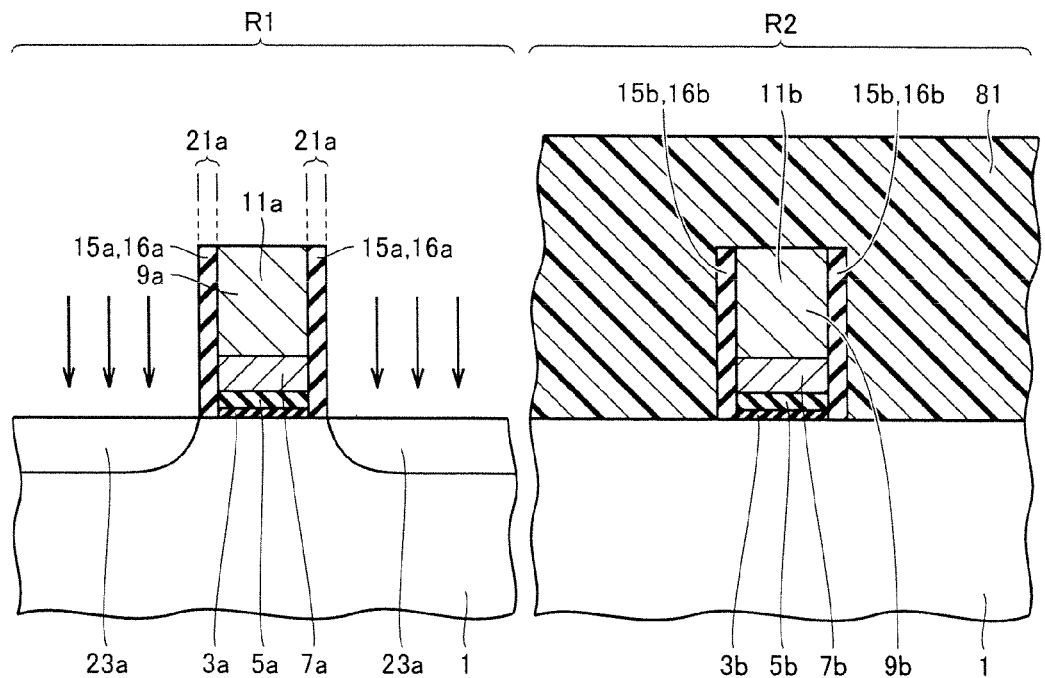
FIG. 44 is a cross-sectional view showing a step performed after the step shown in FIG. 43 in the fourth embodiment.

Next, as shown in FIG. 44, by anisotropically etching silicon nitride film 15 to leave a portion of silicon nitride film 15 located on the side surfaces of gate electrode portions 11*a* and 11*b*, a portion of silicon nitride film 15 located on the surface of semiconductor substrate 1 is removed to expose the surface of semiconductor substrate 1. Thus, silicon nitride film 15*a* forms first protective film 16*a* protecting gate electrode portion 11*a* in nMOS region R1, and silicon nitride film 15*b* forms first protective film 16*b* protecting gate electrode portion 11*b* in pMOS region R2.

Next, resist pattern 81 is formed to expose nMOS region R1 and cover pMOS region R2. In nMOS region R1, first protective film 16*a* located on the side surface of gate electrode portion 11*a*, that is, silicon nitride film 15*a* serves as offset spacer 21*a*. Next, using offset spacer 21*a* and gate electrode portion 11*a* as the mask, the n-type impurity ions such as, for example, arsenic (As) or phosphorus (P) are implanted (arrows), and thereby n-type extention implantation region 23*a* is formed to a predetermined depth from the surface of semiconductor substrate 1. In addition, the p-type impurity ions such as indium (In), boron fluoride ($BF_2$) or boron (B) are implanted obliquely, and thereby the p-type halo implantation region (not shown) is formed.

Figure 45:
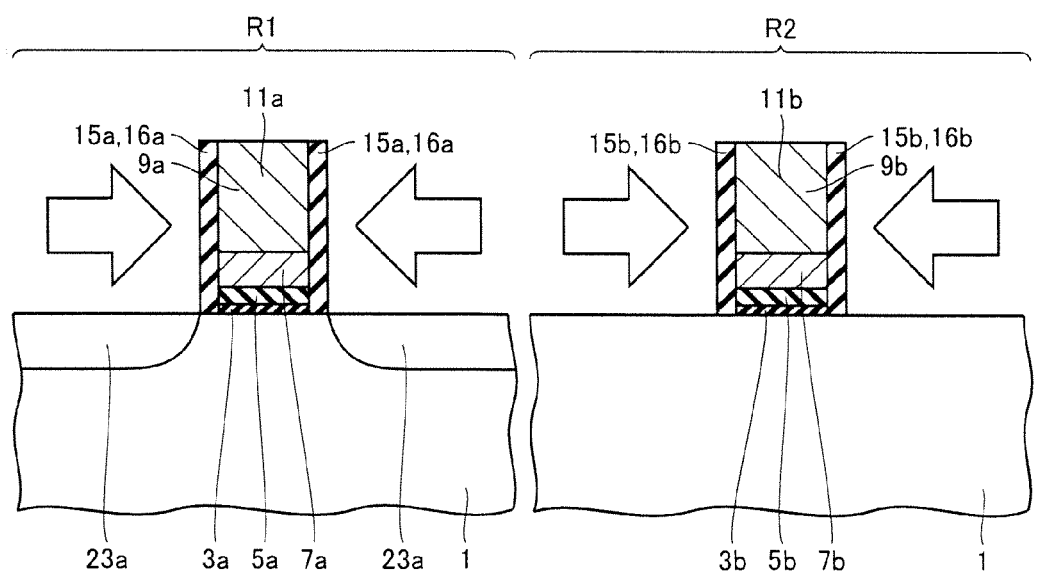
FIG. 45 is a cross-sectional view showing a step performed after the step shown in FIG. 44 in the fourth embodiment.

Next, ashing treatment is performed in the atmosphere of oxygen plasma to remove resist pattern 81. Next, as shown in FIG. 45, semiconductor substrate 1 after removal of resist pattern 81 is cleaned with the ammonia-based chemical solution and the like. At this time, first protective film 16*a* is exposed to the chemical solution in nMOS region R1, and first protective film 16*b* is exposed to the chemical solution in pMOS region R2 (see arrows).

Figure 46:
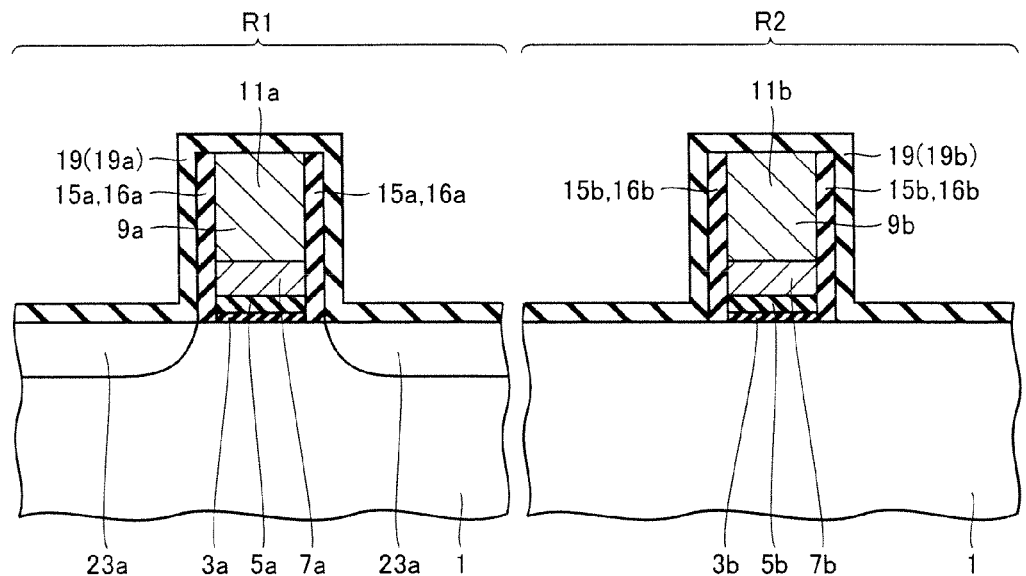
FIG. 46 is a cross-sectional view showing a step performed after the step shown in FIG. 45 in the fourth embodiment.
Figure 47:
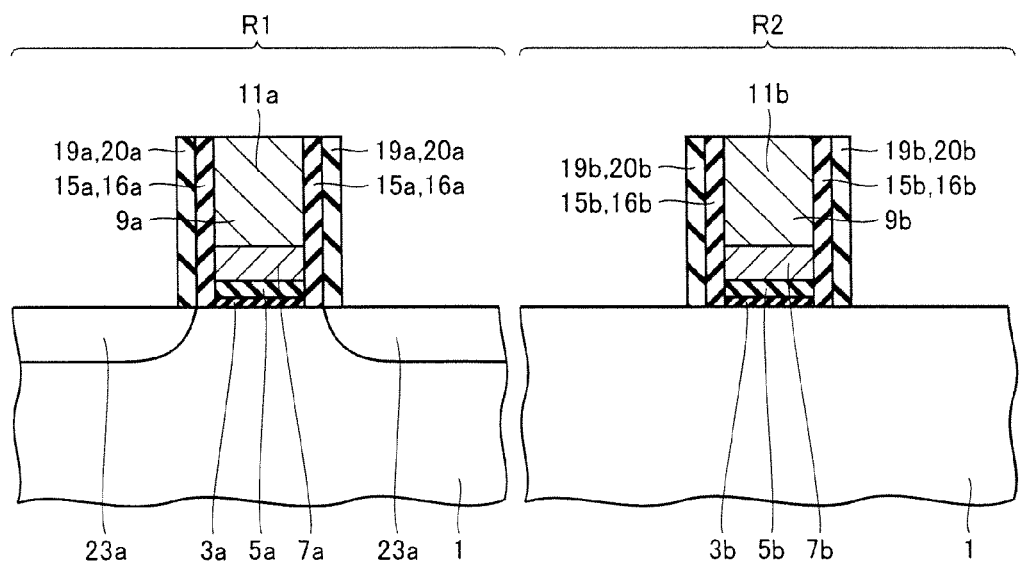
FIG. 47 is a cross-sectional view showing a step performed after the step shown in FIG. 46 in the fourth embodiment.

Next, as shown in FIG. 46, silicon nitride film 19 is formed on semiconductor substrate 1 to cover silicon nitride films 15*a* and 15*b*. Next, as shown in FIG. 47, by anisotropically etching silicon nitride film 19 to leave a portion of silicon nitride film 19 located on the side surfaces of gate electrode portions 11*a* and 11*b*, a portion of silicon nitride film 19 located on the surface of semiconductor substrate 1 is removed to expose the surface of semiconductor substrate 1.

Thus, silicon nitride film 19*a* forms second protective film 20*a* further covering first protective film 16*a* in nMOS region R1, and silicon nitride film 19*b* forms second protective film 20*b* further covering first protective film 16*b* in pMOS region R2.

Figure 48:
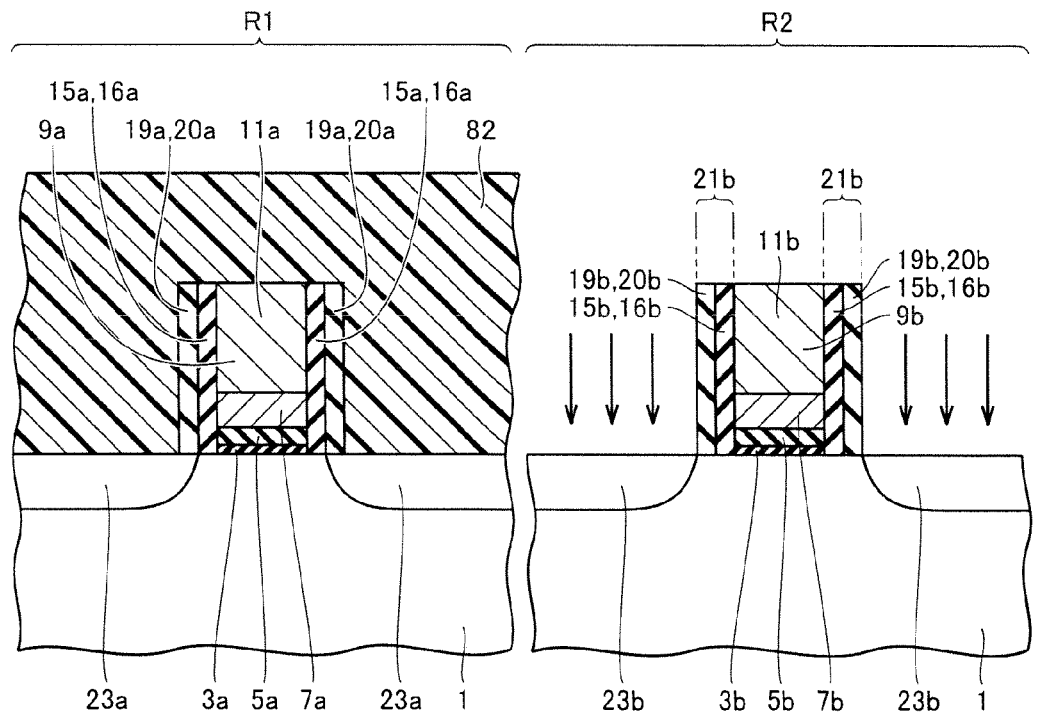
FIG. 48 is a cross-sectional view showing a step performed after the step shown in FIG. 47 in the fourth embodiment.

Next, as shown in FIG. 48, resist pattern 82 is formed to cover nMOS region R1 and expose pMOS region R2. In pMOS region R2, first protective film 16*b* and second protective film 20*b* located on the side surface of gate electrode portion 11*b*, that is, silicon nitride film 15*b* and silicon nitride film 19*b* serve as offset spacer 21*b*.

Next, using offset spacer 21*b* and gate electrode portion 11*b* as the mask, the p-type impurity ions such as, for example, boron fluoride ($BF_2$), boron (B) or indium (In) are implanted (arrows), and thereby p-type extention implantation region 23*b* is formed to a predetermined depth from the surface of semiconductor substrate 1. In addition, the n-type impurity ions such as arsenic (As) or phosphorus (P) are implanted, and thereby the n-type halo implantation region (not shown) is formed.

Figure 49:
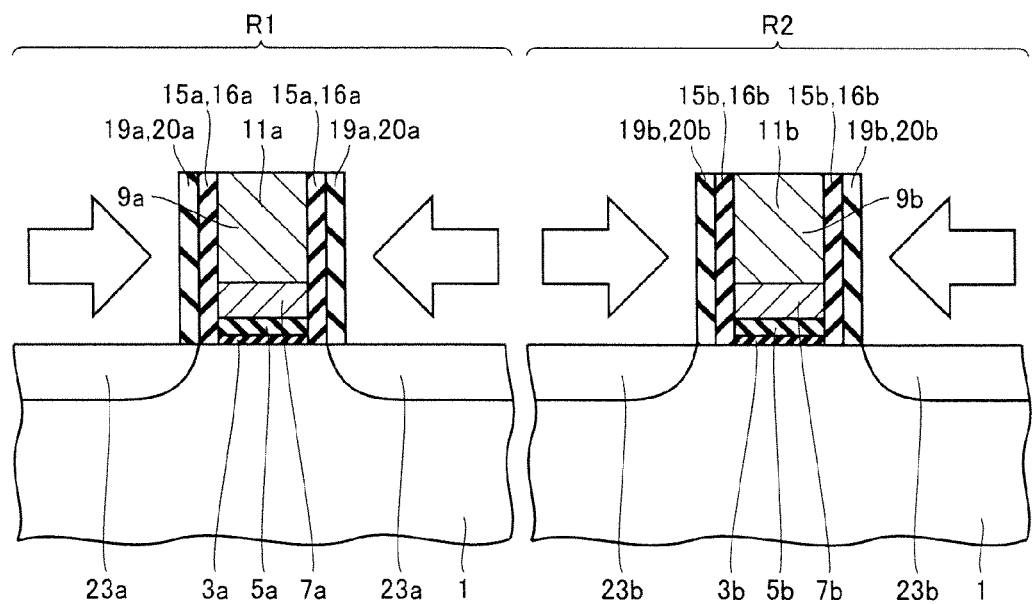
FIG. 49 is a cross-sectional view showing a step performed after the step shown in FIG. 48 in the fourth embodiment.

Next, ashing treatment is performed in the atmosphere of oxygen plasma to remove resist pattern 82. Next, as shown in FIG. 49, semiconductor substrate 1 after removal of resist pattern 82 is cleaned with the ammonia-based chemical solution and the like. At this time, first protective film 16*a* and second protective film 20*a* are exposed to the chemical solution in nMOS region R1, and first protective film 16*b* and second protective film 20*b* are exposed to the chemical solution in pMOS region R2 (see arrows).

Figure 50:
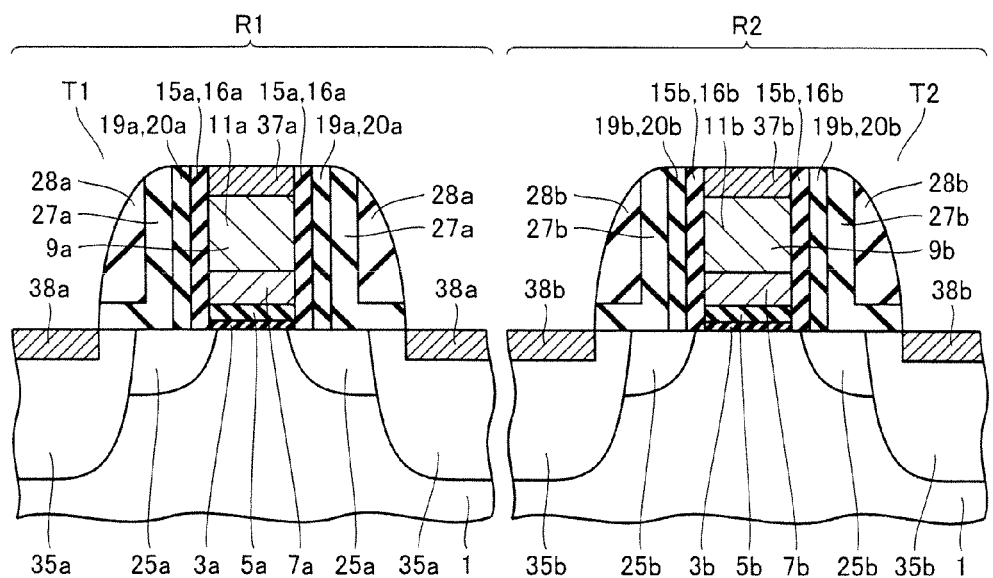
FIG. 50 is a cross-sectional view showing a step performed after the step shown in FIG. 49 in the fourth embodiment.

Thereafter, through the steps similar to those shown in FIGS. 15 to 19 as described above, the halo region (not shown), extention region 25*a*, source/drain region 35*a* and the like are formed and the main portions of n channel-type MOS transistor T1 are formed in nMOS region R1 as shown in FIG. 50. On the other hand, the halo region (not shown), extention region 25*b*, source/drain region 35*b* and the like are formed and the main portions of p channel-type MOS transistor T2 are formed in pMOS region R2.

In the above-mentioned semiconductor device, when extention implantation region 23*a* is formed in nMOS region R1, the surface of semiconductor substrate 1 is exposed. Therefore, a region having a higher impurity concentration can be formed in a portion near the surface of semiconductor substrate 1 as extention implantation region 23*a*. Similarly, when extention implantation region 23*b* is formed in pMOS region R2, the surface of semiconductor substrate 1 is exposed. Therefore, a region having a higher impurity concentration can be formed in a portion near the surface of semiconductor substrate 1 as extention implantation region 23*b*.

As described above, since first protective films 16*a* and 16*b* are not substantially left on the surface of semiconductor substrate 1 when extention implantation region 23*a* is formed in nMOS region R1, only portions formed along the side surfaces of gate electrode portions 11*a* and 11*b* form first protective films 16*a* and 16*b*. In addition, only portions formed along the surfaces of such first protective films 16*a* and 16*b* form second protective films 20*a* and 20*b*.

In addition, in the above-mentioned semiconductor device, the portion of first protective film 16*a* located on the side surface of gate electrode portion 11*a* serves as offset spacer 21*a* in nMOS region R1, and first protective film 16*b* and second protective film 20*b* located on the side surface of gate electrode portion 11*b* serve as offset spacer 21*b* in pMOS region R2.

As a result, the thickness of offset spacer 21*a* (the number of stacked layers) in nMOS region R1 can be made different from that of offset spacer 21*b* in pMOS region R2, and thus, the extention region and the like having a desired impurity profile corresponding to the properties of each of the n channel type MOS transistor and the p channel type MOS transistor can be accurately formed.

In addition, in nMOS region R1, extention implantation region 23*a* is formed by causing first protective film 16*a* located on the side surface of gate electrode portion 11*a* to function as offset spacer 21*a*. Thereafter, cleaning (cleaning A) of semiconductor substrate 1 is done with the ammonia-based chemical solution and the like. Furthermore, in pMOS region R2, extention implantation region 23b is formed by causing first protective film 16b and second protective film 20b located on the side surface of gate electrode portion 11b to function as offset spacer 21b. Thereafter, cleaning (cleaning B) of semiconductor substrate 1 is done with the ammonia-based chemical solution and the like.

In the above-mentioned semiconductor device, in cleaning A, permeation of the chemical solution from the side through gate electrode portions 11a and 11b can at least be inhibited because first protective films 16a and 16b formed of silicon nitride films 15a and 15b having high resistance to the chemical solution are formed to cover the side surfaces of gate electrode portions 11a and 11b. In addition, in cleaning B as well, permeation of the chemical solution from the side through gate electrode portions 11a and 11b can at least be inhibited because second protective films 20a and 20b including silicon nitride films 19a and 19b having high resistance to the chemical solution are formed to cover the side surfaces of gate electrode portions 11a and 11b.

Furthermore, since thinning of first protective films 16a and 16b is inhibited, a desired thickness of offset spacer 21b formed of first protective film 16b and second protective film 20b can be ensured and extention implantation region 23b having a desired impurity profile can be formed using offset spacer 21b as the mask in pMOS region R2.

In addition, as described above, by applying silicon nitride films 15a and 15b and silicon oxide films 17a and 17b as first protective films 16a and 16b and second protective films 20a and 20b functioning as offset spacers 21a and 21b, gate leak can be reduced.

As a result of thermal diffusion of the impurity by heat treatment, in nMOS region R1, each of the pair of extention regions 25a is formed to extend in the direction away from gate electrode portion 11a, defining, as the end (first end), the position spaced from the position of semiconductor substrate 1 toward the gate electrode portion 11a side by the predetermined distance based on the thermal diffusion length, the position of semiconductor substrate 1 being located immediately under the surface of first protective film 16a on the side surface of gate electrode portion 11a.

On the other hand, in pMOS region R2, each of the pair of extention regions 25b is formed to extend in the direction away from gate electrode portion 11b, defining, as the end (second end), the position spaced from the position of semiconductor substrate 1 toward the gate electrode portion 11b side by the predetermined distance based on the thermal diffusion length, the position of semiconductor substrate 1 being located immediately under the surface of second protective film 20b on the side surface of gate electrode portion 11b.

Furthermore, in nMOS region R1, each of the pair of source/drain regions 35a is formed to extend in the direction away from gate electrode portion 11a, defining, as the end (third end), the position spaced from the position (position A) of semiconductor substrate 1 toward the gate electrode portion 11a side by the predetermined distance based on the thermal diffusion length, the position (position A) being located immediately under the surface of sidewall spacer 31a on the side surface of gate electrode portion 11a. This third end is located between position A and the first end.

On the other hand, in pMOS region R2, each of the pair of source/drain regions 35b is formed to extend in the direction away from gate electrode portion 11b, defining, as the end (fourth end), the position spaced from the position (position B) of semiconductor substrate 1 toward the gate electrode portion 11b side by the predetermined distance based on the thermal diffusion length, the position (position B) being located immediately under the surface of sidewall spacer 31b on the side surface of gate electrode portion 11b. This fourth end is located between position B and the second end.

(Fifth Embodiment)

Figure 20:
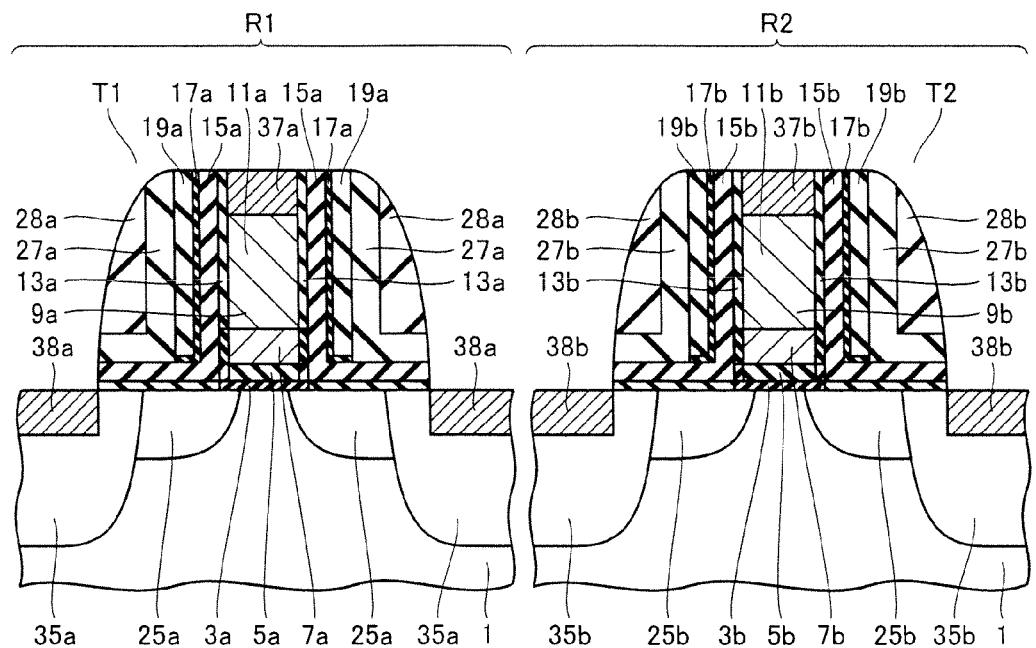
FIG. 20 is a cross-sectional view showing a step performed after the step shown in FIG. 19 in the first embodiment.

A description will now be given to a semiconductor device including a plurality of MOS transistors having different threshold voltages. It is to be noted that for convenience of description, a relatively high threshold voltage will be referred to as high threshold voltage (Hvt), a relatively low threshold voltage will be referred to as low threshold voltage (Lvt), and a medium threshold voltage will be referred to as medium threshold voltage (Mvt). In addition, the MOS transistor shown in FIG. 20 is used as the MOS transistor by way of example.

Figure 51:
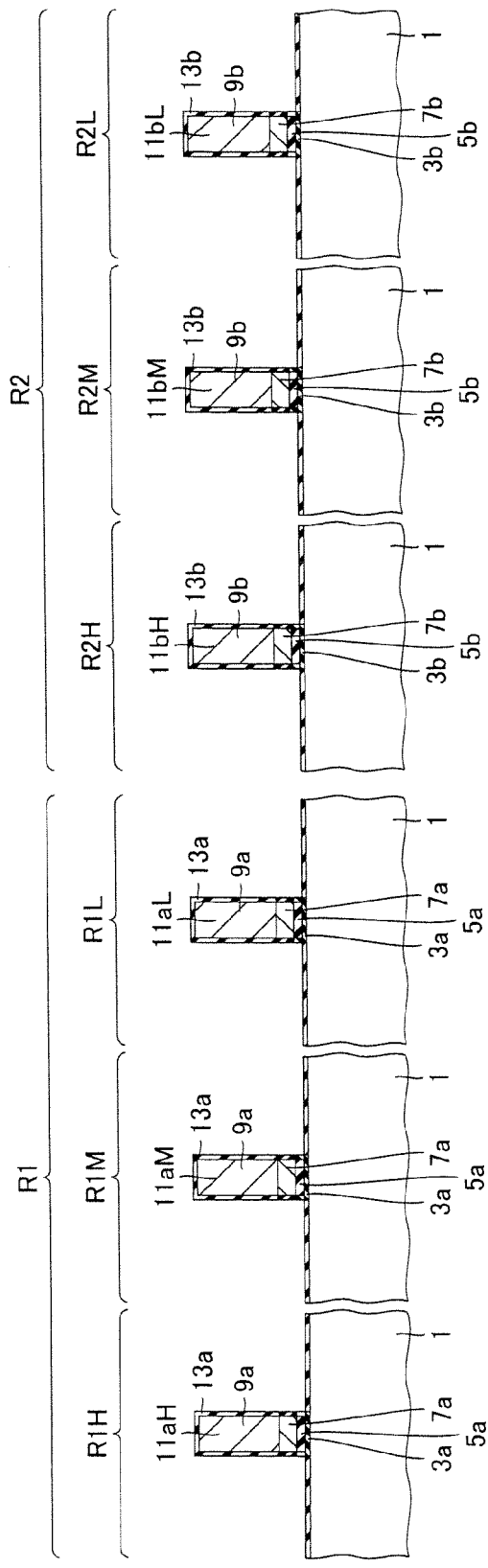
FIG. 51 is a cross-sectional view showing one step of a method for manufacturing a semiconductor device according to a fifth embodiment of the present invention.

As shown in FIG. 51, in nMOS region R1 of semiconductor substrate 1, a gate electrode portion 11aH corresponding to Hvt is formed in a region R1H, a gate electrode portion 11aM corresponding to Mvt is formed in a region R1M, and a gate electrode portion 11aL corresponding to Lvt is formed in a region R1L as the gate electrode portions of the n channel-type MOS transistor by stacking High-k film 5a having a predetermined dielectric constant as well as metal film 7a and polysilicon film 9a having predetermined work functions on inter layer 3a.

On the other hand, in pMOS region R2 of semiconductor substrate 1, a gate electrode portion 11bH corresponding to Hvt is formed in a region R2H, a gate electrode portion 11bM corresponding to Mvt is formed in a region R2M, and a gate electrode portion 11bL corresponding to Lvt is formed in a region R2L as the gate electrode portions of the p channel-type MOS transistor by stacking High-k film 5b having a predetermined dielectric constant as well as metal film 7b and polysilicon film 9b having predetermined work functions on inter layer 3b.

Next, the resist (not shown) used as the mask for patterning gate electrode portions 11aH to 11aL and 11bH to 11bL is removed in the atmosphere of oxygen plasma, and thereby oxide layer 13a is formed on surfaces of gate electrode portions 11aH to 11aL, and oxide layer 13b is formed on surfaces of gate electrode portions 11bH to 11bL.

Figure 52:
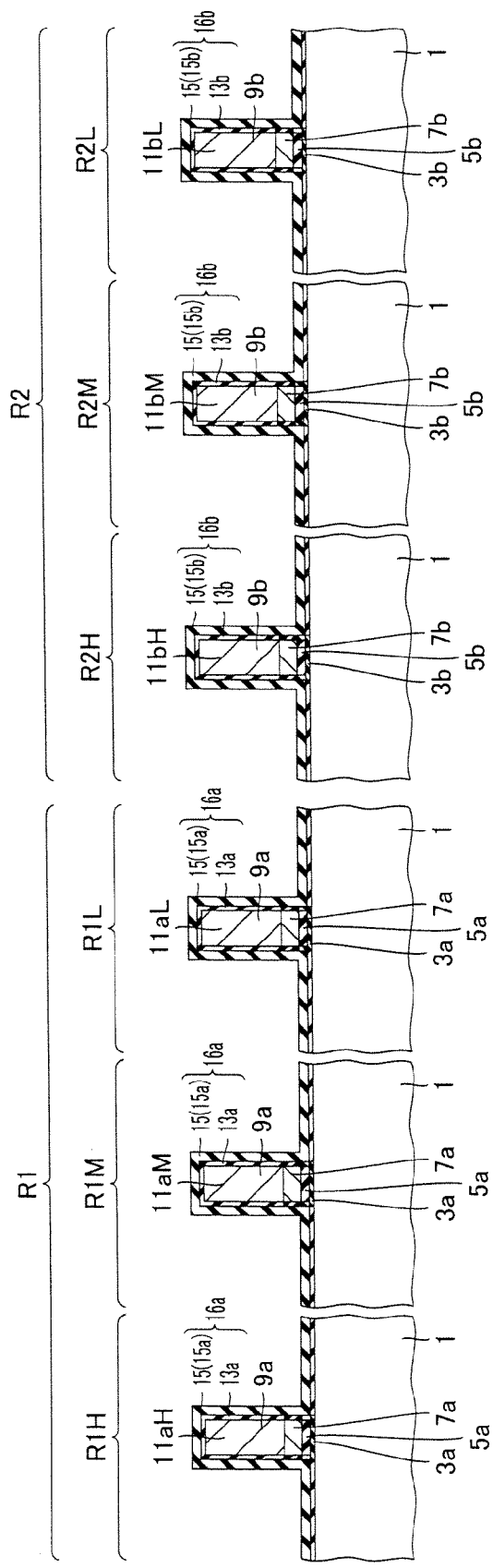
FIG. 52 is a cross-sectional view showing a step performed after the step shown in FIG. 51 in the fifth embodiment.

Next, as shown in FIG. 52, silicon nitride film 15 having a film thickness of approximately several nanometers is formed on semiconductor substrate 1 to cover oxide layers 13a and 13b. Thus, oxide layer 13a and silicon nitride film 15 (15a) form first protective film 16a protecting gate electrode portions 11aH to 11aL in nMOS region R1, and oxide layer 13b and silicon nitride film 15 (15b) form first protective film 16b protecting gate electrode portions 11bH to 11bL in pMOS region R2.

Figure 53:
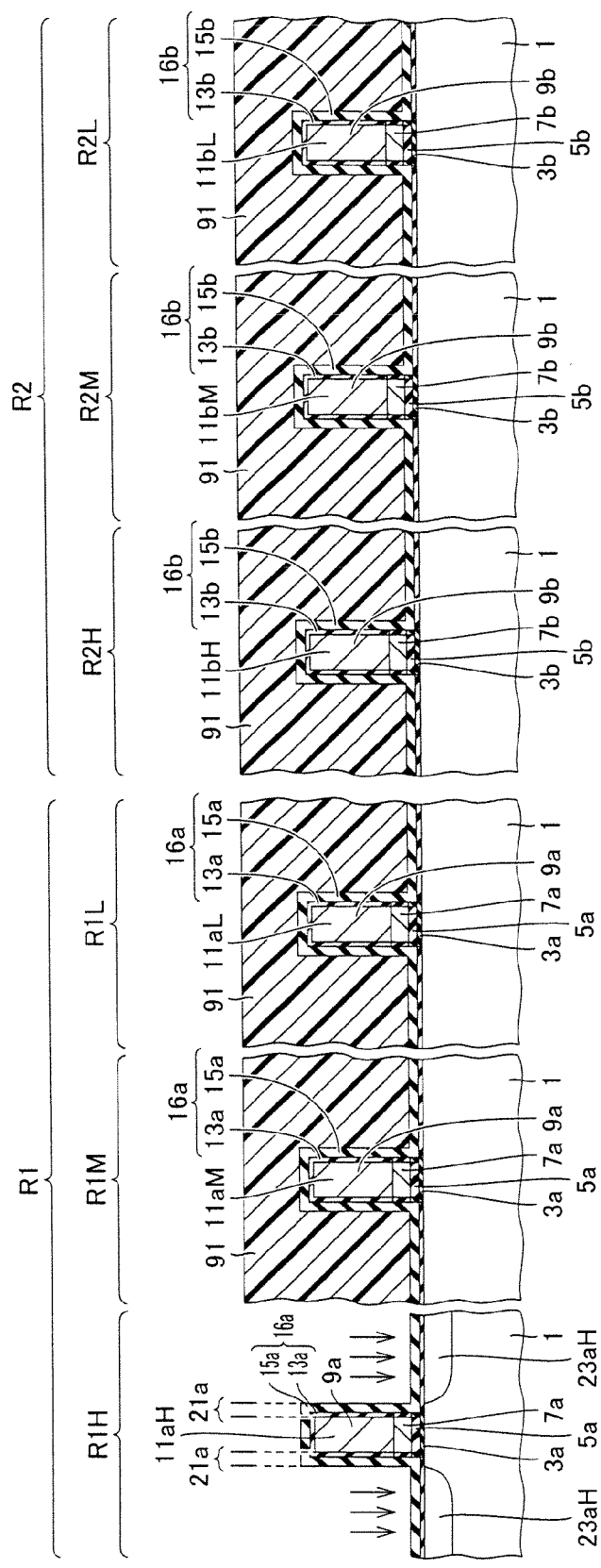
FIG. 53 is a cross-sectional view showing a step performed after the step shown in FIG. 52 in the fifth embodiment.

Next, as shown in FIG. 53, a resist pattern 91 is formed to expose region R1H in nMOS region R1 and cover the other regions R1M and R1L and pMOS region R2. In region R1H, a portion of first protective film 16a located on the side surface of gate electrode portion 11aH, of first protective film 16a, that is, portions of oxide layer 13a and silicon nitride film 15a serve as offset spacer 21a.

Next, using offset spacer 21a and gate electrode portion 11aH as the mask, the n-type impurity ions such as, for example, arsenic (As) or phosphorus (P) are implanted (arrows), and thereby an n-type extention implantation region 23aH is formed in region R1H to a predetermined depth from the surface of semiconductor substrate 1. In addition, the p-type impurity ions such as indium (In), boron fluoride ($BF_2$) or boron (B) are implanted obliquely, and thereby the p-type halo implantation region (not shown) is formed.

Figure 54:
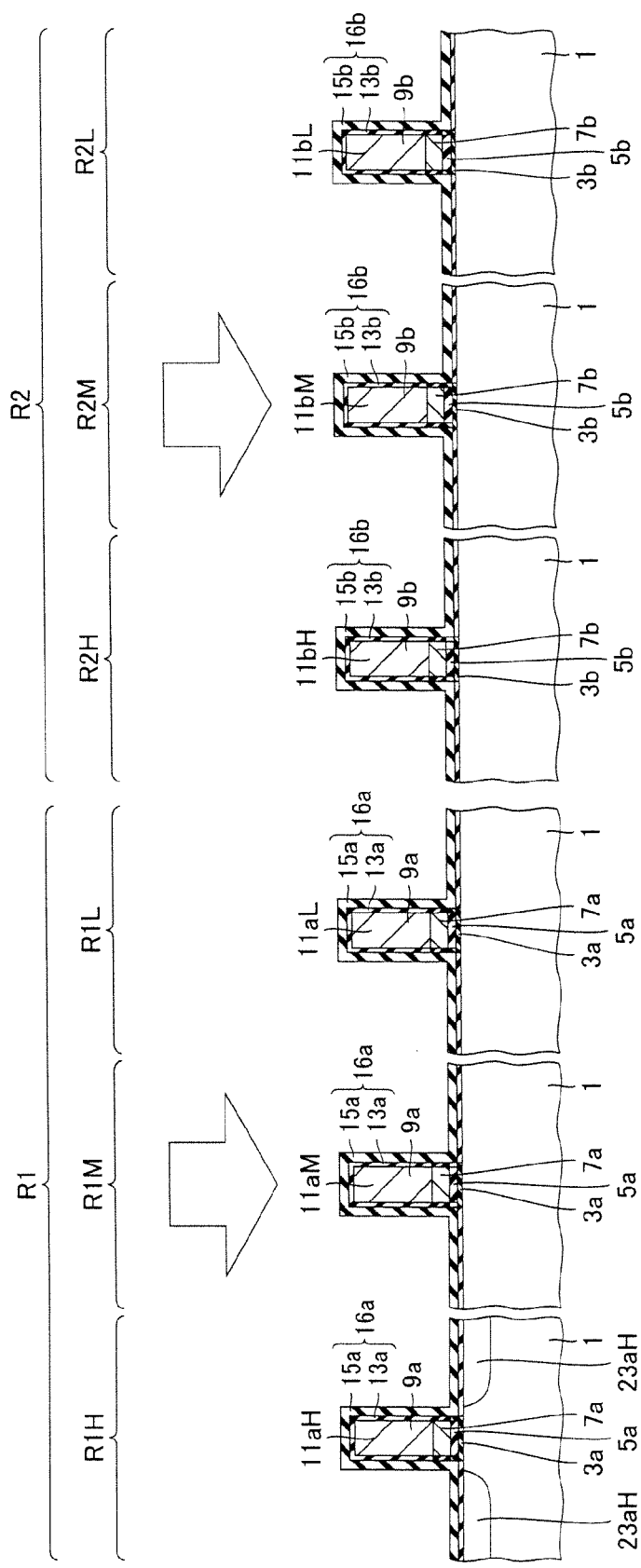
FIG. 54 is a cross-sectional view showing a step performed after the step shown in FIG. 53 in the fifth embodiment.

Next, ashing treatment is performed in the atmosphere of oxygen plasma to remove resist pattern 91. Next, as shown in FIG. 54, semiconductor substrate 1 after removal of resist pattern 91 is cleaned with the ammonia-based chemical solution and the like. At this time, first protective film 16a is exposed to the chemical solution in regions R1H, R1M and R1L in nMOS region R1, and first protective film 16b is exposed to the chemical solution in regions R2H, R2M and R2L in pMOS region R2 (see arrows).

Figure 55:
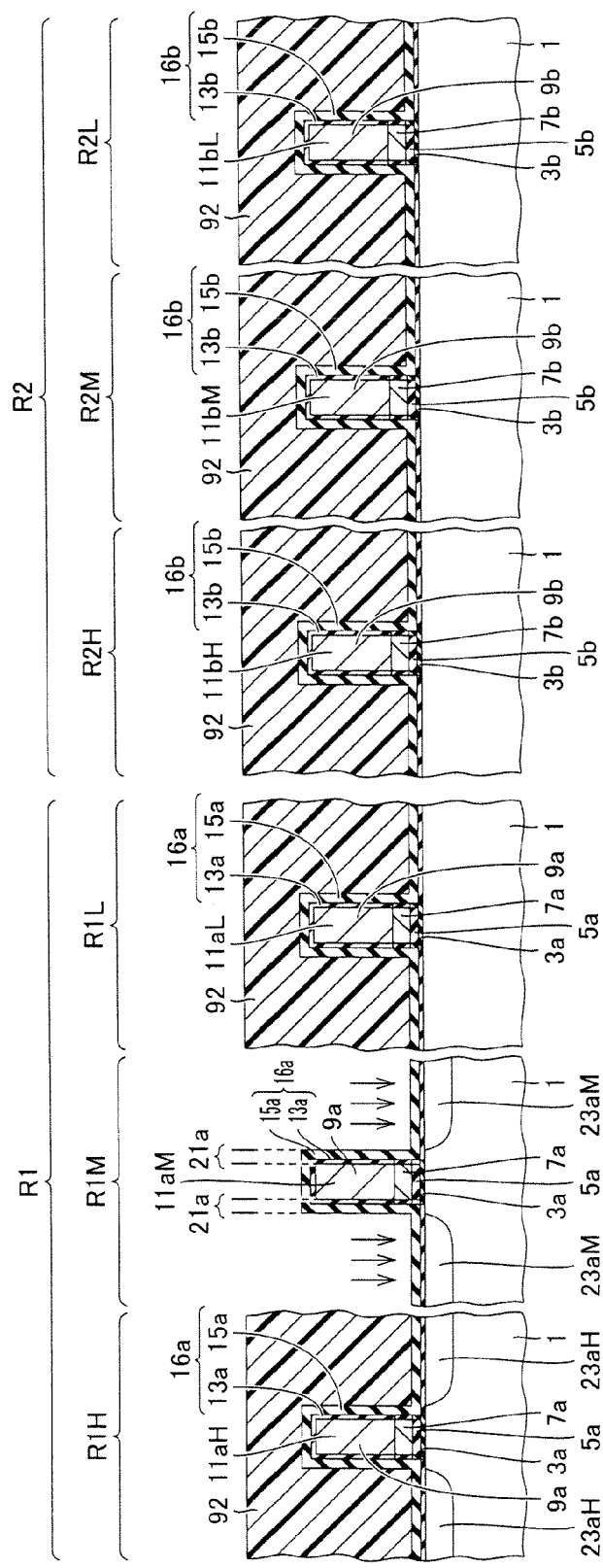
FIG. 55 is a cross-sectional view showing a step performed after the step shown in FIG. 54 in the fifth embodiment.

Next, as shown in FIG. 55, a resist pattern 92 is formed to expose region R1M in nMOS region R1 and cover the other regions R1H and R1L and pMOS region R2. In region R1M, a portion of first protective film 16a located on the side surface of gate electrode portion 11aM, of first protective film 16a, that is, portions of oxide layer 13a and silicon nitride film 15a serve as offset spacer 21a.

Next, using offset spacer 21a and gate electrode portion 11aM as the mask, the n-type impurity ions such as, for example, arsenic (As) or phosphorus (P) are implanted (arrows), and thereby an n-type extention implantation region 23aM is formed in region R1M to a predetermined depth from the surface of semiconductor substrate 1. In addition, the p-type impurity ions such as indium (In), boron fluoride ($BF_2$) or boron (B) are implanted obliquely, and thereby the p-type halo implantation region (not shown) is formed.

Figure 56:
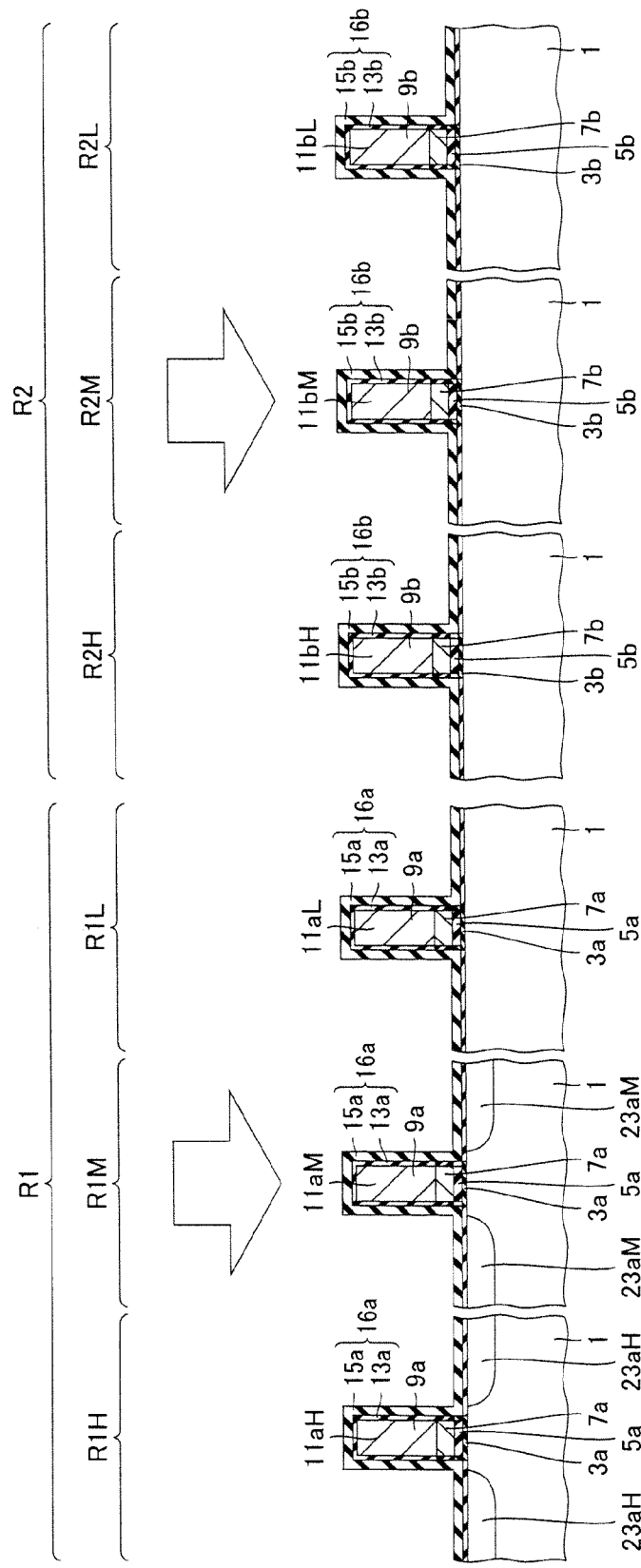
FIG. 56 is a cross-sectional view showing a step performed after the step shown in FIG. 55 in the fifth embodiment.

Next, ashing treatment is performed in the atmosphere of oxygen plasma to remove resist pattern 92. Next, as shown in FIG. 56, semiconductor substrate 1 after removal of resist pattern 92 is cleaned with the ammonia-based chemical solution and the like. At this time, first protective film 16a is exposed to the chemical solution in regions R1H, R1M and R1L in nMOS region R1, and first protective film 16b is exposed to the chemical solution in regions R2H, R2M and R2L in pMOS region R2 (see arrows).

Figure 57:
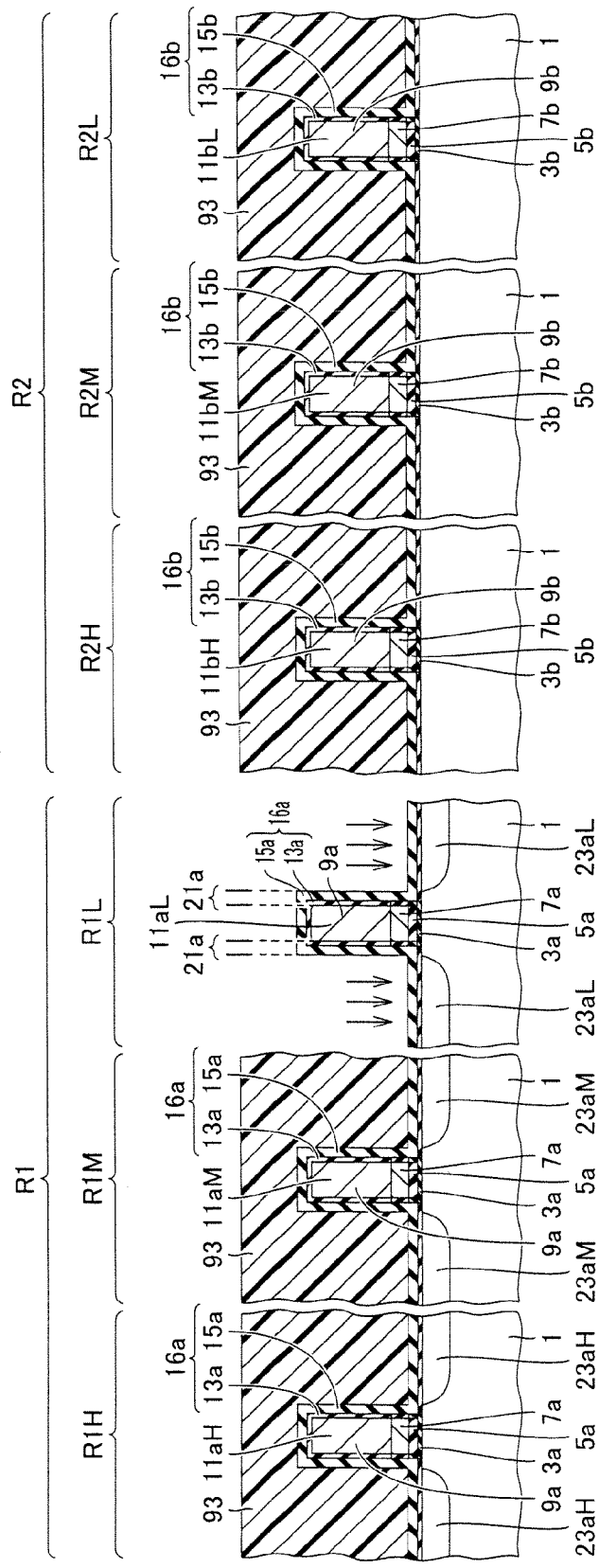
FIG. 57 is a cross-sectional view showing a step performed after the step shown in FIG. 56 in the fifth embodiment.

Next, as shown in FIG. 57, a resist pattern 93 is formed to expose region R1L in nMOS region R1 and cover the other regions R1H and R1M and pMOS region R2. In region R1L, a portion of first protective film 16a located on the side surface of gate electrode portion 11aM, of first protective film 16a, that is, portions of oxide layer 13a and silicon nitride film 15a serve as offset spacer 21a.

Next, using offset spacer 21a and gate electrode portion 11aL as the mask, the n-type impurity ions such as, for example, arsenic (As) or phosphorus (P) are implanted (arrows), and thereby an n-type extention implantation region 23aL is formed in region R1L to a predetermined depth from the surface of semiconductor substrate 1. In addition, the p-type impurity ions such as indium (In), boron fluoride ($BF_2$) or boron (B) are implanted obliquely, and thereby the p-type halo implantation region (not shown) is formed.

Figure 58:
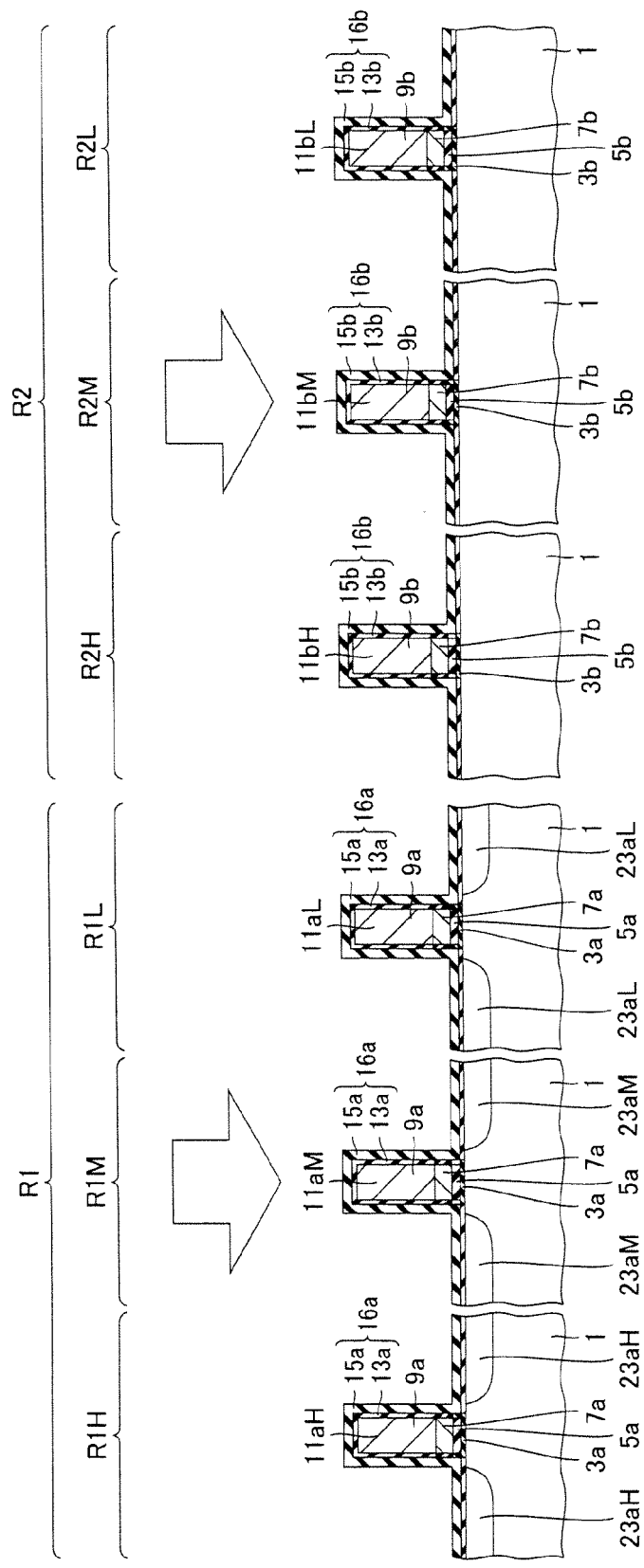
FIG. 58 is a cross-sectional view showing a step performed after the step shown in FIG. 57 in the fifth embodiment.

Next, ashing treatment is performed in the atmosphere of oxygen plasma to remove resist pattern 93. Next, as shown in FIG. 58, semiconductor substrate 1 after removal of resist pattern 93 is cleaned with the ammonia-based chemical solution and the like. At this time, first protective film 16a is exposed to the chemical solution in regions R1H, R1M and R1L in nMOS region R1, and first protective film 16b is exposed to the chemical solution in regions R2H, R2M and R2L in pMOS region R2 (see arrows).

Figure 59:
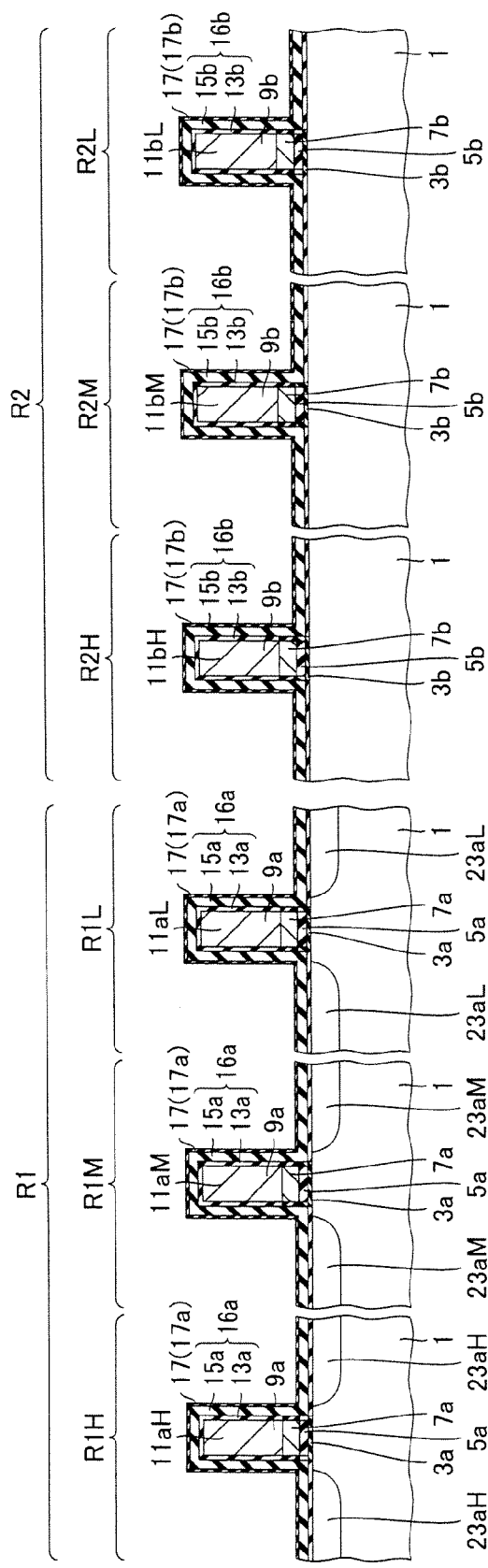
FIG. 59 is a cross-sectional view showing a step performed after the step shown in FIG. 58 in the fifth embodiment.
Figure 60:
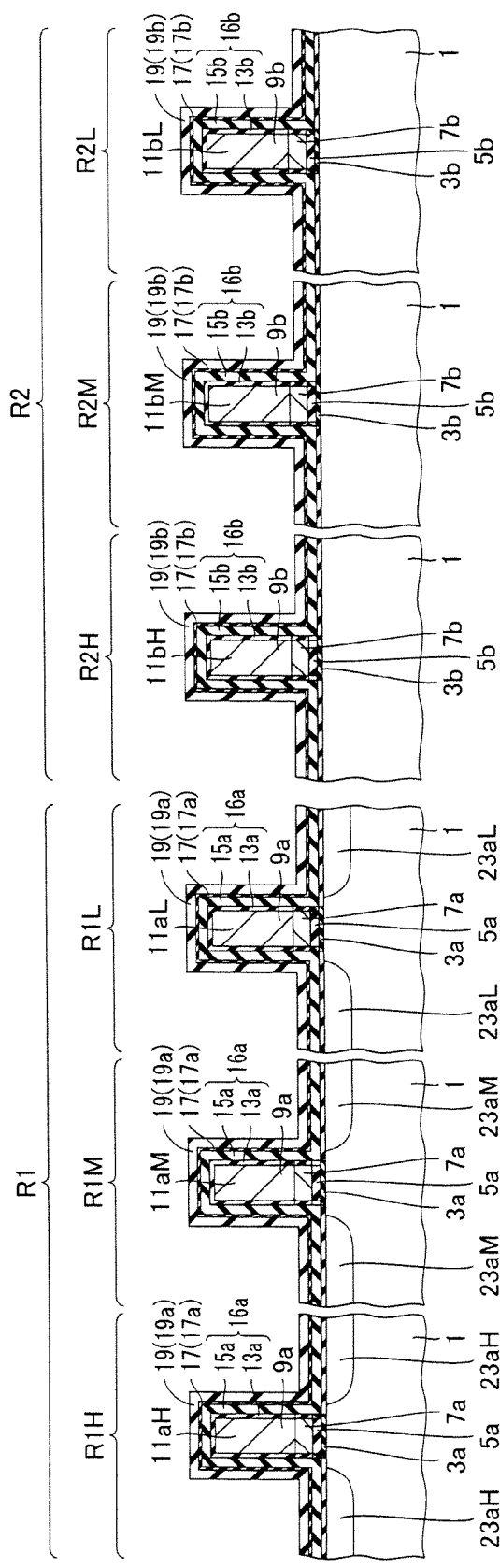
FIG. 60 is a cross-sectional view showing a step performed after the step shown in FIG. 59 in the fifth embodiment.
Figure 61:
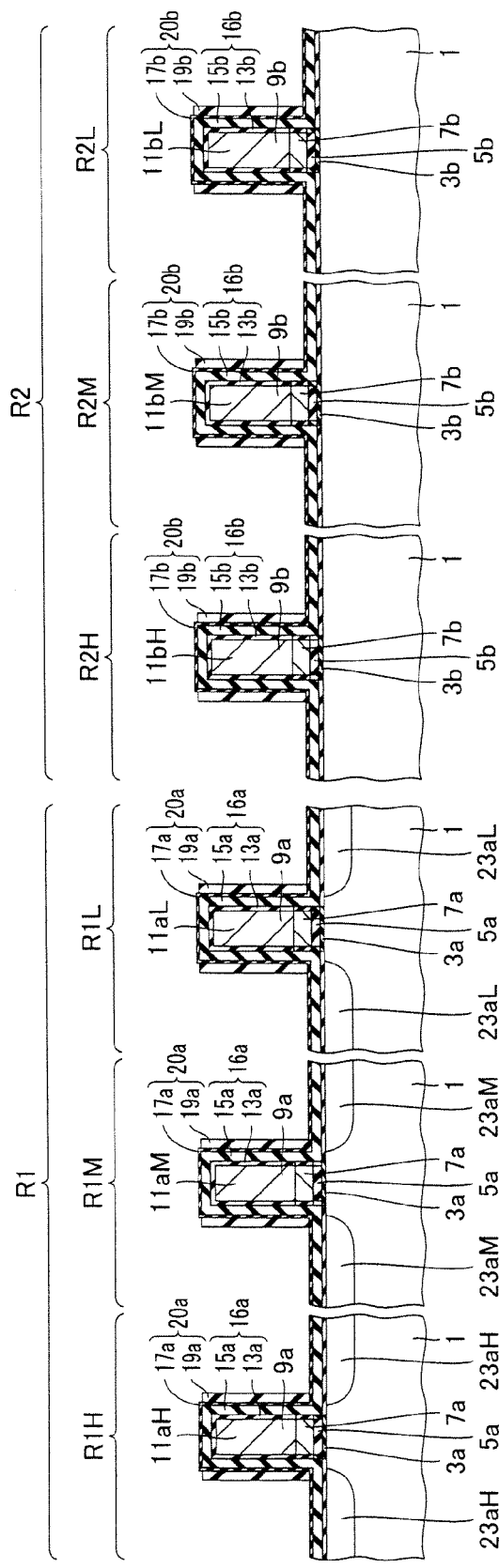
FIG. 61 is a cross-sectional view showing a step performed after the step shown in FIG. 60 in the fifth embodiment.

Next, as shown in FIG. 59, the surfaces of silicon nitride films 15a and 15b are oxidized in the atmosphere of oxygen plasma, and thereby silicon oxide film 17 having a film thickness of approximately 1 to 2 nm is formed. This silicon oxide film 17 may be formed on silicon nitride films 15a and 15b by ashing treatment in removing the resist pattern. Next, as shown in FIG. 60, silicon nitride film 19 is formed on semiconductor substrate 1 to cover silicon oxide film 17. Next, as shown in FIG. 61, by anisotropically etching silicon nitride film 19 using silicon oxide film 17 as an etching stopper film, silicon nitride films 19a and 19b located on the side surfaces of gate electrode portions 11a and 11bare left and silicon nitride film 19 located on the other portions is removed.

Thus, silicon oxide film 17 (17a) and silicon nitride film 19a form second protective film 20a further covering first protective film 16a in nMOS region R1, and silicon oxide film 17 (17b) and silicon nitride film 19b form second protective film 20b further covering first protective film 16b in pMOS region R2.

Figure 62:
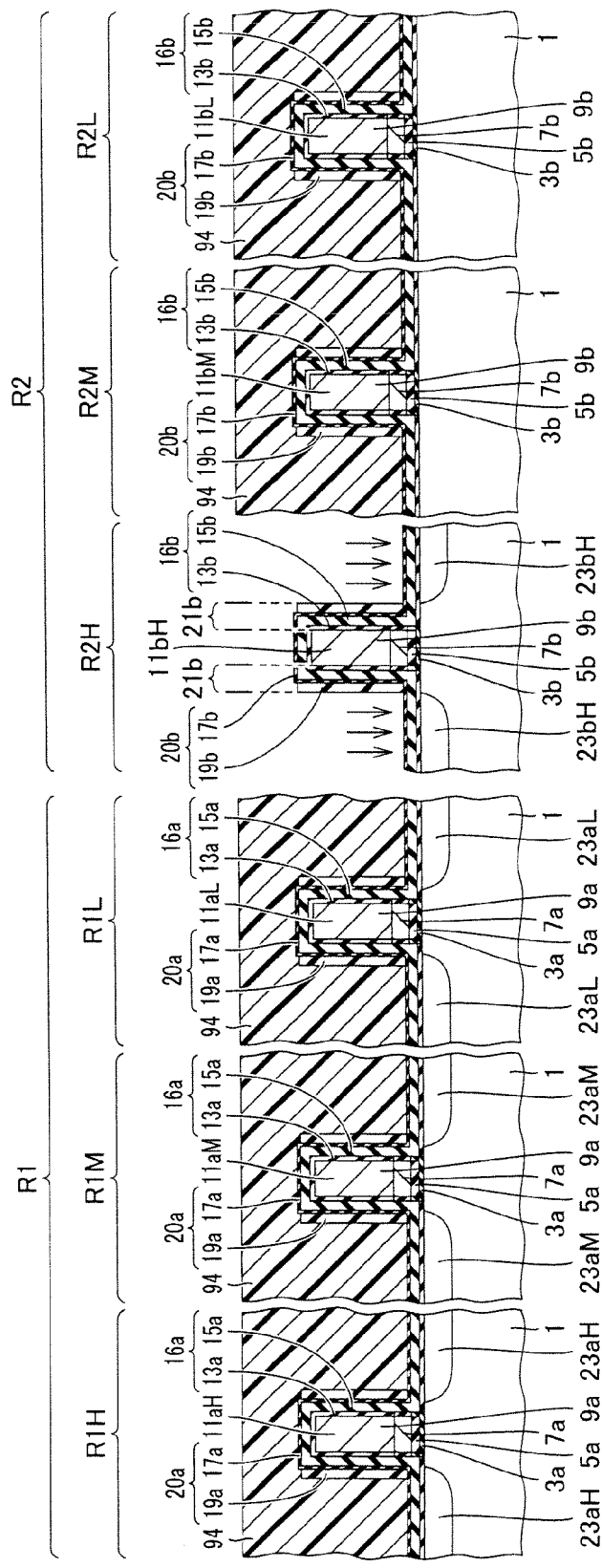
FIG. 62 is a cross-sectional view showing a step performed after the step shown in FIG. 61 in the fifth embodiment.

Next, as shown in FIG. 62, a resist pattern 94 is formed to expose region R2H in pMOS region R2 and cover the other regions R2M and R2L and nMOS region R1. In region R2H, a portion of first protective film 16b and a portion of second protective film 20b located on the side surface of gate electrode portion 11bH, of first protective film 16b and second protective film 20b, that is, portions of oxide layer 13b, silicon nitride film 15b, silicon oxide film 17b, and silicon nitride film 19b serve as offset spacer 21b.

Next, using offset spacer 21b and gate electrode portion 11bH as the mask, the p-type impurity ions such as, for example, boron fluoride ($BF_2$), boron (B) or indium (In) are implanted (arrows), and thereby a p-type extention implantation region 23bH is formed to a predetermined depth from the surface of semiconductor substrate 1. In addition, the n-type impurity ions such as arsenic (As) or phosphorus (P) are implanted, and thereby the n-type halo implantation region (not shown) is formed.

Figure 63:
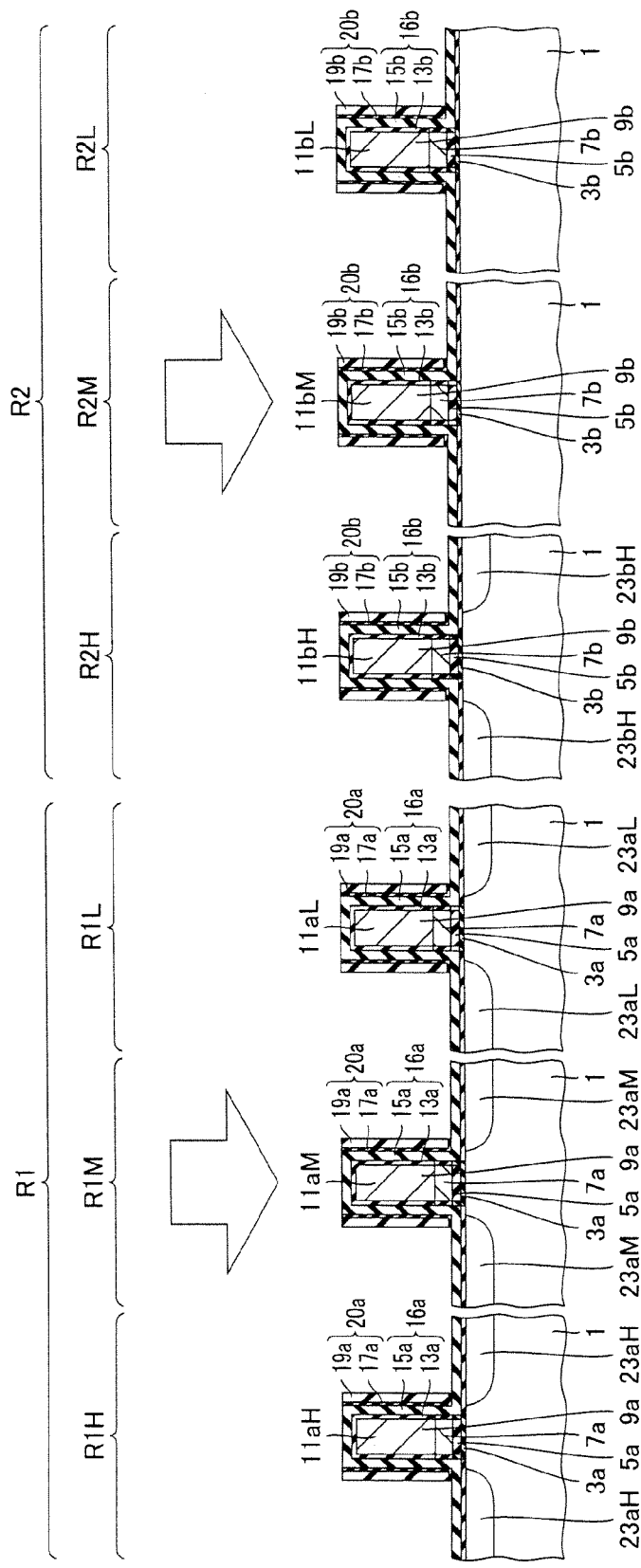
FIG. 63 is a cross-sectional view showing a step performed after the step shown in FIG. 62 in the fifth embodiment.

Next, ashing treatment is performed in the atmosphere of oxygen plasma to remove resist pattern 94. Next, as shown in FIG. 63, semiconductor substrate 1 after removal of resist pattern 94 is cleaned with the ammonia-based chemical solution and the like. At this time, second protective film 20a is exposed to the chemical solution in regions R1H, R1M and R1L in nMOS region R1, and second protective film 20b is exposed to the chemical solution in regions R2H, R2M and R2L in pMOS region R2 (see arrows). At this time, by the ammonia-based chemical solution and the like, silicon oxide films 17a and 17b that are not covered with silicon nitride films 19a and 19b are completely removed or become thinner than a portion covered with silicon nitride films 19a and 19b. It is to be noted that FIG. 63 shows the case where silicon oxide films 17a and 17b that are not covered with silicon nitride films 19a and 19b are completely removed.

Figure 64:
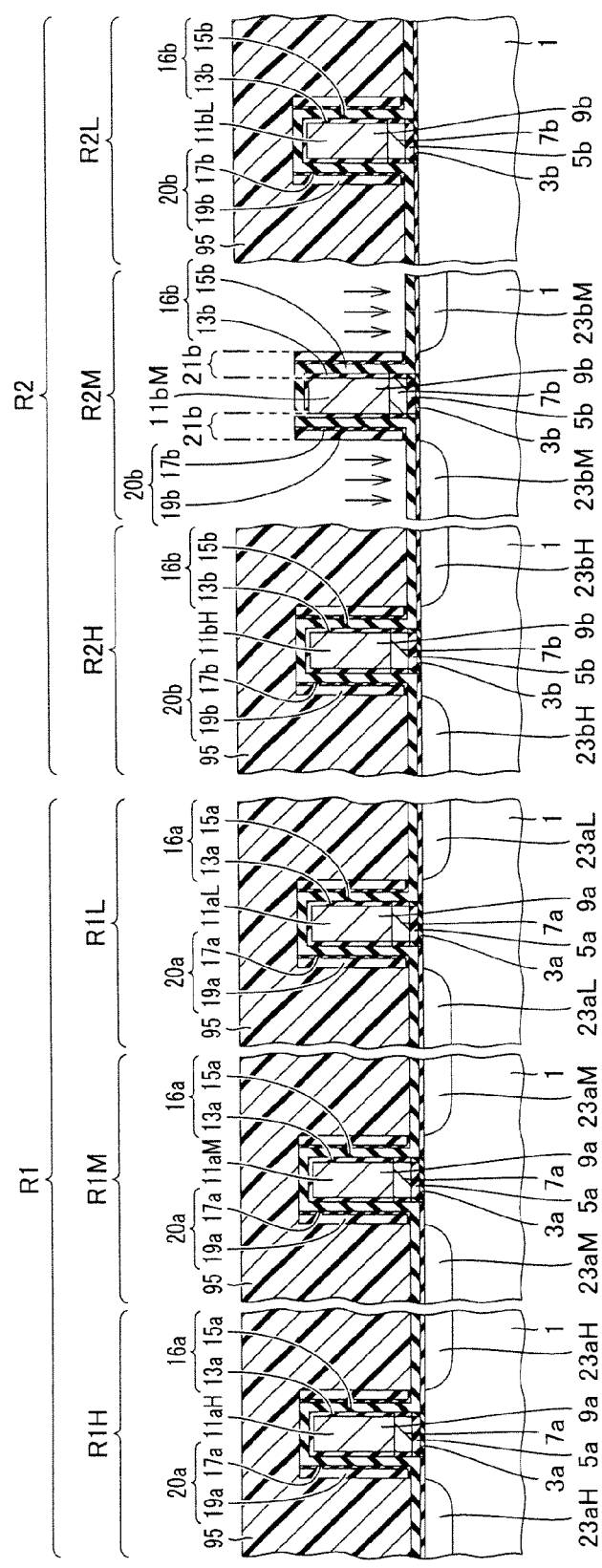
FIG. 64 is a cross-sectional view showing a step performed after the step shown in FIG. 63 in the fifth embodiment.

Next, as shown in FIG. 64, a resist pattern 95 is formed to expose region R2M in pMOS region R2 and cover the other regions R2H and R2L and nMOS region R1. In region R2M, a portion of first protective film 16b and a portion of second protective film 20b located on the side surface of gate electrode portion 11bM, of first protective film 16b and second protective film 20b, that is, portions of oxide layer 13b, silicon nitride film 15b, silicon oxide film 17b, and silicon nitride film 19b serve as offset spacer 21b.

Next, using offset spacer 21b and gate electrode portion 11bM as the mask, the p-type impurity ions such as, for example, boron fluoride ($BF_2$), boron (B) or indium (In) are implanted (arrows), and thereby a p-type extention implantation region 23bM is formed to a predetermined depth from the surface of semiconductor substrate 1. In addition, the n-type impurity ions such as arsenic (As) or phosphorus (P)

are implanted, and thereby the n-type halo implantation region (not shown) is formed.

Figure 65:
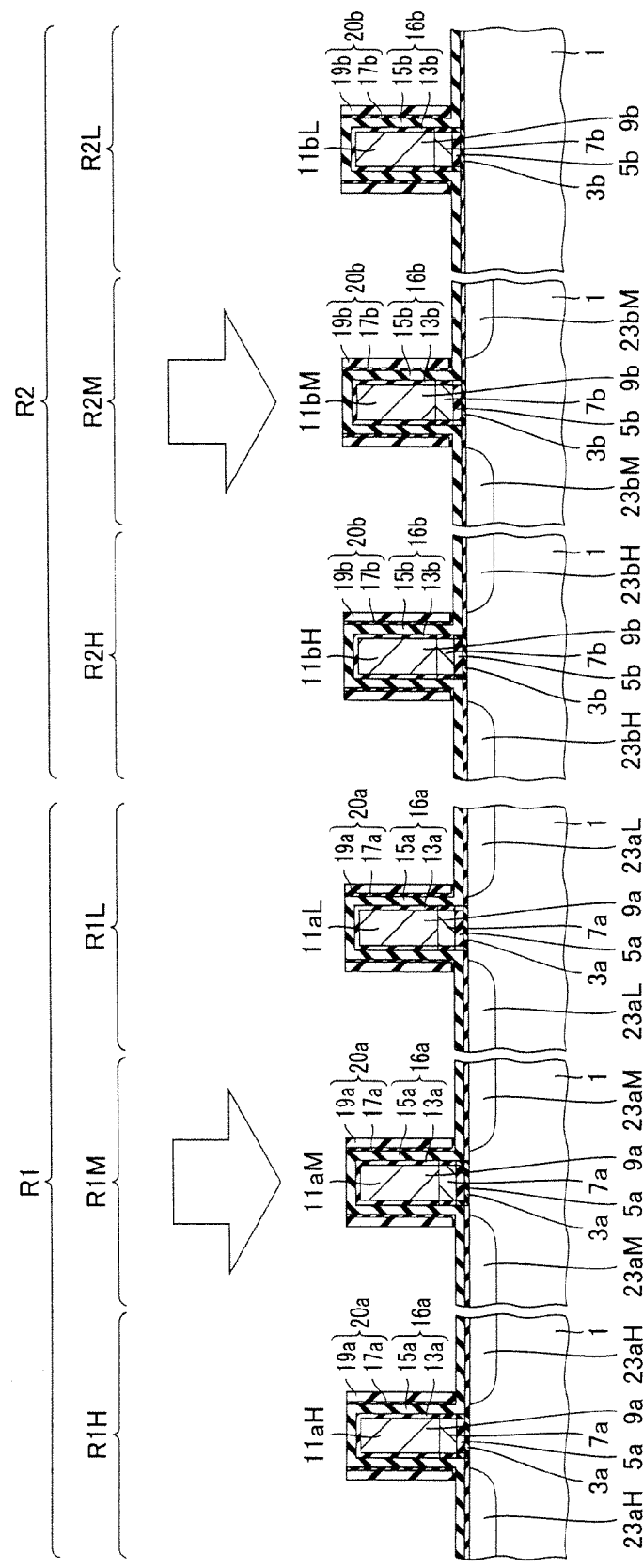
FIG. 65 is a cross-sectional view showing a step performed after the step shown in FIG. 64 in the fifth embodiment.

Next, ashing treatment is performed in the atmosphere of oxygen plasma to remove resist pattern 95. Next, as shown in FIG. 65, semiconductor substrate 1 after removal of resist pattern 95 is cleaned with the ammonia-based chemical solution and the like. At this time, second protective film 20a is exposed to the chemical solution in regions R1H, R1M and R1L in nMOS region R1, and second protective film 20b is exposed to the chemical solution in regions R2H, R2M and R2L in pMOS region R2 (see arrows).

Figure 66:
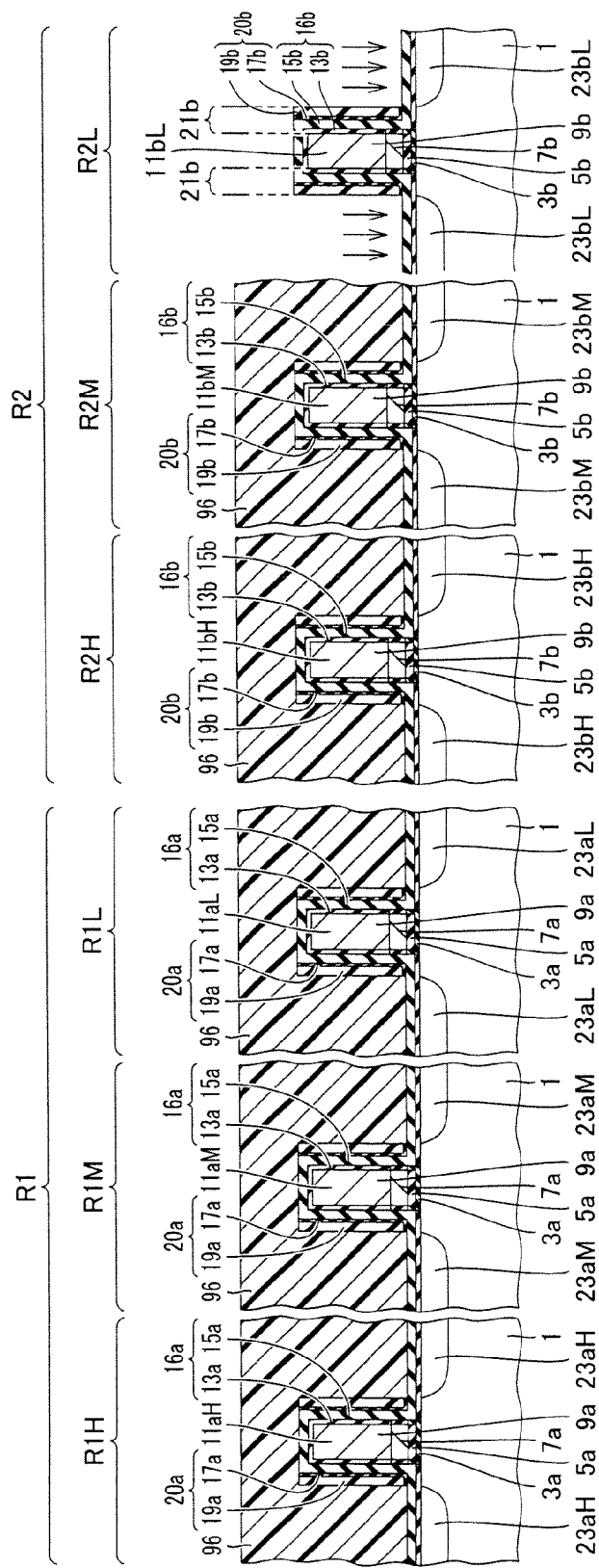
FIG. 66 is a cross-sectional view showing a step performed after the step shown in FIG. 65 in the fifth embodiment.

Next, as shown in FIG. 66, a resist pattern 96 is formed to expose region R2L in pMOS region R2 and cover the other regions R2H and R2M and nMOS region R1. In region R2L, a portion of first protective film 16b and a portion of second protective film 20b located on the side surface of gate electrode portion 11bL, of first protective film 16b and second protective film 20b, that is, portions of oxide layer 13b, silicon nitride film 15b, silicon oxide film 17b, and silicon nitride film 19b serve as offset spacer 21b.

Next, using offset spacer 21b and gate electrode portion 11bL as the mask, the p-type impurity ions such as, for example, boron fluoride ($BF_2$), boron (B) or indium (In) are implanted (arrows), and thereby a p-type extention implantation region 23bL is formed to a predetermined depth from the surface of semiconductor substrate 1. In addition, the n-type impurity ions such as arsenic (As) or phosphorus (P) are implanted, and thereby the n-type halo implantation region (not shown) is formed.

Figure 67:
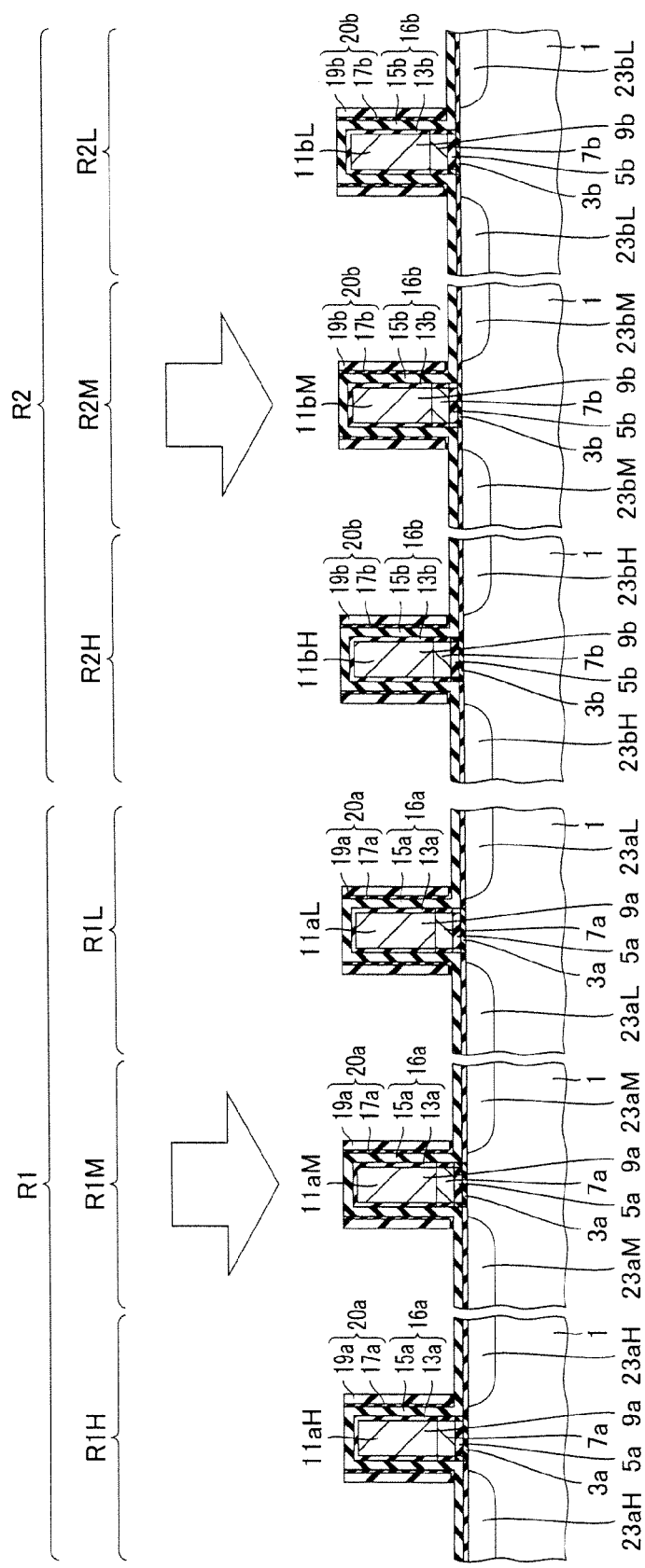
FIG. 67 is a cross-sectional view showing a step performed after the step shown in FIG. 66 in the fifth embodiment.

Next, ashing treatment is performed in the atmosphere of oxygen plasma to remove resist pattern 96. Next, as shown in FIG. 67, semiconductor substrate 1 after removal of resist pattern 96 is cleaned with the ammonia-based chemical solution and the like. At this time, second protective film 20a is exposed to the chemical solution in regions R1H, R1M and R1L in nMOS region R1, and second protective film 20b is exposed to the chemical solution in regions R2H, R2M and R2L in pMOS region R2 (see arrows).

Next, through the steps similar to those shown in FIGS. 15 and 16 as described above, the sidewall spacer (not shown) is formed. Thereafter, the processing similar to the steps shown in FIGS. 17 to 19 is performed on each of regions R1H to R1L and R2H to R2L, and thereby the source/drain implantation region (not shown) is formed in each of regions R1H to R1L and R2H to R2L. Next, similarly to the step shown in FIG. 19, predetermined heat treatment is performed to thermally diffuse the impurity ions implanted into extention implantation regions 23aH to 23aL and 23bH to 23bL and the source/drain implantation regions.

Figure 68:
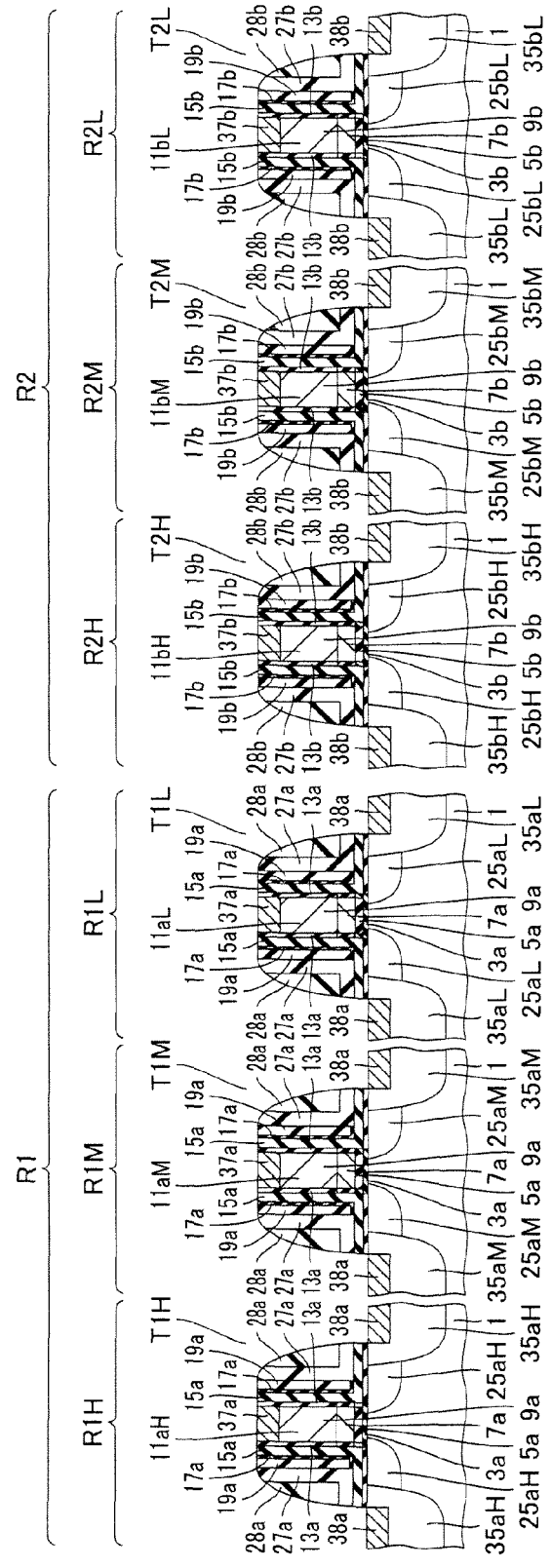
FIG. 68 is a cross-sectional view showing a step performed after the step shown in FIG. 67 in the fifth embodiment.

As a result, as shown in FIG. 68, in nMOS region R1, the halo region (not shown), extention regions 25aH to 25aL, source/drain regions 35aH to 35aL and the like are formed, and the respective main portions of an MOS transistor T1H corresponding to Hvt, an MOS transistor T1M corresponding to Mvt and an MOS transistor T1L corresponding to Lvt are formed as the n channel-type MOS transistors.

On the other hand, in pMOS region R2, the halo region (not shown), extention regions 25bH to 25bL, source/drain regions 35bH to 35bL and the like are formed, and the respective main portions of an MOS transistor T2H corresponding to Hvt, an MOS transistor T2M corresponding to Mvt and an MOS transistor T2L corresponding to Lvt are formed as the p channel-type MOS transistors.

In the above-mentioned semiconductor device, in particular, semiconductor substrate 1 is cleaned every time extention implantation regions 23aH to 23aL and 23bH to 23bL corresponding to the threshold voltages are formed in corresponding regions R1H to R1L and R2H to R2L. In other words, when extention implantation regions 23aH to 23aL are formed in nMOS region R1 (regions R1H to R1L), cleaning (cleaning A) of semiconductor substrate 1 is done three times. On the other hand, when extention implantation regions 23bH to 23bL are formed in pMOS region R2 (regions R2H to R2L), cleaning (cleaning B) of semiconductor substrate 1 is also done three times.

In the above-mentioned semiconductor device, silicon nitride films 15a and 15b having high resistance to the chemical solution are formed on the surfaces of first protective films 16a and 16b directly exposed to the chemical solution in cleaning A. Therefore, even when cleaning is done a plurality of times, thinning of first protective films 16a and 16b can be inhibited. In addition, loss of metal films 7a and 7b of gate electrode portions 11aH to 11aL and 11bH to 11bL due to permeation of the chemical solution can be prevented.

In addition, silicon nitride films 19a and 19b having high resistance to the chemical solution are also formed on the surfaces of second protective films 20a and 20b directly exposed to the chemical solution in cleaning B. Therefore, even when cleaning is done a plurality of times, thinning of second protective films 20a and 20b can be inhibited. In addition, together with first protective films 16a and 16b, permeation of the chemical solution toward gate electrode portions 11aH to 11aL and 11bH to 11bL can be inhibited.

Furthermore, since thinning of first protective films 16a and 16b is inhibited, a desired thickness of offset spacer 21b formed of first protective film 16b and second protective film 20b can be ensured and extention implantation regions 23bH to 23bL having desired impurity profiles can be formed using offset spacer 21b as the mask in pMOS region R2 (regions R2H to R2L).

In addition, in the above-mentioned semiconductor device, as described above, by applying silicon nitride films 15a and 15b and silicon oxide films 17a and 17b as first protective films 16a and 16b and second protective films 20a and 20b functioning as offset spacers 21a and 21b, gate leak can be reduced.

As a result of thermal diffusion of the impurity by heat treatment, in nMOS region R1, each of the pairs of extention regions 25aH to 25aL is formed to extend in the direction away from gate electrode portions 11aH to 11aL, defining, as the end (first end), the position spaced from the position of semiconductor substrate 1 toward the gate electrode portion 11a side by the predetermined distance based on the thermal diffusion length, the position of semiconductor substrate 1 being located immediately under the surface of first protective film 16a on the side surfaces of corresponding gate electrode portions 11aH to 11aL.

On the other hand, in pMOS region R2, each of the pairs of extention regions 25bH to 25bL is formed to extend in the direction away from gate electrode portions 11bH to 11bL, defining, as the end (second end), the position spaced from the position of semiconductor substrate 1 toward the gate electrode portion 11b side by the predetermined distance based on the thermal diffusion length, the position of semiconductor substrate 1 being located immediately under the surface of second protective film 20b on the side surfaces of corresponding gate electrode portions 11bH to 11bL.

Furthermore, in nMOS region R1, each of the pairs of source/drain regions 35aH to 35aL is formed to extend in the direction away from gate electrode portions 11aH to 11aL, defining, as the end (third end), the position spaced from the position (position A) of semiconductor substrate 1 toward the gate electrode portions 11aH to 11aL side by the predetermined distance based on the thermal diffusion length, the position (position A) being located immediately under the surface of sidewall spacer 31a on the side surfaces of corresponding gate electrode portions 11aH to 11aL. This third end is located between position A and the first end.

On the other hand, in pMOS region R2, each of the pairs of source/drain regions 35bH to 35bL is formed to extend in the direction away from gate electrode portions 11bH to 11bL, defining, as the end (fourth end), the position spaced from the position (position B) of semiconductor substrate 1 toward the gate electrode portions 11bH to 11bL side by the predetermined distance based on the thermal diffusion length, the position (position B) being located immediately under the surface of sidewall spacer 31b on the side surfaces of corresponding gate electrode portions 11bH to 11bL. This fourth end is located between position B and the second end.

In the above-mentioned semiconductor device, different three types of threshold voltages have been described as the threshold voltage of the MOS transistor by way of example. The threshold voltage of the MOS transistor is not limited to the three types, and different two types or four types or more of threshold voltages may be used. As the type of the threshold voltage increases, the number of cleaning of the semiconductor substrate increases accordingly, and the resistance to the chemical solution by the first protective film and the second protective film can be made full use of. In addition, although the MOS transistor shown in FIG. 20 has been used as the MOS transistor by way of example, the MOS transistor according to the other embodiments may be used.

Figure 69:
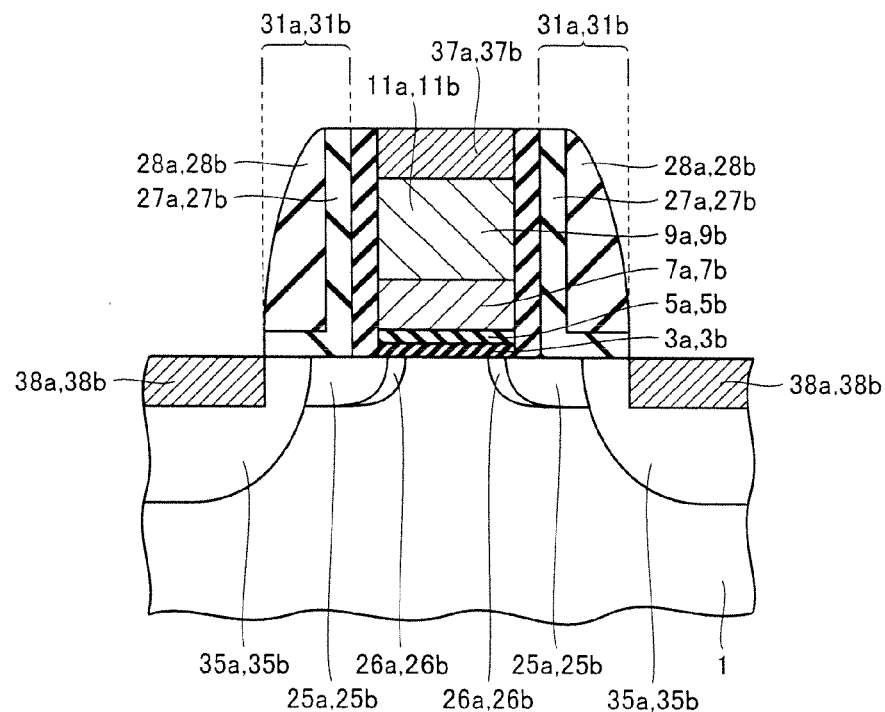
FIG. 69 is a first cross-sectional view showing a structure of the sidewall spacer in each embodiment of the present invention.
Figure 70:
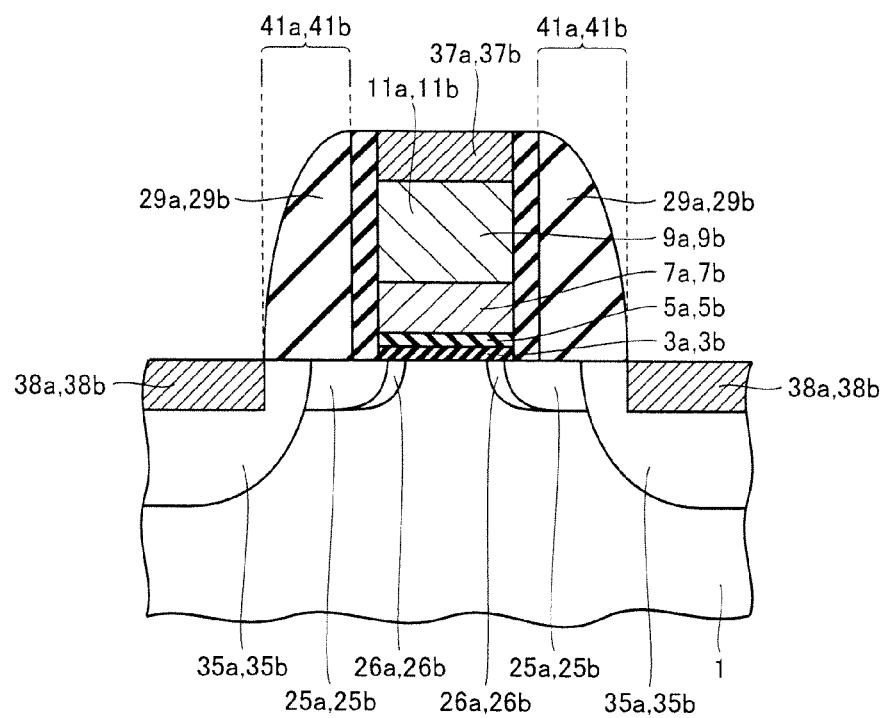
FIG. 70 is a second cross-sectional view showing the structure of the sidewall spacer in each embodiment of the present invention.

In addition, in the above-mentioned semiconductor device (MOS transistor) according to each embodiment, sidewall spacers 31a and 31b configured by stacking silicon nitride films 28a and 28b on silicon oxide films 27a and 27b as shown in FIG. 69 have been described as the sidewall spacer by way of example. The sidewall spacer is not limited thereto, and a sidewall spacer configured by stacking a silicon oxide film on a silicon nitride film may be used. Alternatively, single-layer sidewall spacers 41a and 41b formed of silicon nitride films 29a and 29b or a silicon oxide film as shown in FIG. 70 may also be used.

Figure 71:
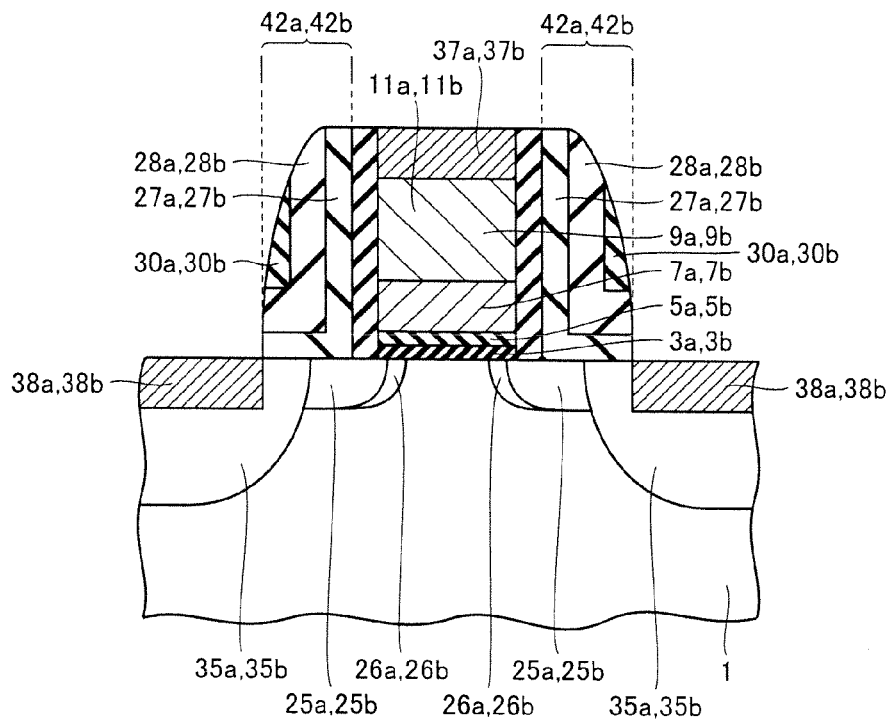
FIG. 71 is a third cross-sectional view showing the structure of the sidewall spacer in each embodiment of the present invention.
Figure 72:
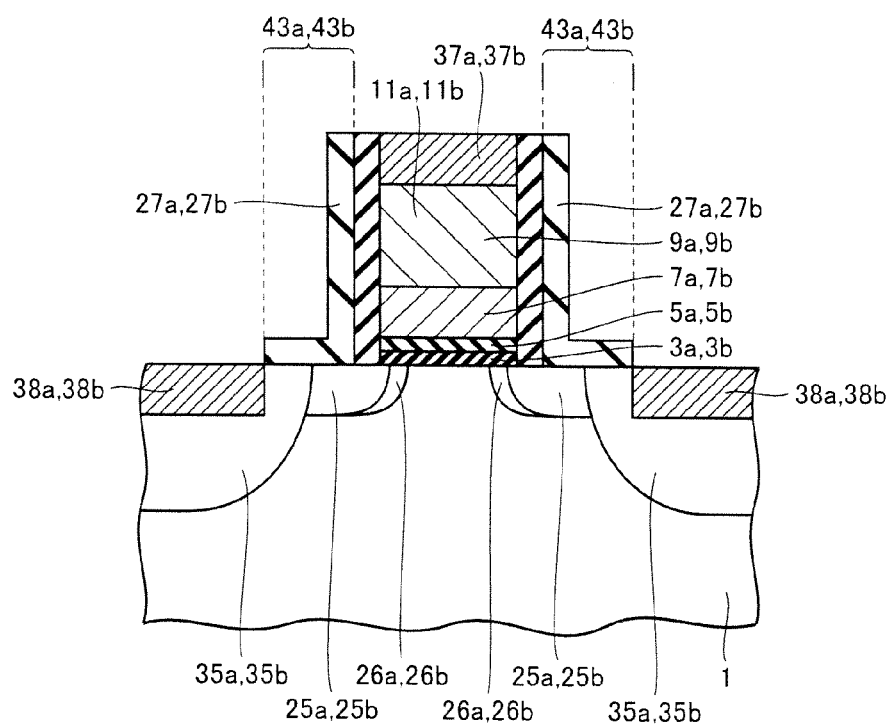
FIG. 72 is a fourth cross-sectional view showing the structure of the sidewall spacer in each embodiment of the present invention.

Furthermore, sidewall spacers 42a and 42b configured by stacking silicon oxide films 30a and 30b on silicon oxide films 27a and 27b with silicon nitride films 28a and 28b interposed therebetween as shown in FIG. 71, or configured by stacking a silicon nitride film on a silicon nitride film with a silicon oxide film interposed therebetween may also be used as the sidewall spacer. Alternatively, sidewall spacers 43a and 43b as shown in FIG. 72 formed of silicon oxide films 27a and 27b or a silicon nitride film, which is configured by removing the upper two layers from aforementioned sidewall spacers 42a and 42b may also be used.

In addition, the ammonia-based chemical solution has been described by way of example as the chemical solution used to clean the semiconductor substrate after forming the extention implantation region and the like. In addition to this, an ammonium hydroxide-hydrogen peroxide-water mixture (APM), a sulfuric acid hydrogen peroxide mixture (SPM), a sulfuric acid-based chemical solution or the like is also applicable as the chemical solution.

INDUSTRIAL APPLICABILITY

The present invention is effectively used in a semiconductor device including a CMOS transistor including a gate electrode portion configured by stacking a metal film on a High-k film.

REFERENCE SIGNS LIST 1 semiconductor substrate; R1 nMOS region; R1H region; R1M region; R1L region; R2 pMOS region; R2H region; R2M region; R2L region; 3a, 3b inter layer; 5a, 5b High-k film; 7a, 7b metal film; 9a, 9b polysilicon film; 11a gate electrode portion; 11aH gate electrode portion; 11aM gate electrode portion; 11aL gate electrode portion; 11b gate electrode portion; 11bH gate electrode portion; 11bM gate electrode portion; 11bL gate electrode portion; 13a, 13b oxide layer; 14a hafnium-based oxide layer; 14b titanium-based oxide layer; 14c silicon-based oxide layer; 15 silicon nitride film; 15a, 15b silicon nitride film; 16a, 16b first protective film; 17 silicon oxide film; 17a, 17b silicon oxide film; 19 silicon nitride film; 19a, 19b silicon nitride film; 20a, 20b second protective film; 21a offset spacer; 21b offset spacer; 23a extention implantation region; 23b extention implantation region; 23aH extention implantation region; 23aM extention implantation region; 23aL extention implantation region; 23bH extention implantation region; 23bM extention implantation region; 23bL extention implantation region; 24a halo implantation region; 24b halo implantation region; 25a extention region; 25b extention region; 25aH extention region; 25aM extention region; 25aL extention region; 25bH extention region; 25bM extention region; 25bL extention region; 26a halo region; 26b halo region; 27 silicon oxide film; 27a, 27b silicon oxide film; 28 silicon nitride film;

28a, 28b silicon nitride film; 29a, 29b silicon nitride film; 30a, 30b silicon oxide film; 31a sidewall spacer; 31b sidewall spacer; 33a source/drain implantation region; 33b source/drain implantation region; 35a source/drain region; 35b source/drain region; 35aH source/drain region; 35aM source/drain region; 35aL source/drain region; 35bH source/drain region; 35bM source/drain region; 35bL source/drain region; 37a, 37b metal silicide layer; 38a, 38b metal silicide layer; 41a sidewall spacer; 41b sidewall spacer; 42a sidewall spacer; 42b sidewall spacer; 43a sidewall spacer; 43b sidewall spacer; T1 n channel-type MOS transistor; T1H MOS transistor; T1M MOS transistor; T1L MOS transistor; T2 p channel-type MOS transistor; T2H MOS transistor; T2M MOS transistor; T2L MOS transistor; 81, 82 resist pattern; 91 to 96 resist pattern

The invention claimed is:
1. A method for manufacturing a semiconductor device, comprising the steps of:
forming a first gate electrode portion in a first region on a main surface of a semiconductor substrate by stacking a first metal film having a predetermined work function on a first dielectric film having a predetermined dielectric constant;
forming a second gate electrode portion in a second region on said main surface of said semiconductor substrate by stacking a second metal film having a predetermined work function on a second dielectric film having a predetermined dielectric constant;
forming a first protective film including a first silicon nitride film to cover a side surface of said first gate electrode portion and a side surface of said second gate electrode portion, wherein the first silicon nitride film on the side surface of the first gate electrode portion is a first offset spacer, and the first protective film is in direct contact with both of the side and upper surfaces of the first gate electrode and the side and upper surfaces of the second gate electrode;

forming a first extension implantation region in said first region by injecting an impurity of a first conduction type by using said first offset spacer as a mask;

cleaning said semiconductor substrate after forming said first extension implantation region, wherein an upper surface and the side surface of the first gate electrode portion and an upper surface and the side surface of the second gate electrode portion are covered with the first protective film during said cleaning;

forming a second protective film on a surface of said first protective film by stacking a silicon oxide film on the first silicon nitride film and a second silicon nitride film on the silicon oxide film, wherein a stack of at least the first silicon nitride film, the silicon oxide film, and the second silicon nitride film on a side surface of the second gate electrode portion is a second offset spacer, and each of the silicon oxide film and the silicon nitride film of the second protective film is formed to cover a whole side surface of each of the first gate electrode portion and the second gate electrode portion;

forming a second extension implantation region in said second region by injecting an impurity of a second conduction type by using said second offset spacer as a mask;

cleaning said semiconductor substrate after forming said second extension implantation region, wherein the upper surface and the side surface of the first gate electrode portion and the upper surface and the side surface of the second gate electrode portion are covered with at least a portion of the first protective film during said cleaning;

forming a first sidewall spacer on the side surface of said first gate electrode portion with said first protective film and said second protective film disposed therebetween, wherein the first sidewall spacer is formed with the first protective film between the semiconductor substrate and the first sidewall spacer, and forming a second sidewall spacer on the side surface of said second gate electrode portion with said first protective film and said second protective film disposed therebetween, wherein the second sidewall spacer is formed with the first protective film between the semiconductor substrate and the second sidewall spacer;

forming a first source/drain implantation region in said first region by injecting the impurity of the first conduction type using said first sidewall spacer as a mask;

forming a second source/drain implantation region in said second region by injecting the impurity of the second conduction type using said second sidewall spacer as a mask;

forming a first extension region, a second extension region, a first source/drain region, and a second source/drain region, respectively, by performing predetermined heat treatment to thermally diffuse said impurities in said first extension implantation region, said second extension implantation region, said first source/drain implantation region, and said second source/drain implantation region; and forming an oxide layer as said first protective film in addition to said first silicon nitride film by oxidizing a surface of each of said first gate electrode portion and second gate electrode portion after forming said first gate electrode portion and second gate electrode portion and before forming said first silicon nitride film, wherein the oxide layer remains without being removed at least until the steps of forming the first extension implantation region, the second extension implantation region, the first source/drain implantation region, and the second source/drain implantation region are completed.

2. The method for manufacturing a semiconductor device according to claim 1, wherein
in cleaning after forming said first extension implantation region, a resist used in forming said first extension implantation region is removed and said semiconductor substrate is cleaned with a predetermined chemical solution, and
in cleaning after forming said second extension implantation region, a resist used in forming said second extension implantation region is removed and said semiconductor substrate is cleaned with the predetermined chemical solution.

3. The method for manufacturing a semiconductor device according to claim 1, wherein
in the step of forming said second protective film, said silicon oxide film is formed by oxidizing a surface of said first silicon nitride film of said first protective film.

4. The method for manufacturing a semiconductor device according to claim 1, wherein
in the step of forming said second protective film, said second silicon nitride film is etched using said silicon oxide film as an etching stopper.

5. The method for manufacturing a semiconductor device according to claim 1, wherein
in the step of forming said second protective film, by anisotropically etching said second silicon nitride film, said silicon oxide film and said first silicon nitride film, portions of said first silicon nitride film, said silicon oxide film and said second silicon nitride film located on the side surface of said first gate electrode portion are left and portions of said first silicon nitride film, said silicon oxide film and said second silicon nitride film located on the side surface of said second gate electrode portion are left to expose the surface of said semiconductor substrate.

6. The method for manufacturing a semiconductor device according to claim 1, wherein
in the step of forming said first gate electrode portion, a plurality of first gate electrode portions having different threshold voltages are formed as said first gate electrode portion,
in the step of forming said second gate electrode portion, a plurality of second gate electrode portions having different threshold voltages are formed as said second gate electrode portion,
in the step of forming said first extension region, a predetermined amount of impurity is injected as said impurity of the first conduction type into each of said first gate electrode portions corresponding to said threshold voltages, and
in the step of forming said second extension region, a predetermined amount of impurity is injected as said impurity of the second conduction type into each of said second gate electrode portions corresponding to said threshold voltages.

7. The method for manufacturing a semiconductor device according to claim 1, wherein
during the forming of the first source/drain implantation region in said first region, the impurity of the first conduction type is injected, with the first region covered with a part of the film forming the first protective film; and
during the forming of the second source/drain implantation region in said second region, the impurity of the second conduction type is injected, with the second region covered with another part of the film forming the first protective film.

* * * * *